US012796206B2

(12) United States Patent
Lee et al.

(10) Patent No.: US 12,796,206 B2
(45) Date of Patent: Nov. 10, 2026

(54) LIGHT EMITTING ELEMENT

(71) Applicant: Samsung Display Co., Ltd., Yongin-si (KR)

(72) Inventors: Youngki Lee, Hwaseong-si (KR); Mi Eun Jun, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1218 days.

(21) Appl. No.: 17/687,828

(22) Filed: Mar. 7, 2022

(65) Prior Publication Data

US 2023/0085598 A1 Mar. 16, 2023

(30) Foreign Application Priority Data

Jul. 19, 2021 (KR) ........................ 10-2021-0094131

(51) Int. Cl.

*H10K 50/11* (2023.01)
*C09K 11/06* (2006.01)
*H10K 85/30* (2023.01)
*H10K 85/40* (2023.01)
*H10K 85/60* (2023.01)
(Continued)

(52) U.S. Cl.

CPC .............. *H10K 50/11* (2023.02); *C09K 11/06* (2013.01); *C09K 2211/1029* (2013.01); (Continued)

(58) Field of Classification Search

CPC .... H10K 50/11; H10K 85/322; H10K 85/342; H10K 85/346; H10K 85/40; H10K 85/615; H10K 85/654; H10K 85/657; H10K 85/6572; H10K 85/6574; H10K 85/6576; H10K 2101/10; H10K 2101/27; H10K 2101/30; H10K 2101/90; H10K 50/13; H10K 2101/20; H10K 50/125; (Continued)

(56) References Cited

U.S. PATENT DOCUMENTS

| | | | |
|---|---|---|---|
| 7,906,900 | B2 | 3/2011 | Song et al. |
| 9,666,822 | B2 | 5/2017 | Forrest et al. |

(Continued)

FOREIGN PATENT DOCUMENTS

| | | |
|---|---|---|
| JP | 2018-92932 | 6/2018 |
| KR | 10-0730132 | 6/2007 |

(Continued)

OTHER PUBLICATIONS

Zhao et al. J. Mater. Chem. C,2018, 6, 9510. (Year: 2018).*

(Continued)

*Primary Examiner* — Michael M Dollinger

(74) *Attorney, Agent, or Firm* — Womble Bond Dickinson (US) LLP

(57) ABSTRACT

A light emitting element includes a first electrode, a second electrode disposed on the first electrode, and a light emitting area disposed between the first electrode and the second electrode and including a phosphorescent dopant, a hole transporting host, and an electron transporting host, wherein the light emitting area includes at least one auxiliary light emitting layer including a thermally activated delayed fluorescence dopant, the hole transporting host, and the electron transporting host and spaced apart from the first electrode and the second electrode.

18 Claims, 23 Drawing Sheets

(51) Int. Cl.
*H10K 101/00* (2023.01)
*H10K 101/10* (2023.01)
*H10K 101/30* (2023.01)

(52) U.S. Cl.
CPC ................. *C09K 2211/1059* (2013.01); *C09K 2211/1074* (2013.01); *C09K 2211/185* (2013.01); *H10K 85/322* (2023.02); *H10K 85/342* (2023.02); *H10K 85/346* (2023.02); *H10K 85/40* (2023.02); *H10K 85/615* (2023.02); *H10K 85/654* (2023.02); *H10K 85/657* (2023.02); *H10K 85/6572* (2023.02); *H10K 85/6574* (2023.02); *H10K 85/6576* (2023.02); *H10K 2101/10* (2023.02); *H10K 2101/27* (2023.02); *H10K 2101/30* (2023.02); *H10K 2101/90* (2023.02)

(58) Field of Classification Search
CPC .... H10K 50/12; H10K 85/631; H10K 85/649; H10K 2102/351; C09K 11/06; C09K 2211/1029; C09K 2211/1059; C09K 2211/1074; C09K 2211/185
See application file for complete search history.

(56) References Cited

U.S. PATENT DOCUMENTS 10,177,329 B2 1/2019 Kim et al.
10,510,806 B2 12/2019 Yamaoka et al.
2018/0047926 A1* 2/2018 Tanaka ................... H10K 50/19
2019/0058124 A1* 2/2019 Hatakeyama .......... C09K 11/06
2019/0259959 A1* 8/2019 Duan ................... H10K 85/626
2021/0024496 A1 1/2021 Yoo et al.
2021/0098714 A1* 4/2021 Choi .................... H10K 50/121
2021/0184135 A1 6/2021 Kim et al.
2022/0213113 A1* 7/2022 Kishi ................... C07D 487/22
2022/0223814 A1* 7/2022 Choi .................. H10K 85/6574

FOREIGN PATENT DOCUMENTS

KR 10-2009-0010761 1/2009
KR 10-2013-0115027 10/2013
KR 20150116776 A * 10/2015 ........... C07D 209/82
KR 10-1674250 11/2016
KR 10-2125584 7/2020
KR 10-2021-0012482 2/2021
KR 10-2021-0076220 6/2021

OTHER PUBLICATIONS

Kody Klimes et al., "Efficient Blue Phosphorescent OLEDs with Improved Stability and Color Purity through Judicious Triplet Exciton Management", Advanced Functional Materials, May 30, 2019, vol. 29, No. 1903068.

* cited by examiner

LIGHT EMITTING ELEMENT

CROSS-REFERENCE TO RELATED APPLICATION(S)

This application claims priority to and benefits of Korean Patent Application No. 10-2021-0094131 under 35 U.S.C. § 119, filed on Jul. 19, 2021 in the Korean Intellectual Property Office, the entire contents of which are incorporated herein by reference.

BACKGROUND

1. Technical Field

The disclosure relates to a light emitting element including at least one auxiliary light emitting layer.

2. Description of the Related Art

Active development continues for an organic electroluminescence display device as an image display device. Organic electroluminescence display devices are display devices that include so-called self-emission type light emitting elements that achieve display by recombining holes and electrons respectively injected from a first electrode and a second electrode in a light emitting layer, so as to emit light from a light emitting material of the light emitting layer.

In the application of a light emitting element to a display device, there is a need for high luminous efficiency and long life, and continuous development is required for a light emitting element that is capable of the stable implementation of such characteristics.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting element having improved luminous efficiency and lifespan characteristics.

An embodiment provides a light emitting element which may include a first electrode, a second electrode disposed on the first electrode, and a light emitting area disposed between the first electrode and the second electrode. The light emitting area may include a phosphorescent dopant, a hole transporting host, an electron transporting host, and at least one auxiliary light emitting layer including a thermally activated delayed fluorescence dopant, the hole transporting host, and the electron transporting host, and the at least one auxiliary light emitting layer may be spaced apart from the first electrode and the second electrode.

In an embodiment, the at least one auxiliary light emitting layer may not include the phosphorescent dopant.

In an embodiment, the at least one auxiliary light emitting layer may include a first auxiliary light emitting layer, the light emitting area may include a first light emitting layer and a second light emitting layer, and the first light emitting layer and the second light emitting layer may be spaced apart, with the first auxiliary light emitting layer therebetween.

In an embodiment, the first light emitting layer may include a first phosphorescent dopant, and the second light emitting layer may include a second phosphorescent dopant that is different from the first phosphorescent dopant.

In an embodiment, the first light emitting layer and the second light emitting layer may not include the thermally activated delayed fluorescence dopant.

In an embodiment, the at least one auxiliary light emitting layer may further include a second auxiliary light emitting layer spaced apart from the first auxiliary light emitting layer, and the second auxiliary light emitting layer may be included in the first light emitting layer or in the second light emitting layer.

In an embodiment, the at least one auxiliary light emitting layer may further include a third auxiliary light emitting layer spaced apart from the first auxiliary light emitting layer and the second auxiliary light emitting layer, the second auxiliary light emitting layer may be included in the first light emitting layer, and the third auxiliary light emitting layer may be included in the second light emitting layer.

In an embodiment, the light emitting area may include a lower light emitting layer, a middle light emitting layer, and an upper light emitting layer, each of the lower light emitting layer, the middle light emitting layer, and the upper light emitting layer may have a different phosphorescent dopant concentrations, and the lower light emitting layer, the middle light emitting layer, and the upper light emitting layer may be sequentially stacked in a thickness direction.

In an embodiment, the at least one auxiliary light emitting layer may be included in at least one of the lower light emitting layer, the middle light emitting layer, or the upper light emitting layer.

In an embodiment, the at least one auxiliary light emitting layer may be disposed between the lower light emitting layer and the middle light emitting layer, or the at least one auxiliary light emitting layer may be disposed between the middle light emitting layer and the upper light emitting layer.

In an embodiment, a concentration of the phosphorescent dopant may increase sequentially from the lower light emitting layer to the upper light emitting layer, or a concentration of the phosphorescent dopant may decrease sequentially from the lower light emitting layer to the upper light emitting layer.

In an embodiment, the hole transporting host and the electron transporting host may form an exciplex.

In an embodiment, the light emitting element may further include a hole transport region disposed between the first electrode and the light emitting area, and an electron transport region disposed between the light emitting area and the second electrode.

In an embodiment, the hole transporting hose may include a compound selected from Compound Group 1, which is explained below, and the electron transporting host may include a compound selected from Compound Group 2, which is explained below.

In an embodiment, the phosphorescent dopant may include a compound selected from Compound Group 3, which is explained below.

In an embodiment, the thermally activated delayed fluorescence dopant may include a compound selected from Compound Group 4, which is explained below.

Another embodiment provides a light emitting element which may include a first electrode, a second electrode disposed on the first electrode, and a light emitting area disposed between the first electrode and the second electrode. The light emitting area may include a first light emitting layer disposed on the first electrode and including a first phosphorescent dopant, a hole transporting host, and an electron transporting host, a second light emitting layer disposed on the first light emitting layer and including a second phosphorescent dopant, the hole transporting host, and the electron transporting host, and a first auxiliary light emitting layer disposed between the first light emitting layer and the second light emitting layer and including a thermally activated delayed fluorescence dopant, the hole transporting host, and the electron transporting host.

In an embodiment, the light emitting area may further include a third light emitting layer disposed between the first light emitting layer and the second light emitting layer and including a third phosphorescent dopant, the hole transporting host, and the electron transporting host, and the first auxiliary light emitting layer may be included in the third light emitting layer.

In an embodiment, the light emitting area may further include a second auxiliary light emitting layer disposed between the first light emitting layer and the third light emitting layer and including the thermally activated delayed fluorescence dopant.

In an embodiment, the light emitting area may further include a third auxiliary light emitting layer disposed between the third light emitting layer and the second light emitting layer and including the thermally activated delayed fluorescence dopant.

BRIEF DESCRIPTION OF THE DRAWINGS

The accompanying drawings are included to provide a further understanding of the embodiments and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
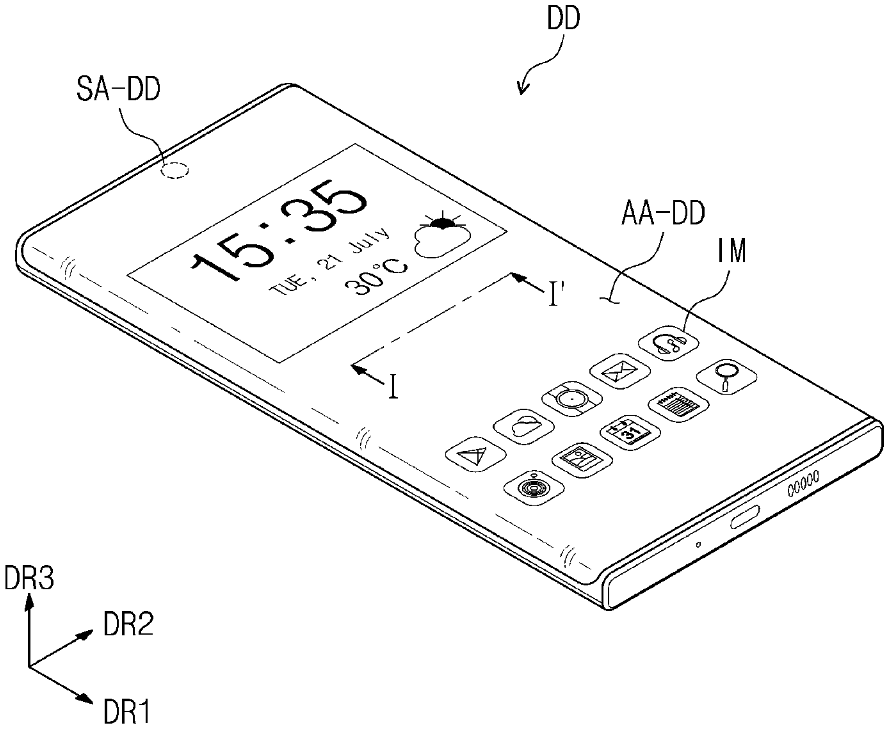
FIG. 1 is a perspective view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
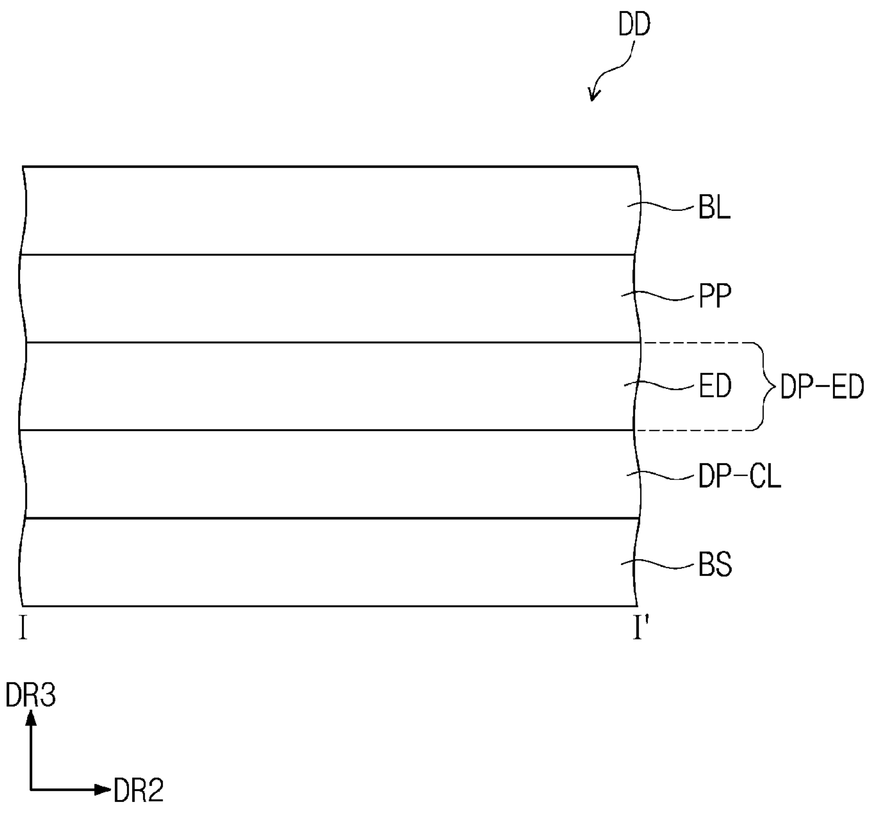
FIG. 2 is a schematic cross-sectional view showing a portion corresponding to the line I-I' of FIG. 1.

Hereinafter, embodiments will be described with reference to the drawings. FIG. 1 is a perspective view illustrating a display device according to an embodiment. FIG. 2 is a schematic cross-sectional view showing a portion corresponding to the line I-I' of FIG. 1.

A display device DD according to an embodiment may be a device activated according to an electrical signal. For example, the display device DD may be a mobile phone, a tablet, a car navigation system, a game console, or a wearable device, but is not limited thereto. FIG. 1 illustrates that the display device DD is a mobile phone.

The display device DD may display an image IM through the active area AA-DD. The active area AA-DD may include a plane defined by a first direction axis DR1 and a second direction axis DR2. The active area AA-DD may further include a curved surface bent from one side of a plane defined by the first directional axis DR1 and the second directional axis DR2. The display device DD according to the embodiment illustrated in FIG. 1 is illustrated to include two curved surfaces respectively bent from both sides of a plane defined by the first direction axis DR1 and the second direction axis DR2. However, the shape of the active area AA-DD is not limited thereto. For example, the active area AA-DD may include only a plane. As another example, the active area AA-DD may further include four curved surfaces respectively bent from four sides of the plane.

The display device DD according to an embodiment may be flexible. The term "flexible" as used herein refers to a property of a device that may be bent, and may include everything from a completely foldable structure to a structure that may be bent to the level of several nanometers. For example, in an embodiment, the display device DD may be a foldable display device. In another embodiment, the display device DD may be rigid.

The thickness direction of the display device DD may be parallel to a third direction axis DR3 which is a direction normal to a plane defined by the first direction axis DR1 and the second direction axis DR2. The directions indicated by the first to third direction axes DR1, DR2, and DR3 described herein are relative terms and may be converted into other directions. The directions indicated by the first to third direction axes DR1, DR2, and DR3 may be respectively described as the first to third directions, and the same reference numerals may be used. In the specification, the first direction axis DR1 and the second direction axis DR2 may be orthogonal to each other, and the third direction axis DR3 may be a direction normal to a plane defined by the first direction axis DR1 and the second direction axis DR2.

A sensing area SA-DD may be defined in the active area AA-DD of the display device DD. FIG. 1 illustrates one sensing area SA-DD as an example, but the number of sensing areas SA-DD is not limited thereto. The sensing area SA-DD may be a part of the active area AA-DD. The display device DD may display an image through the sensing area SA-DD.

Referring to FIG. 2, the display device DD may include a base layer BS, and a circuit layer DP-CL and a display element layer DP-ED provided on the base layer BS. An optical layer PP and a base substrate BL may be provided on the display element layer DP-ED.

The base layer BS may provide a base surface on which the display element layer DP-ED is disposed. The base layer BS may be a glass substrate, a metal substrate, a plastic substrate, or the like. However, embodiments are not limited thereto, and the base layer BS may include an inorganic layer, an organic layer, or a composite material layer.

The circuit layer DP-CL may be disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor for driving the light emitting element ED of the display element layer DP-ED.

The display element layer DP-ED may include a light emitting element ED according to an embodiment. The display element layer DP-ED may further include a sealing layer (not shown) disposed on the light emitting element ED. The light emitting element ED may have a structure of the light emitting element ED according to FIGS. 3 to 6 to be described later.

The optical layer PP may include, for example, a polarizing layer or a color filter layer. Although not shown in the drawing, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, or the like. However, embodiments are not limited thereto, and the base substrate BL may include an inorganic layer, an organic layer, or a composite material layer. Although not shown in the drawing, in an embodiment, the base substrate BL may be omitted.

Referring to FIGS. 3 to 6, the light emitting element ED of an embodiment may include a first electrode EL1, a second electrode EL2 disposed on the first electrode EL1, and a light emitting area EMR disposed between the first electrode EL1 and the second electrode EL2. The light emitting area EMR may include a phosphorescent dopant, a hole transporting host, and an electron transporting host. The light emitting area EMR may include at least one auxiliary light emitting layer EMLS-1 to EMLS-3 (see FIGS. 7A to 11) spaced apart from the first electrode EL1 and the second electrode EL2. At least one auxiliary light emitting layer EMLS-1 to EMLS-3 (see FIGS. 7A to 11) may include a thermally activated delayed fluorescence dopant, a hole transporting host, and an electron transporting host. The auxiliary light emitting layers EMLS-1, EMLS-2, and EMLS-3 may not include a phosphorescent dopant. The light emitting area EMR will be described in more detail with reference to FIGS. 7A to 11.

Figure 3:
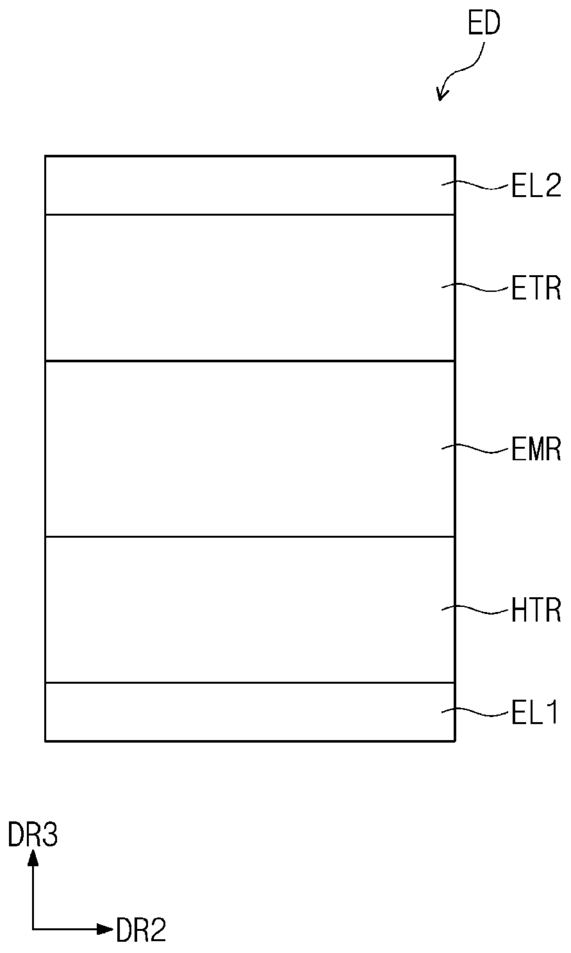
FIG. 3 is a schematic cross-sectional view illustrating a light emitting element according to an embodiment.
Figure 4:
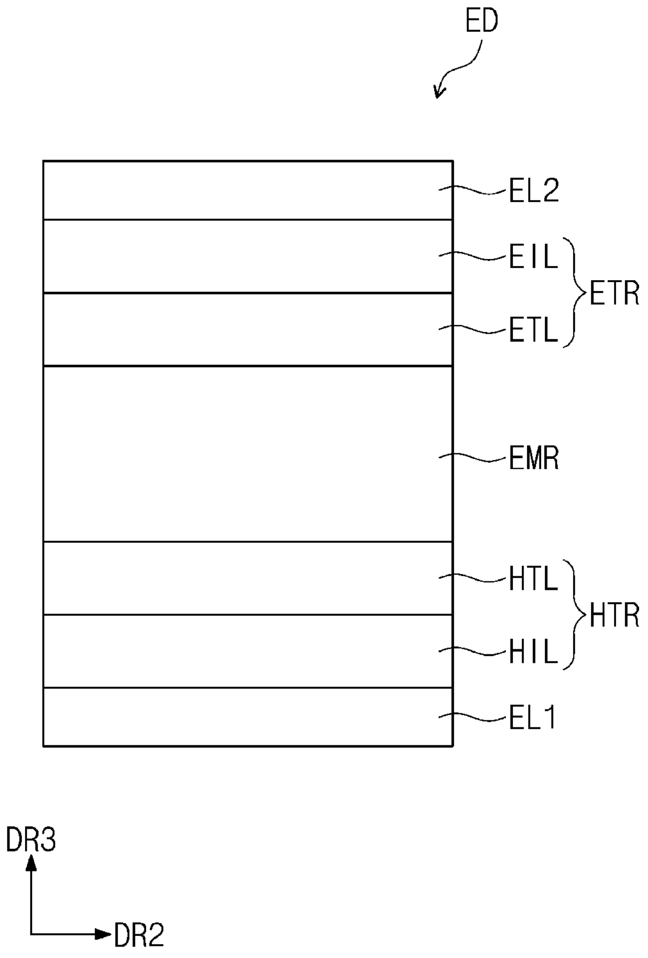
FIG. 4 is a schematic cross-sectional view illustrating a light emitting element according to an embodiment.
Figure 5:
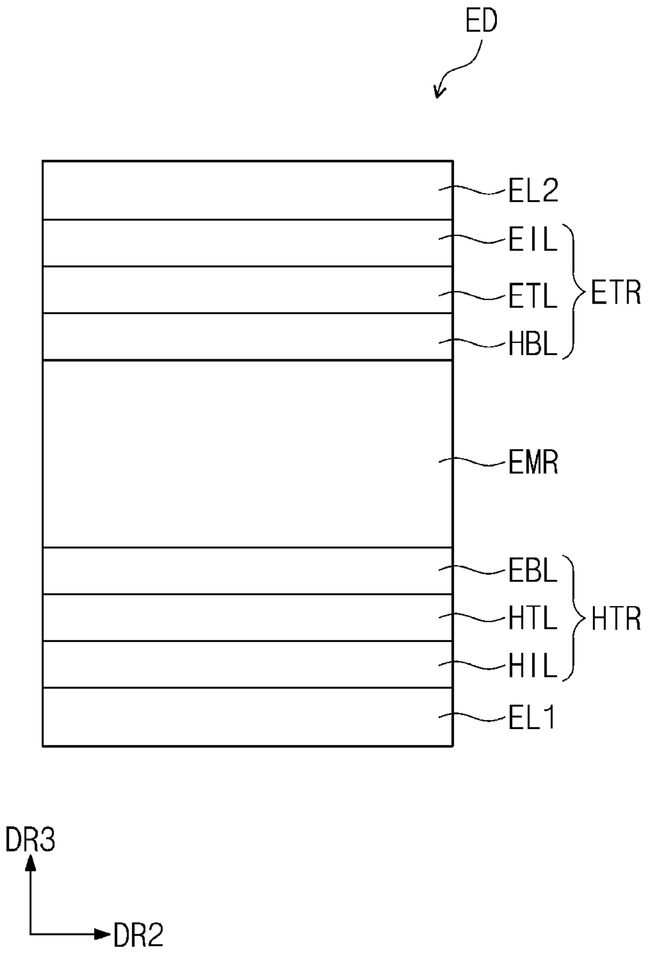
FIG. 5 is a schematic cross-sectional view illustrating a light emitting element according to an embodiment.
Figure 6:
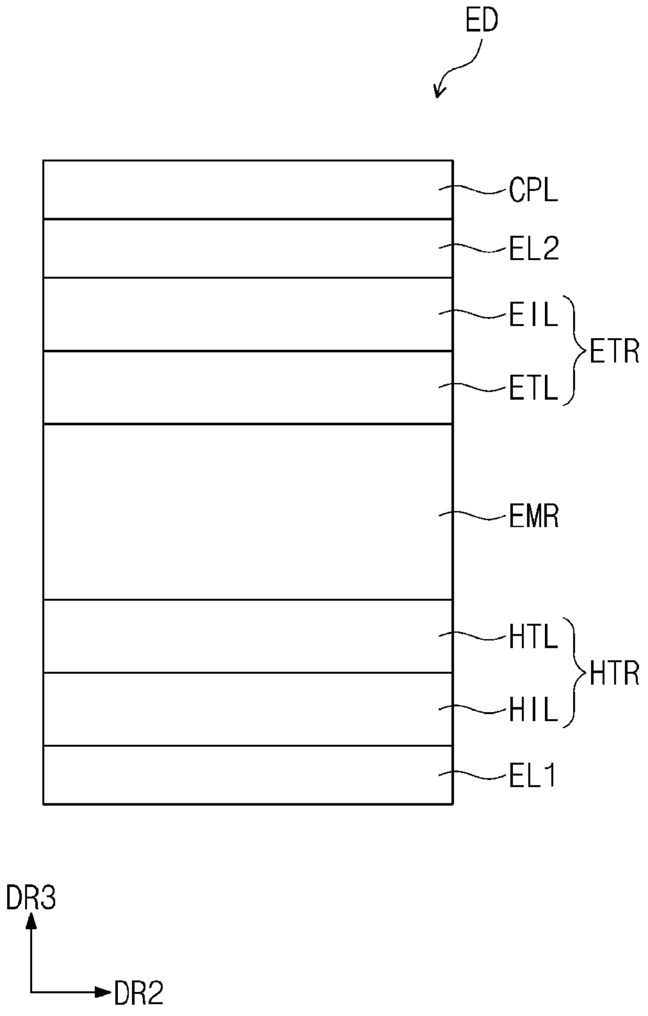
FIG. 6 is a schematic cross-sectional view illustrating a light emitting element according to an embodiment.

The light emitting element ED of an embodiment may include a hole transport region HTR disposed between the first electrode EL1 and the light emitting area EMR; and an electron transport region ETR disposed between the light emitting area EMR and the second electrode EL2. In comparison to FIG. 3, FIG. 4 is a schematic cross-sectional view of a light emitting element ED in which a hole transport region HTR includes a hole injection layer HIL and a hole transport layer HTL and an electron transport region ETR includes an electron injection layer EIL and an electron transport layer ETL. In comparison to FIG. 3, FIG. 5 is a schematic cross-sectional view of a light emitting element ED in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 is a schematic cross-sectional view illustrating a light emitting element ED including a capping layer CPL disposed on the second electrode EL2.

Figure 9A:
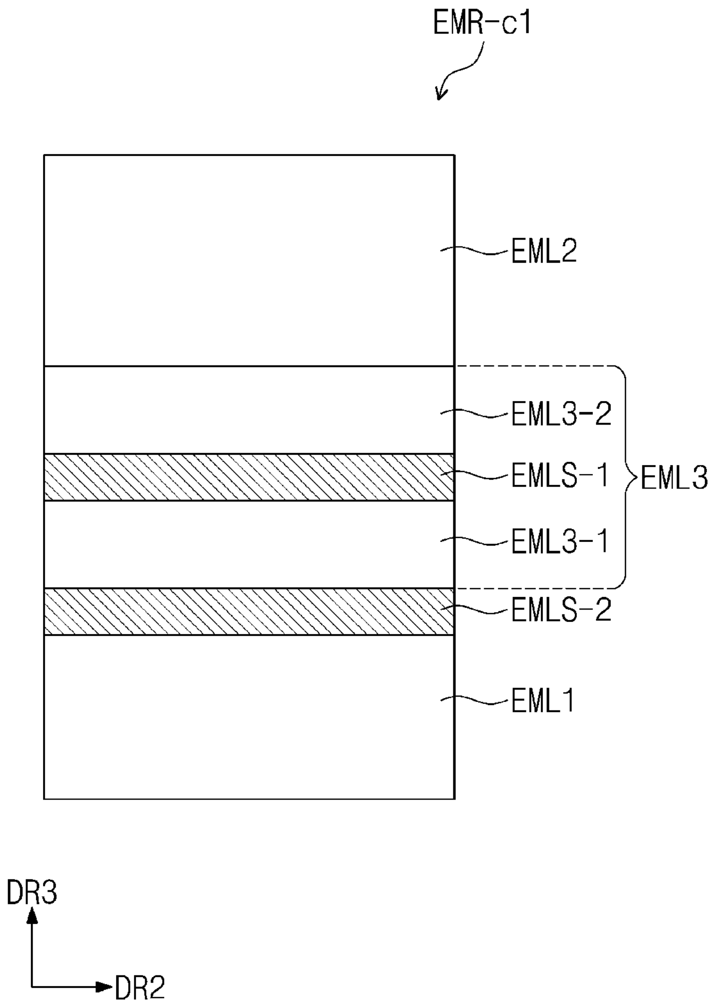
FIGS. 9A to 9D are schematic cross-sectional views illustrating a light emitting area of a light emitting element according to an embodiment.
Figure 9B:
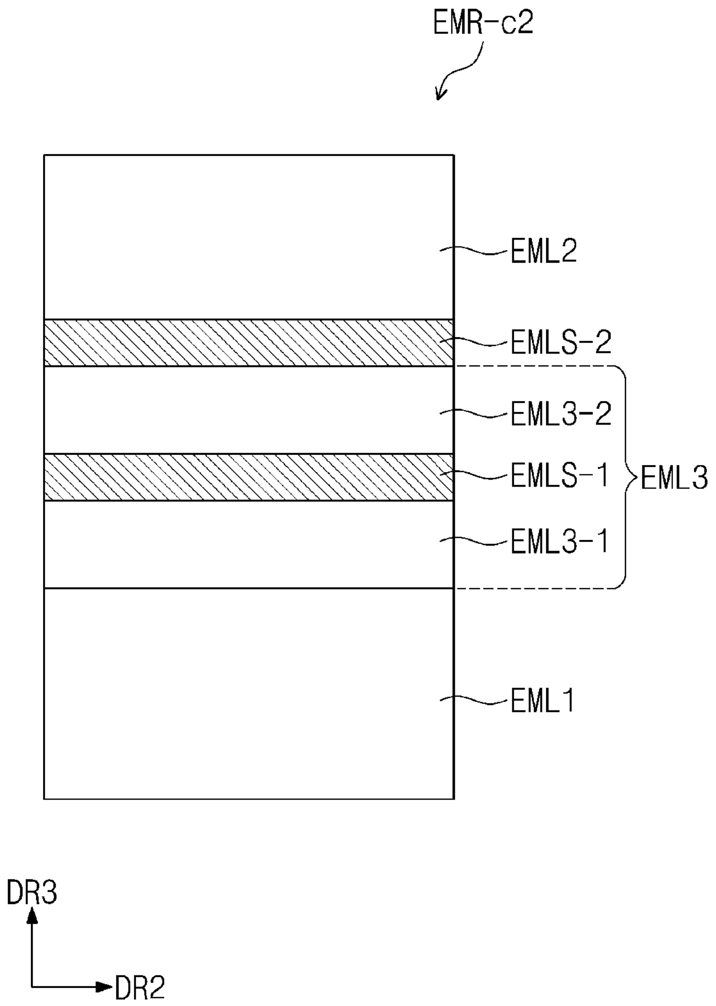
Figure 9C:
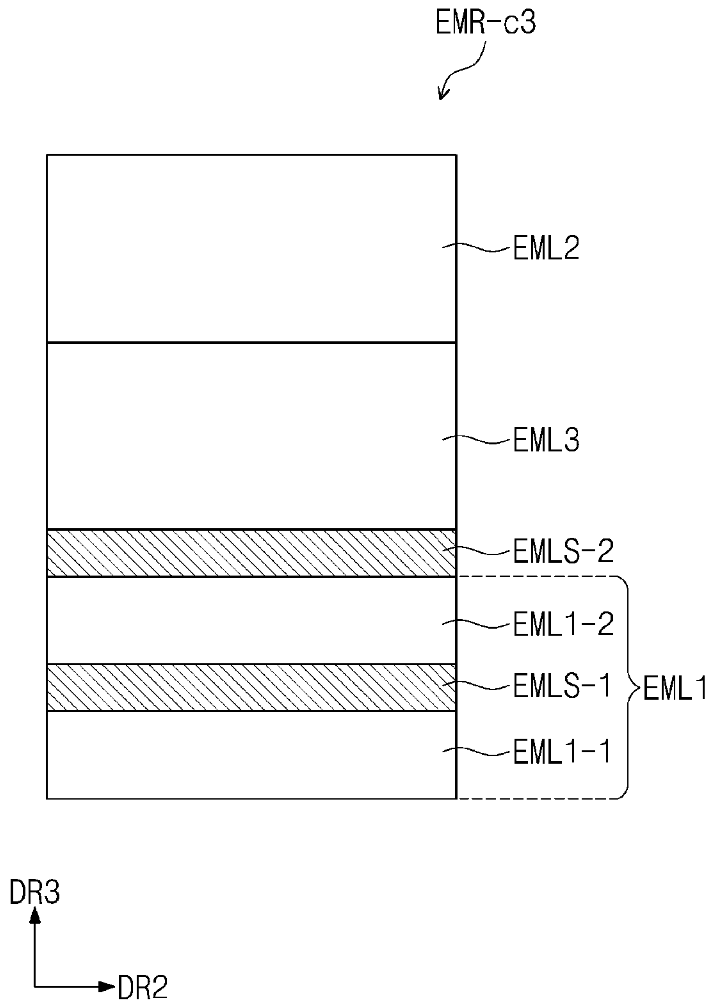
Figure 9D:
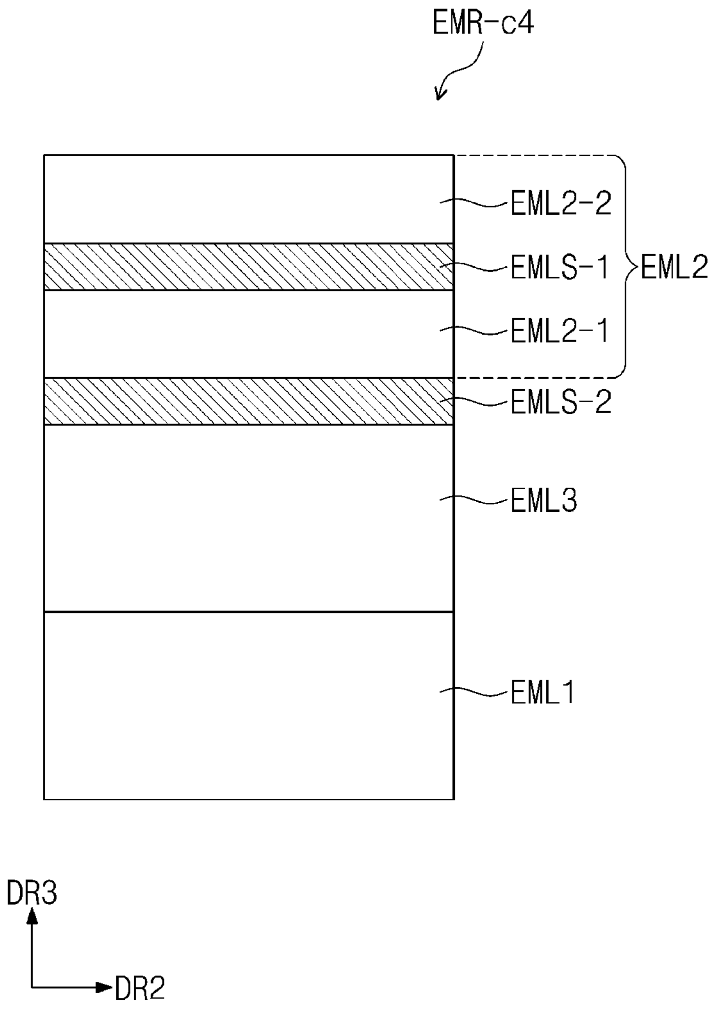
Figure 10A:
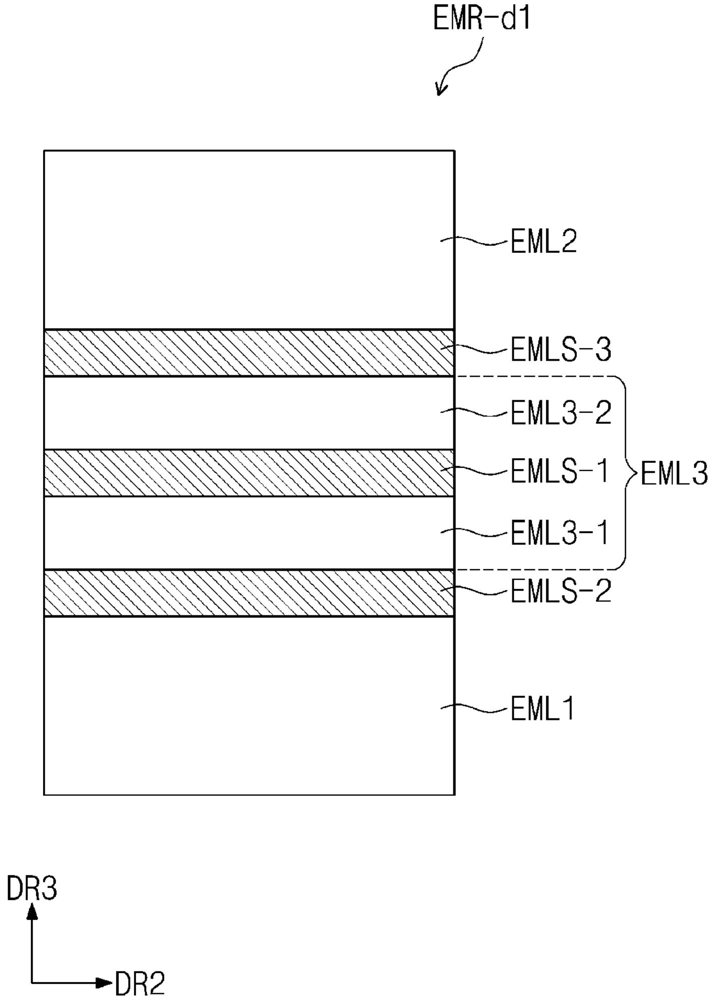
FIGS. 10A to 10C are schematic cross-sectional views illustrating a light emitting area of a light emitting element according to an embodiment.
Figure 10B:
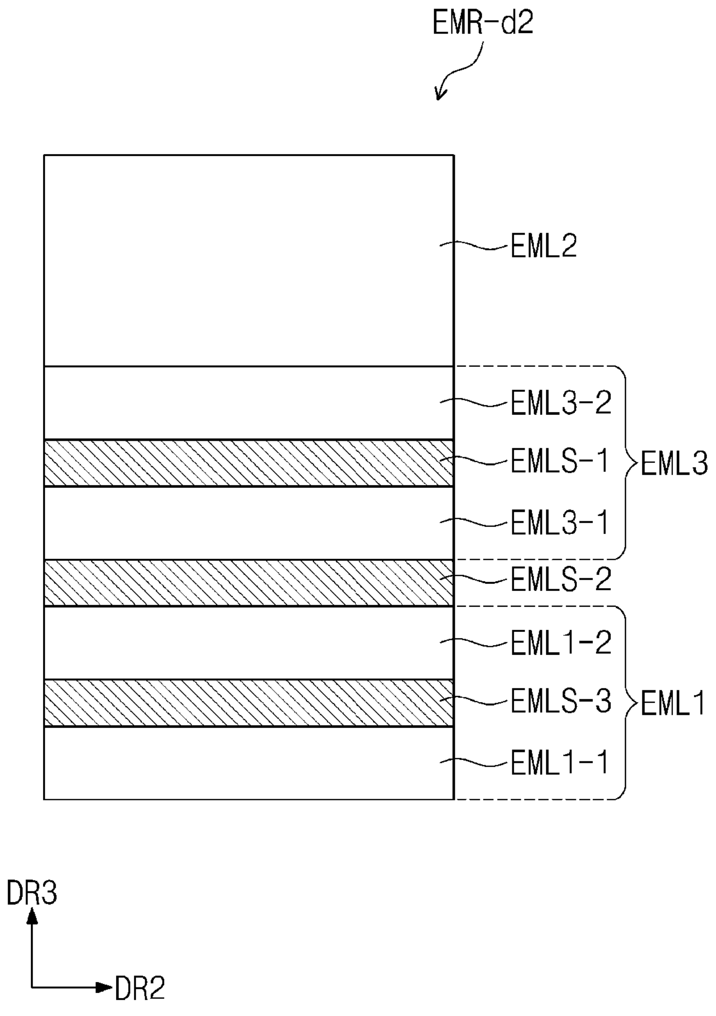
Figure 10C:
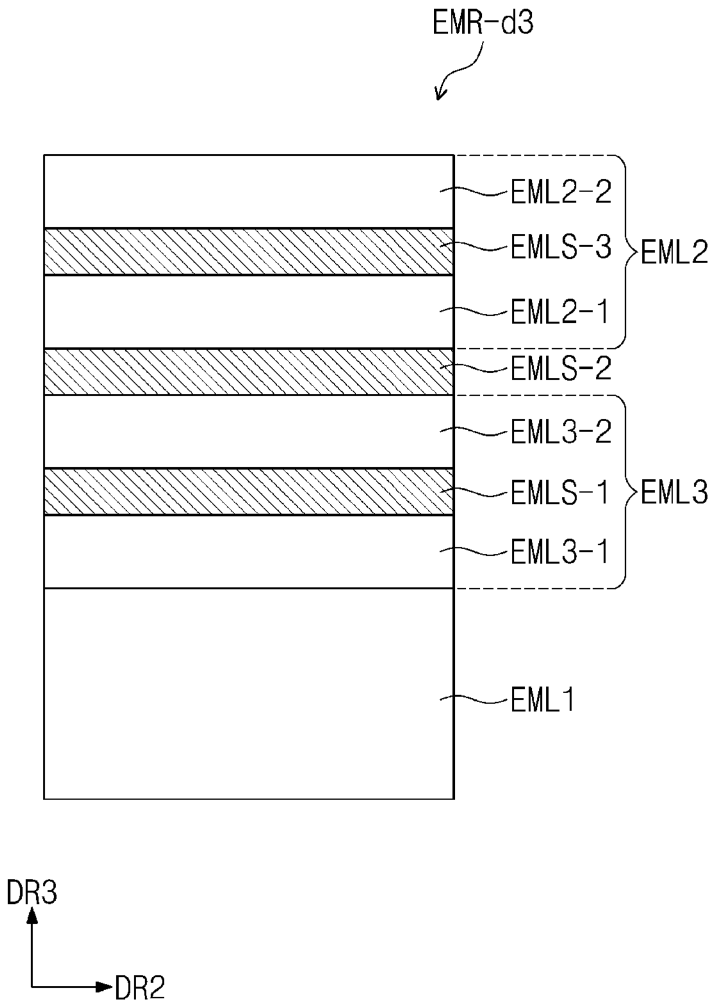
Figure 11:
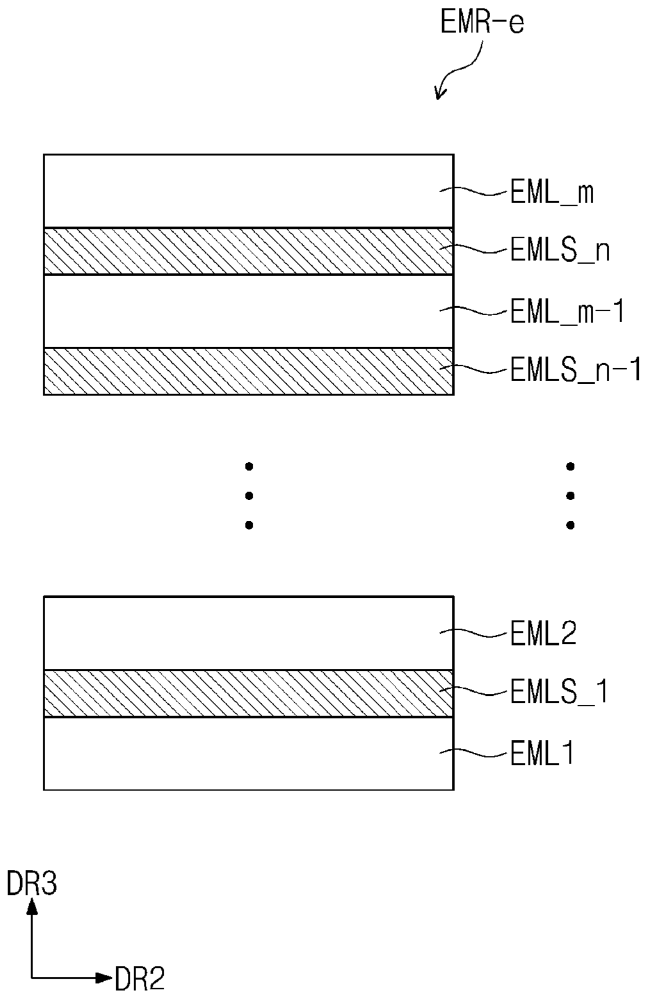
FIG. 11 is a schematic cross-sectional view illustrating a light emitting area of a light emitting element according to an embodiment.

FIGS. 7A to 11 illustrate in more detail a light emitting area EMR, EMR-a1 to EMR-a5, EMR-b1 to EMR-b3, EMR-c1 to EMR-c4, EMR-d1 to EMR-d3, and EMR-e of a light emitting element ED according to an embodiment. FIGS. 7A to 7C and 8A to 8C show that the light emitting areas EMR, EMR-a1, EMR-a2, and EMR-b1 to EMR-b3 include an auxiliary light emitting layer EMLS-1. FIGS. 7D and 9A to 9D show that the light emitting areas EMR-a3, and EMR-c1 to EMR-c4 include two auxiliary light emitting layers EMLS-1 and EMLS-2. FIGS. 7E, 7F, and 10A to 10C show that the light emitting areas EMR-a4, EMR-a5, and EMR-d1 to EMR-d3 include three auxiliary light emitting layers EMLS-1, EMLS-2, and EMLS-3. FIG. 11 illustrates a light emitting area EMR-e including n auxiliary light emitting layers EMLS_1, . . . EMLS_n-1, and EMLS_n. In FIG. 11, the same description as that of the first auxiliary light emitting layer EMLS-1 may be applied to EMLS_1.

Figure 7A:
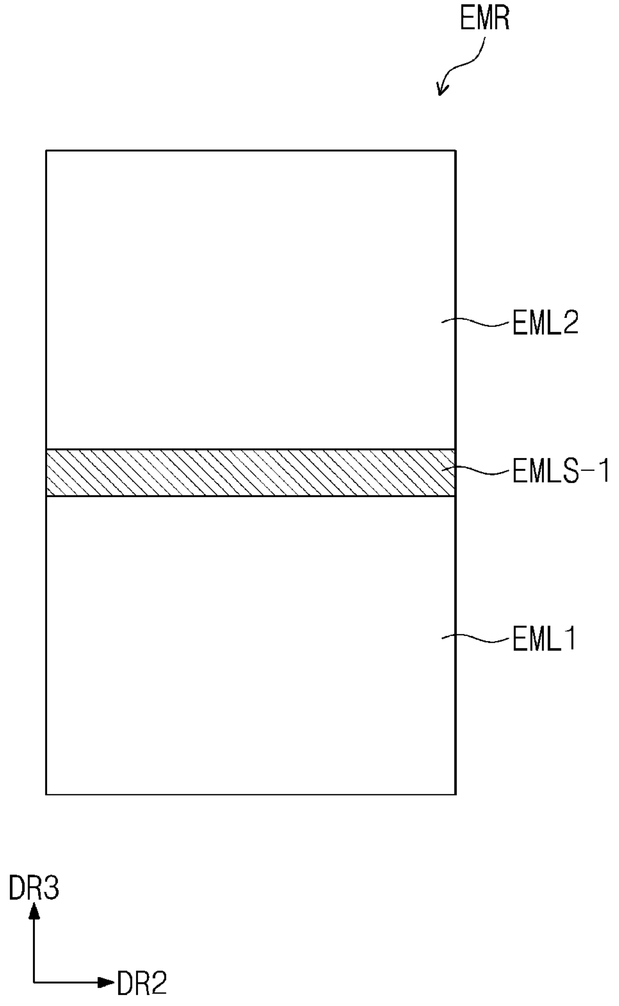
FIGS. 7A to 7F are schematic cross-sectional views illustrating a light emitting area of a light emitting element according to an embodiment.
Figure 7B:
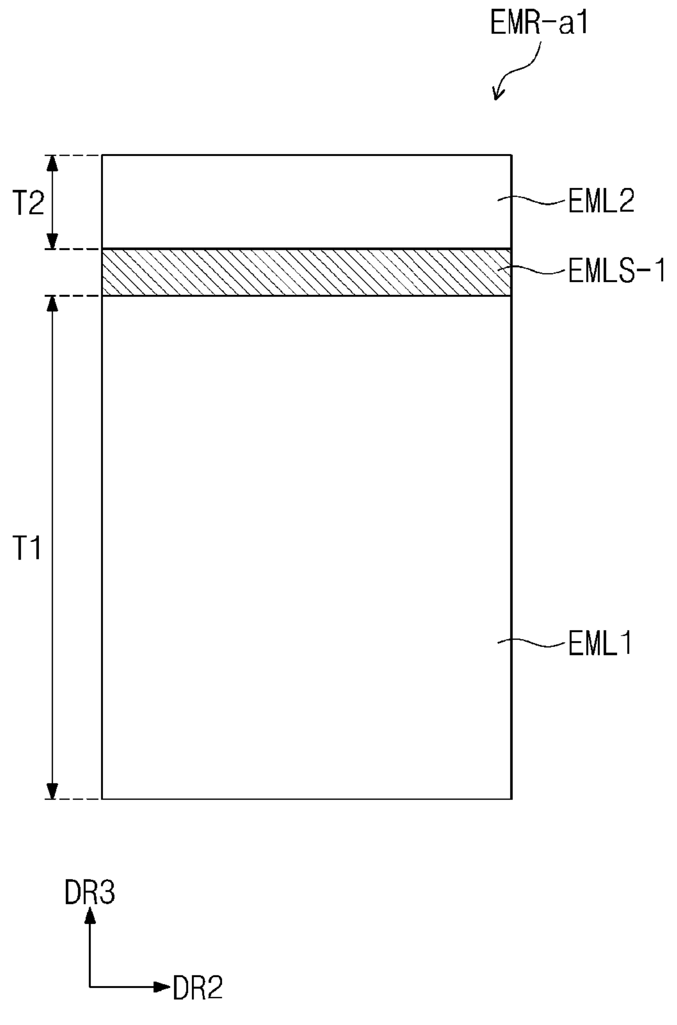
Figure 7C:
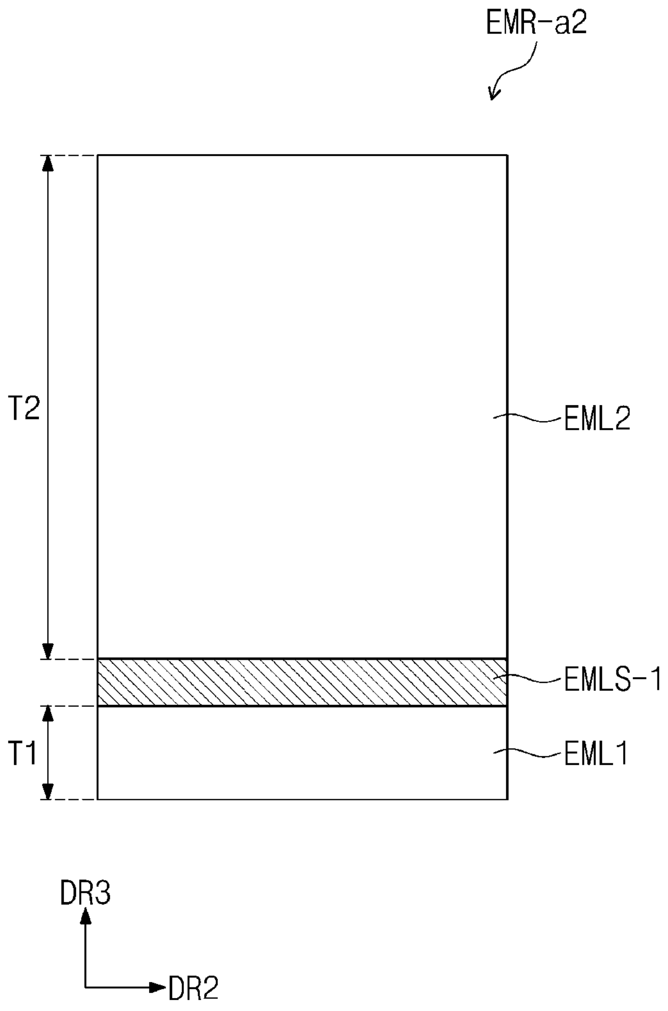

Referring to FIGS. 7A to 7C, the light emitting areas EMR, EMR-a1, and EMR-a2 include a first light emitting layer EML1 and a second light emitting layer EML2 spaced apart, with a first auxiliary light emitting layer EMLS-1 therebetween. The first light emitting layer EML1, the first auxiliary light emitting layer EMLS-1, and the second light emitting layer EML2 may be sequentially stacked.

The first auxiliary light emitting layer EMLS-1 may include a thermally activated delayed fluorescence dopant, a hole transporting host, and an electron transporting host. The first light emitting layer EML1 may include a first phosphorescent dopant, a hole transporting host, and an electron transporting host. The second light emitting layer EML2 may include a second phosphorescent dopant that is different from the first phosphorescent dopant, and may include a hole transporting host and an electron transporting host. In another embodiment, the first phosphorescent dopant and the second phosphorescent dopant may be the same.

A concentration of the first phosphorescent dopant in the first light emitting layer EML1 and a concentration of the second phosphorescent dopant in the second light emitting layer EML2 may be the same. Each of the first light emitting layer EML1 and the second light emitting layer EML2 may not include a thermally activated delayed fluorescence dopant. In the specification, a concentration of the dopant and a concentration of the host are expressed as weight percent (wt %).

A hole transporting host and an electron transporting host of each of the first light emitting layer EML1, the second light emitting layer EML2, and the first auxiliary light emitting layer EMLS-1 may be the same. In each of the first light emitting layer EML1, the second light emitting layer EML2, and the first auxiliary light emitting layer EMLS-1, a concentration of the hole transporting host and a concentration of the electron transporting host may be the same. In an embodiment of the light emitting element ED, the hole transporting host and the electron transporting host may form an exciplex. The exciplex may emit light by transferring energy to a phosphorescent dopant and to a thermally activated delayed fluorescence dopant through energy transfer.

The triplet energy of the exciplex formed by the hole transporting host and the electron transporting host may correspond to a difference between the lowest unoccupied molecular orbital (LUMO) energy level of the electron transporting host and the highest occupied molecular orbital (HOMO) energy level of the hole transporting host. For example, a triplet energy of the exciplex formed by the hole transporting host and the electron transporting host in the light emitting element may be in a range of about 2.4 eV to about 3.0 eV. A value of the triplet energy of the exciplex may be smaller than an energy gap of each host material. The energy gap may be a difference between the LUMO energy level and the HOMO energy level. For example, an energy gap of the hole transporting host and the electron transporting host may each be equal to or greater than about 3.0 eV, and the exciplex may have a triplet energy equal to or less than about 3.0 eV.

In FIG. 7A, the first light emitting layer EML1 and the second light emitting layer EML2 have similar thicknesses. In other embodiments, in FIGS. 7B and 7C, the first thickness T1 of the first light emitting layer EML1 and the second thickness T2 of the second light emitting layer EML2 are different. In FIG. 7B, it is illustrated that the first thickness T1 of the first light emitting layer EML1 is thicker than the second thickness T2 of the second light emitting layer EML2. When the first light emitting layer EML1 is formed to be thicker than the second light emitting layer EML2, the position of the first auxiliary light emitting layer EMLS-1 disposed between the first light emitting layer EML1 and the second light emitting layer EML2 may be adjacent to the electron transport region ETR (see FIGS. 3 to 6) rather than to the hole transport region HTR (see FIGS. 3 to 6).

In comparison to FIG. 7B, in FIG. 7C, it is illustrated that the first thickness T1 of the first light emitting layer EML1 is thinner than the second thickness T2 of the second light emitting layer EML2. When the first light emitting layer EML1 is formed thinner than the second light emitting layer EML2, the position of the first auxiliary light emitting layer EMLS-1 disposed between the first light emitting layer EML1 and the second light emitting layer EML2 may be adjacent to the hole transport region HTR (FIGS. 3 to 6) rather than to the electron transport region ETR (FIGS. 3 to 6).

Figure 7D:
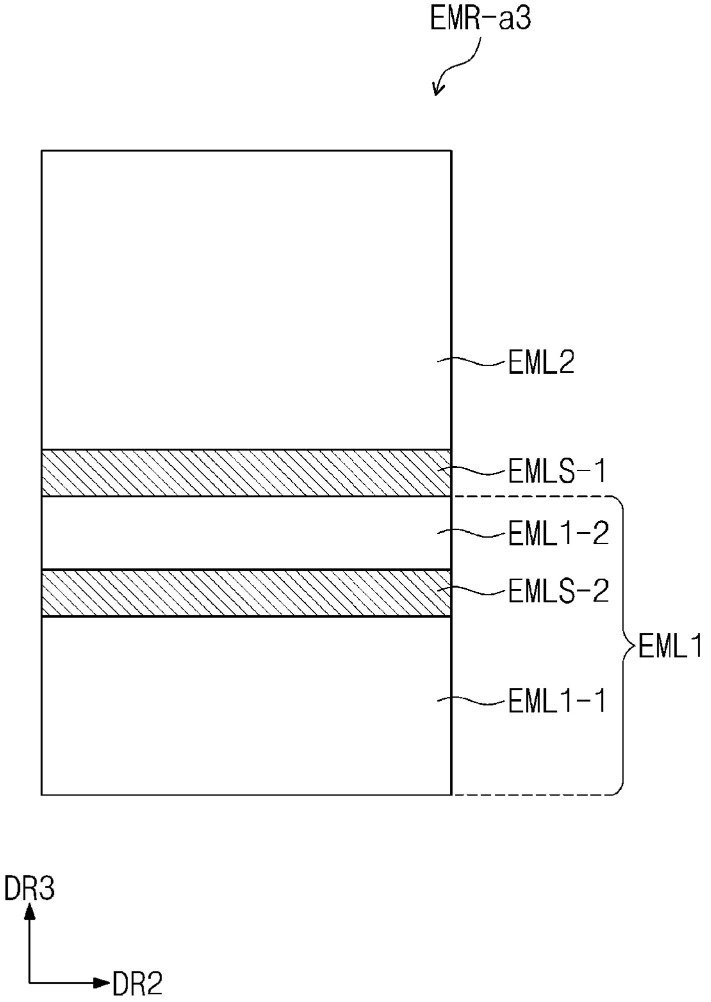
Figure 7E:
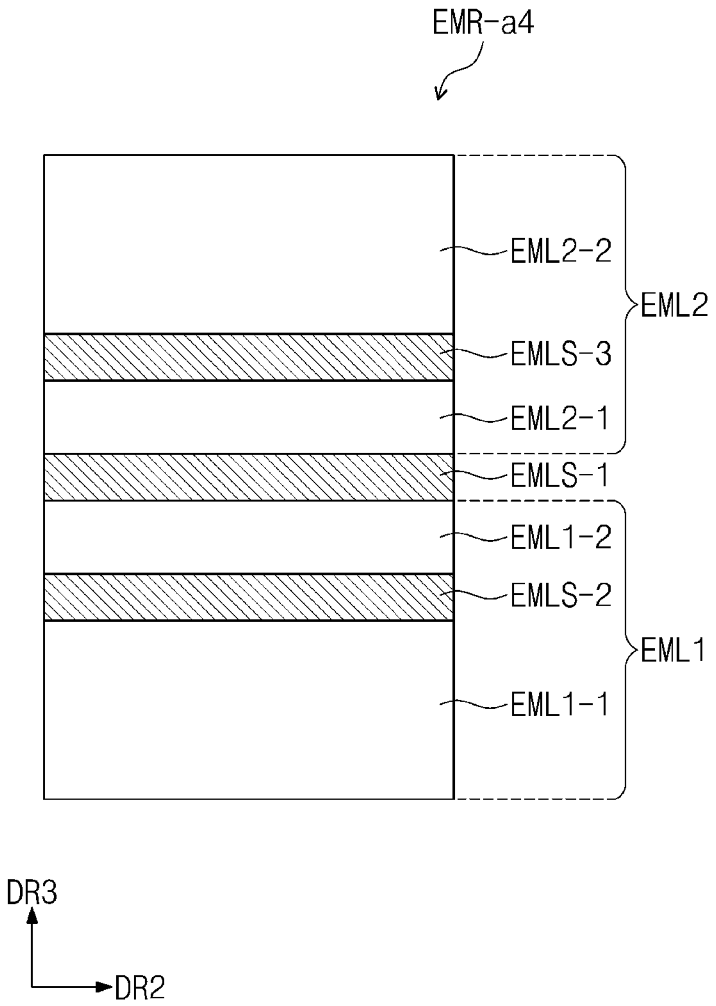

Referring to FIGS. 7D and 7E, the first light emitting layer EML1 may include a first auxiliary light emitting layer EMLS-1 and a second auxiliary light emitting layer EMLS-2 spaced apart from each other. The first light emitting layer EML1 may include a 1-1 light emitting layer EML1-1 and a 1-2 light emitting layer EML1-2 spaced apart, with a second auxiliary light emitting layer EMLS-2 interposed therebetween. The first auxiliary light emitting layer EMLS-1 may be adjacent to the 1-2 light emitting layer EML1-2 rather than to the 1-1 light emitting layer EML1-1. The light emitting area EMR-a3 may include a 1-1 light emitting layer EML1-1, a second auxiliary light emitting layer EMLS-2, a 1-2 light emitting layer EML1-2, a first auxiliary light emitting layer EMLS-1, and a second light emitting layer EML2, which are sequentially stacked.

The second auxiliary light emitting layer EMLS-2 may include a thermally activated delayed fluorescence dopant, a hole transporting host, and an electron transporting host. In the first auxiliary light emitting layer EMLS-1 and the second auxiliary light emitting layer EMLS-2, each of the thermally activated delayed fluorescence dopant, the hole transporting host, and the electron transporting host may be the same. The second auxiliary light emitting layer EMLS-2 may not include a phosphorescent dopant.

The 1-1 light emitting layer EML1-1 may include a 1-1 phosphorescent dopant, and the 1-2 light emitting layer EML1-2 may include a 1-2 phosphorescent dopant that is different from the 1-1 phosphorescent dopant. In another embodiment, the 1-1 phosphorescent dopant and the 1-2 phosphorescent dopant may be the same.

A concentration of the 1-1 phosphorescent dopant in the 1-1 light emitting layer EML1-1 may be the same as a concentration of the 1-2 phosphorescent dopant in the 1-2 light emitting layer EML1-2. Each of the 1-1 light emitting layer EML1-1 and the 1-2 light emitting layer EML1-2 may include a hole transporting host and an electron transporting host. Each of the 1-1 light emitting layer EML1-1 and the 1-2 light emitting layer EML1-2 may not include a thermally activated delayed fluorescence dopant.

For example, the 1-1 light emitting layer EML1-1 may be thicker than the 1-2 light emitting layer EML1-2. A second auxiliary light emitting layer EMLS-2 disposed between the 1-1 light emitting layer EML1-1 and the 1-2 light emitting layer EML1-2 may be disposed adjacent to an upper surface of the first light emitting layer EML1 rather than a lower surface thereof. However, this is only an example, and the position of the second auxiliary light emitting layer EMLS-2 is not limited thereto. Although not shown in the drawing, the second auxiliary light emitting layer EMLS-2 may be included in the second light emitting layer EML2.

In FIG. 7E, the second light emitting layer EML2 is illustrated as including a third auxiliary light emitting layer EMLS-3 spaced apart from the first auxiliary light emitting layer EMLS-1. The second light emitting layer EML2 may include a 2-1 light emitting layer EML2-1 and a 2-2 light emitting layer EML2-2 spaced apart, with a third auxiliary light emitting layer EMLS-3 interposed therebetween. The first auxiliary light emitting layer EMLS-1 may be adjacent to the 2-1 light emitting layer EML2-1 rather than to the 2-2 light emitting layer EML2-2. The light emitting area EMR-a4 may include a 1-1 light emitting layer EML1-1, a second auxiliary light emitting layer EMLS-2, a 1-2 light emitting layer EML1-2, a first auxiliary light emitting layer EMLS-1, a 2-1 light emitting layer EML2-1, a third auxiliary light emitting layer EMLS-3, and a 2-2 light emitting layer EML2-2, which are sequentially stacked.

The third auxiliary light emitting layer EMLS-3 may include a thermally activated delayed fluorescence dopant, a hole transporting host, and an electron transporting host. In the first auxiliary light emitting layer EMLS-1, the second auxiliary light emitting layer EMLS-2, and the third auxiliary light emitting layer EMLS-3, each of the thermally activated delayed fluorescence dopant, the hole transporting host, and the electron transporting host may be the same. The third auxiliary light emitting layer EMLS-3 may not include a phosphorescent dopant.

The 2-1 light emitting layer EML2-1 may include a 2-1 phosphorescent dopant, and the 2-2 light emitting layer EML2-2 may include a 2-2 phosphorescent dopant that is different from the 2-1 phosphorescent dopant. In another embodiment, the 2-1 phosphorescent dopant and the 2-2 phosphorescent dopant may be the same.

A concentration of the 2-1 phosphorescent dopant in the 2-1 light emitting layer EML2-1 may be the same as a concentration of the 2-2 phosphorescent dopant in the 2-2 light emitting layer EML2-2. Each of the 2-1 light emitting layer EML2-1 and the 2-2 light emitting layer EML2-2 may include a hole transporting host and an electron transporting host. Each of the 2-1 light emitting layer EML2-1 and the 2-2 light emitting layer EML2-2 may not include a thermally activated delayed fluorescence dopant.

For example, the 1-1 phosphorescent dopant of the 1-1 light emitting layer EML1-1 may be different from any one of the 2-1 phosphorescent dopant and the 2-2 phosphorescent dopant. In another embodiment, the 1-1 phosphorescent dopant of the 1-1 light emitting layer EML1-1 may be different from the 2-1 phosphorescent dopant and the 2-2 phosphorescent dopant. The 1-2 phosphorescent dopant of the 1-2 light emitting layer EML1-2 may be different from any one of the 2-1 phosphorescent dopant and the 2-2 phosphorescent dopant. In another embodiment, the 1-2 phosphorescent dopant of the 1-2 light emitting layer EML1-2 may be different from the 2-1 phosphorescent dopant and the 2-2 phosphorescent dopant. A concentration of the 1-1 phosphorescent dopant in the 1-1 light emitting layer EML1-1, a concentration of the 1-2 phosphorescent dopant in the 1-2 light emitting layer EML1-2, a concentration of the 2-1 phosphorescent dopant in the 2-1 light emitting layer EML2-1, and a concentration of the 2-2 phosphorescent dopant in the 2-2 light emitting layer EML2-2 may be the same.

The 2-1 light emitting layer EML2-1 may be thinner than the 2-2 light emitting layer EML2-2. A third auxiliary light emitting layer EMLS-3 disposed between the 2-1 light emitting layer EML2-1 and the 2-2 light emitting layer EML2-2 may be disposed adjacent to an upper surface of the second light emitting layer EML2 rather than a lower surface thereof. However, this is only an example, and the position of the third auxiliary light emitting layer EMLS-3 is not limited thereto.

A thickness of the 1-1 light emitting layer EML1-1 and a thickness of the 2-2 light emitting layer EML2-2 may be of a similar size, and a thickness of the 1-2 light emitting layer EML1-2 and a thickness of the 2-1 light emitting layer EML2-1 may be of a similar size. Accordingly, the spacing between the second auxiliary light emitting layer EMLS-2 and the first auxiliary light emitting layer EMLS-1 and the spacing between the first auxiliary light emitting layer EMLS-1 and the third auxiliary light emitting layer EMLS-3 may be similar. The first auxiliary light emitting layer EMLS-1 may be disposed in the center of the light emitting area EMR-a4 based on a thickness direction. However, this is only an example, and spacing and positions between auxiliary light emitting layers EMLS-1, EMLS-2, and EMLS-3 are not limited thereto.

Figure 7F:
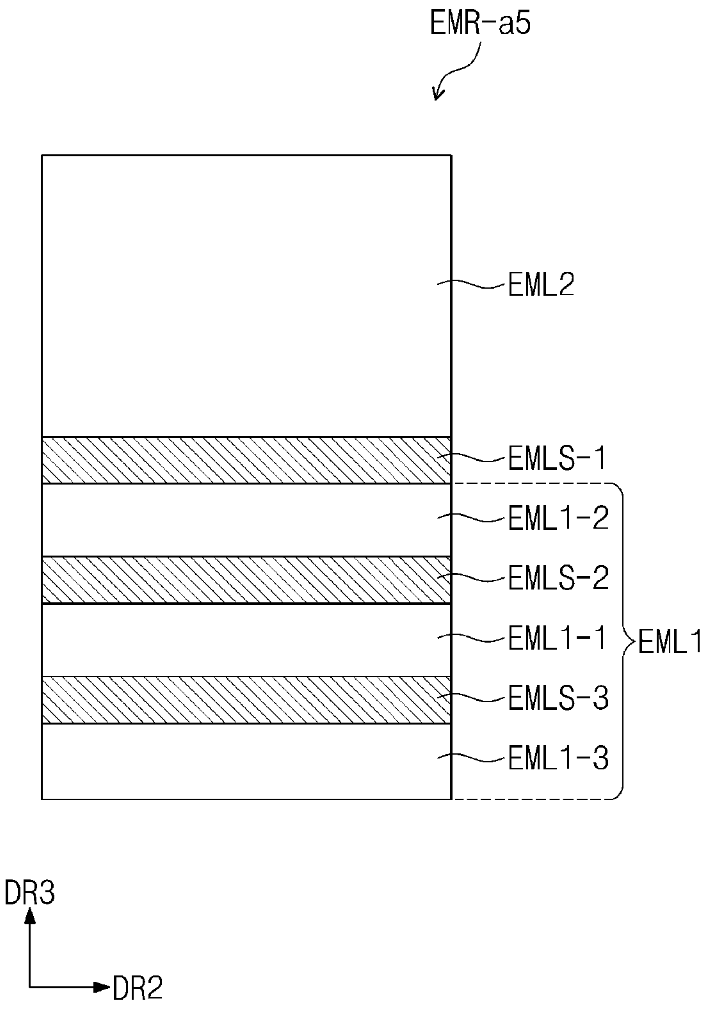

In FIG. 7F, a first light emitting layer EML1 is illustrated as including a second auxiliary light emitting layer EMLS-2 and a third auxiliary light emitting layer EMLS-3, each spaced apart from a first auxiliary light emitting layer EMLS-1. The first light emitting layer EML1 may include a 1-1 light emitting layer EML1-1, a 1-2 light emitting layer EML1-2, and a 1-3 light emitting layer EML1-3, which are spaced apart from each other. A third auxiliary light emitting layer EMLS-3 may be disposed between the 1-3 light emitting layer EML1-3 and the 1-1 light emitting layer EML1-1, and a second auxiliary light emitting layer EMLS-2 may be disposed between the 1-1 light emitting layer EML1-1 and the 1-2 light emitting layer EML1-2. The light emitting area EMR-a5 may include a 1-3 light emitting layer EML1-3, a third auxiliary light emitting layer EMLS-3, a 1-1 light emitting layer EML1-1, a second auxiliary light emitting layer EMLS-2, a 1-2 light emitting layer EML1-2, a first auxiliary light emitting layer EMLS-1, and a second light emitting layer EML2, which are sequentially stacked.

Each of the 1-1 light emitting layer EML1-1, the 1-2 light emitting layer EML1-2, and the 1-3 light emitting layer EML1-3 may include a phosphorescent dopant. The phosphorescent dopant of each of the 1-1 light emitting layer EML1-1, the 1-2 light emitting layer EML1-2, and the 1-3 light emitting layer EML1-3 may be the same or at least one thereof may be different. For example, a first light emitting layer EML1 including a 1-1 light emitting layer EML1-1, a 1-2 light emitting layer EML1-2, and a 1-3 light emitting layer EML1-3 may include one or more and three or fewer phosphorescent dopants. Each of the 1-1 light emitting layer EML1-1, the 1-2 light emitting layer EML1-2, and the 1-3 light emitting layer EML1-3 may include a hole transporting host and an electron transporting host.

For example, the thicknesses of the 1-1 light emitting layer EML1-1, the 1-2 light emitting layer EML1-2, and the 1-3 light emitting layer EML1-3 may be of a similar size. The spacing between the third auxiliary light emitting layer EMLS-3 and the second auxiliary light emitting layer EMLS-2 may be similar to the spacing between the second auxiliary light emitting layer EMLS-2 and the first auxiliary light emitting layer EMLS-1. The first auxiliary light emitting layer EMLS-1 may be disposed in the center of the light emitting area EMR-a5 based on a thickness direction. However, this is only an example, and the spacing and positions between auxiliary light emitting layers EMLS-1, EMLS-2, and EMLS-3 are not limited thereto.

In the light emitting element ED of an embodiment, when there are multiple auxiliary light emitting layers EMLS-1, EMLS-2, and EMLS-3, the thermally activated delayed fluorescence dopant included in auxiliary light emitting layers EMLS-1, EMLS-2, and EMLS-3 may be the same. The thermally activated delayed fluorescence dopant may be a donor-acceptor (DA) type or a multiple resonance (MR) type thermally activated delayed fluorescence dopant.

A concentration of the thermally activated delayed fluorescence dopant in each of the auxiliary light emitting layers EMLS-1, EMLS-2, and EMLS-3 may be the same. In the light emitting areas EMR-a3, EMR-a4, and EMR-a5 of FIGS. 7D to 7F, the first to third auxiliary light emitting layers EMLS-1, EMLS-2, and EMLS-3 may each include a same thermally activated delayed fluorescence dopant. In the light emitting areas EMR-a3, EMR-a4, and EMR-a5, a concentration of the thermally activated delayed fluorescence dopant in each of the first to third auxiliary light emitting layers EMLS-1, EMLS-2, and EMLS-3 may be the same.

A concentration of the thermally activated delayed fluorescence dopant in the light emitting areas EMR, EMR-a1, and EMR-a2 may be very low compared to a concentration of the phosphorescent dopant. A concentration of the thermally activated delayed fluorescence dopant in the first auxiliary light emitting layer EMLS-1 may be lower than each of a concentration of the first phosphorescent dopant in the first light emitting layer EML1 and a concentration of the second phosphorescent dopant in the second light emitting layer EML2. For example, a concentration of the thermally activated delayed fluorescence dopant in the first auxiliary light emitting layer EMLS-1 may be in a range of about 0.5 wt % to about 2 wt %. A concentration of the first phosphorescent dopant in the first light emitting layer EML1 and a concentration of the second phosphorescent dopant in the second light emitting layer EML2 may each independently be in a range of about 10 wt % to about 30 wt %. However, this is only an example, and the concentration of the phosphorescent dopant and the concentration of the thermally activated delayed fluorescence dopant in the light emitting element ED of an embodiment are not limited thereto.

In FIGS. 7A to 7F, the position, number, and spacing of auxiliary light emitting layers EMLS-1, EMLS-2, and EMLS-3 may vary depending on the recombination zone of each of the light emitting areas EMR, and EMR-a1 to EMR-a5. As the number of recombination zones increases, the number of auxiliary light emitting layers may increase, and the spacing between auxiliary light emitting layers may vary according to spacing between the recombination zones. Positions of auxiliary light emitting layers may vary according to positions of the recombination zone(s). The recombination zone is a region where excitons are formed and light is emitted, and the location, number, and spacing of the recombination zone may be changed by dopants and hosts included in the light emitting area. Therefore, the position, number, and spacing of the auxiliary light emitting layer EMLS-1, EMLS-2, and EMLS-3 in the light emitting element ED of embodiments are not limited to those shown in the drawings and may vary depending on the recombination zone of the light emitting areas EMR, and EMR-a1 to EMR-a5.

According to an embodiment, the light emitting area of the light emitting element ED may include a lower light emitting layer, a middle light emitting layer, and an upper light emitting layer, which each have different concentrations of phosphorescent dopants and are sequentially stacked. However, this is only an example, and in the light emitting element (ED) according to an embodiment, the light emitting area may include four or more light emitting layers each having different concentrations of phosphorescent dopants.

In FIGS. 8A to 10C, the light emitting areas EMR-b1 to EMR-b3, EMR-c1 to EMR-c4, and EMR-d1 to EMR-d3 each including a lower light emitting layer EML1, a middle light emitting layer EML3, and an upper light emitting layer EML2 are shown. In the description of FIGS. 8A to 10C, the lower light emitting layer may be referred to as EML1, the middle light emitting layer may be referred to as EML3, and the upper light emitting layer may be referred to as EML2. The third light emitting layer may be referred to as a middle light emitting layer EML3.

Each of the lower light emitting layer EML1, the middle light emitting layer EML3, and the upper light emitting layer EML2 may include a phosphorescent dopant, a hole transporting host, and an electron transporting host. In the lower light emitting layer EML1, the middle light emitting layer EML3, and the upper light emitting layer EML2, the phosphorescent dopant may be the same. In the lower light emitting layer EML1, the middle light emitting layer EML3, and the upper light emitting layer EML2, the hole transporting host and the electron transporting host may each be the same.

According to an embodiment, a concentration of the phosphorescent dopant may sequentially increase or sequentially decrease in a direction from the lower light emitting layer EML1 to the upper light emitting layer EML2. For example, a concentration of the phosphorescent dopant in the middle light emitting layer EML3 may be greater than a concentration of the phosphorescent dopant in the lower light emitting layer EML1 and less than a concentration of the phosphorescent dopant in the upper light emitting layer EML2. For example, in an embodiment, a concentration of the phosphorescent dopant may sequentially increase in a direction from the lower light emitting layer EML1 to the upper light emitting layer EML2.

In another embodiment, a concentration of the phosphorescent dopant in the middle light emitting layer EML3 may be less than a concentration of the phosphorescent dopant in the lower light emitting layer EML1 and greater than a concentration of the phosphorescent dopant in the upper light emitting layer EML2. As another example, a concentration of the phosphorescent dopant may sequentially decrease in a direction from the lower light emitting layer EML1 to the upper light emitting layer EML2.

For example, a concentration of the phosphorescent dopant in the middle light emitting layer EML3 may be in a range of about 1.1 times to about 1.3 times a concentration of the phosphorescent dopant in the lower light emitting layer EML1. A concentration of the phosphorescent dopant in the upper light emitting layer EML2 may be in a range of about 1.1 times to about 1.3 times a concentration of the phosphorescent dopant in the middle light emitting layer EML3. In another embodiment, a concentration of the phosphorescent dopant in the middle light emitting layer EML3 may be in a range of about 1.1 times to about 1.3 times a concentration of the phosphorescent dopant in the upper light emitting layer EML2. A concentration of the phosphorescent dopant in the lower light emitting layer EML1 may be in a range of about 1.1 times to about 1.3 times a concentration of the phosphorescent dopant in the middle light emitting layer EML3. However, this is only an example, and a concentration of the phosphorescent dopant in each of the lower light emitting layer EML1, the middle light emitting layer EML3, and the upper light emitting layer EML2 is not limited thereto.

In FIGS. 8A to 10C, a thickness of each of the lower light emitting layer EML1, the middle light emitting layer EML3, and the upper light emitting layer EML2 is illustrated as being similar. However, this is only an example, and at least one of a thickness of the lower light emitting layer EML1, a thickness of the middle light emitting layer EML3, and a thickness of the upper light emitting layer EML2 may be different.

Figure 8A:
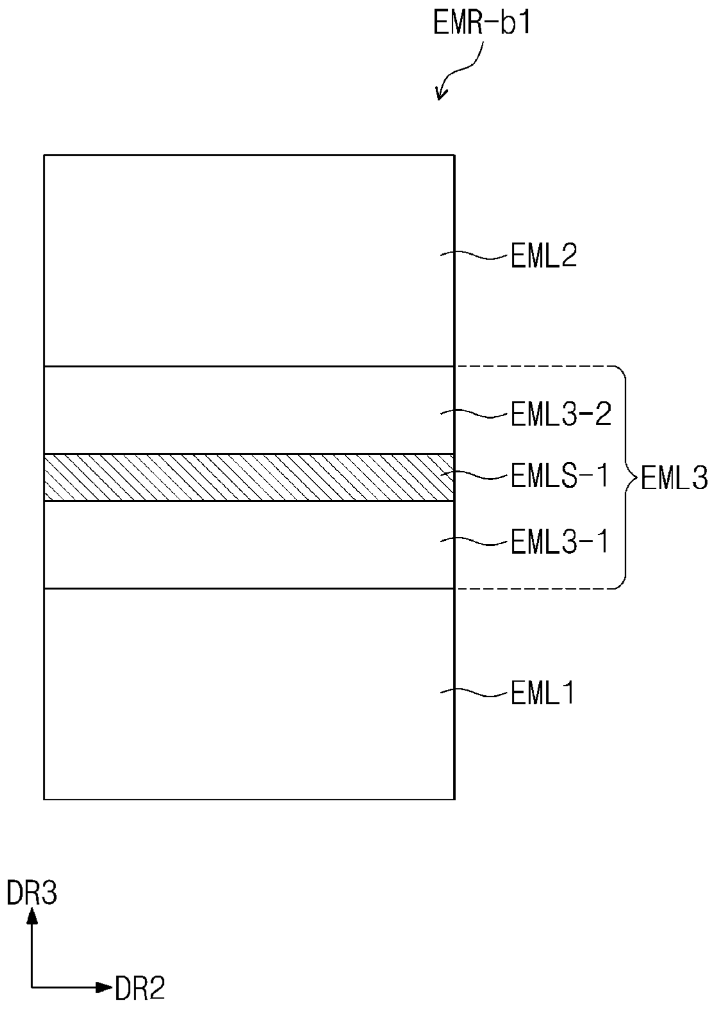
FIGS. 8A to 8C are schematic cross-sectional views illustrating a light emitting area of a light emitting element according to an embodiment.
Figure 8B:
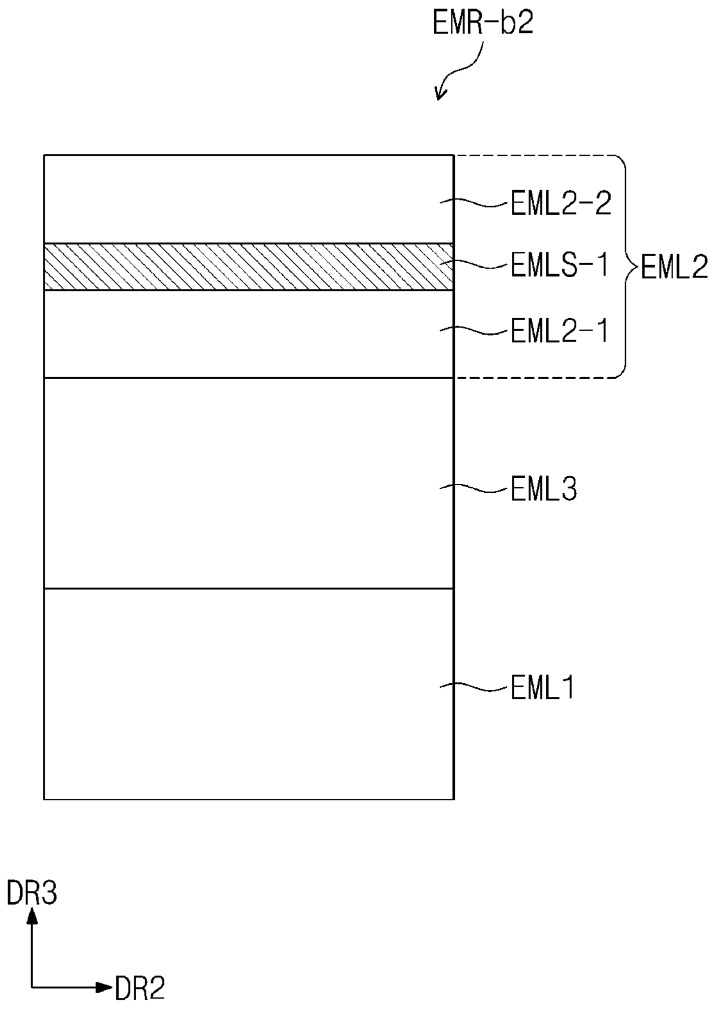
Figure 8C:
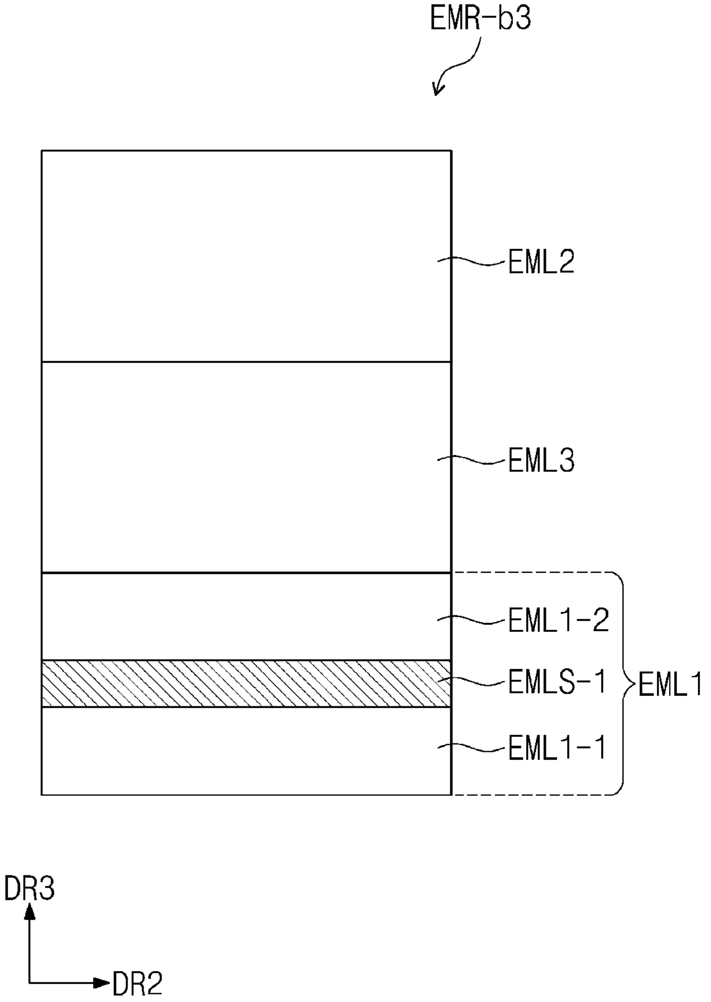

In an embodiment, at least one auxiliary light emitting layer EMLS-1, EMLS-2, or EMLS-3 may be included in a lower light emitting layer EML1, a middle light emitting layer EML3, or an upper light emitting layer EML2. At least one auxiliary light emitting layer EMLS-1, EMLS-2, or EMLS-3 may be disposed in the lower light emitting layer EML1, the middle light emitting layer EML3, or the upper light emitting layer EML2. Referring to FIGS. 8A to 8C, in relation to the light emitting areas EMR-b1, EMR-b2, or EMR-b3, any one of a lower light emitting layer EML1, a middle light emitting layer EML3, and an upper light emitting layer EML2 may include a first auxiliary light emitting layer EMLS-1.

Referring to FIG. 8A, the middle light emitting layer EML3 may include a first auxiliary light emitting layer EMLS-1. The middle light emitting layer EML3 may include a first middle light emitting layer EML3-1 and a second middle light emitting layer EML3-2 spaced apart, with a first auxiliary light emitting layer EMLS-1 therebetween. The first middle light emitting layer EML3-1 and the second middle light emitting layer EML3-2 may include a same phosphorescent dopant. In the first middle light emitting layer EML3-1 and the second middle light emitting layer EML3-2, a concentration of a phosphorescent dopant may be the same.

For example, a thickness of the first middle light emitting layer EML3-1 and a thickness of the second middle light emitting layer EML3-2 may be similar. Accordingly, the first auxiliary light emitting layer EMLS-1 disposed between the first middle light emitting layer EML3-1 and the second middle light emitting layer EML3-2 may be disposed in the center of the middle light emitting layer EML3 based on a thickness direction. The first auxiliary light emitting layer EMLS-1 disposed at the center of the middle light emitting layer EML3 may be disposed at the center of the light emitting area EMR-b1 based on a thickness direction.

Referring to FIG. 8B, the upper light emitting layer EML2 may include a first auxiliary light emitting layer EMLS-1. The upper light emitting layer EML2 may include a first upper light emitting layer EML2-1 and a second upper light emitting layer EML2-2 spaced apart, with a first auxiliary light emitting layer EMLS-1 interposed therebetween. The first upper light emitting layer EML2-1 and the second upper light emitting layer EML2-2 may include a same phosphorescent dopant. A phosphorescent dopant concentration of the first upper light emitting layer EML2-1 and a phosphorescent dopant concentration of the second upper light emitting layer EML2-2 may be greater than or less than a phosphorescent dopant concentration of the middle light emitting layer EML3.

For example, a thickness of the first upper light emitting layer EML2-1 and a thickness of the second upper light emitting layer EML2-2 may be of a similar size. Accordingly, the first auxiliary light emitting layer EMLS-1 disposed between the first upper light emitting layer EML2-1 and the second upper light emitting layer EML2-2 may be disposed in the center of the upper light emitting layer EML2. The first auxiliary light emitting layer EMLS-1 disposed in the upper light emitting layer EML2 may be adjacent to the electron transport region ETR (see FIGS. 3 to 6) rather than to the hole transport region HTR (see FIGS. 3 to 6).

Referring to FIG. 8C, the lower light emitting layer EML1 may include a first auxiliary light emitting layer EMLS-1. The lower light emitting layer EML1 may include a first lower light emitting layer EML1-1 and a second lower light emitting layer EML1-2 spaced apart, with a first auxiliary light emitting layer EMLS-1 therebetween. The first lower light emitting layer EML1-1 and the second lower light emitting layer EML1-2 may include a same phosphorescent dopant, and a concentration of the phosphorescent dopant in the first lower light emitting layer EML1-1 and a concentration of the phosphorescent dopant in the second lower light emitting layer EML1-2 may be the same.

For example, a thickness of the first lower light emitting layer EML1-1 and a thickness of the second lower light emitting layer EML1-2 may be of a similar size. Accordingly, the first auxiliary light emitting layer EMLS-1 disposed between the first lower light emitting layer EML1-1 and the second lower light emitting layer EML1-2 may be disposed in the center of the lower light emitting layer EML1. As the first auxiliary light emitting layer EMLS-1 is disposed in the lower light emitting layer EML1, the first auxiliary light emitting layer EMLS-1 may be adjacent to the hole transport region HTR (see FIGS. 3 to 6) rather than to the electron transport region ETR (see FIGS. 3 to 6).

In the light emitting areas EMR-b1, EMR-b2, and EMR-b3 of FIGS. 8A to 8C, the first auxiliary light emitting layer EMLS-1 may include a thermally activated delayed fluorescence dopant, a hole transporting host, and an electron transporting host. The first auxiliary light emitting layer EMLS-1 may not include a phosphorescent dopant. In the lower light emitting layer EML1, the middle light emitting layer EML3, and the upper light emitting layer EML2, the hole transporting host and the electron transporting host may be the same. The lower light emitting layer EML1, the middle light emitting layer EML3, and the upper light emitting layer EML2 may not include a thermally activated delayed fluorescence dopant.

FIGS. 9A to 9D show that the light emitting areas EMR-c1 to EMR-c4 further include a second auxiliary light emitting layer EMLS-2. The light emitting areas EMR-c1 to EMR-c4 may include a first auxiliary light emitting layer EMLS-1 and a second auxiliary light emitting layer EMLS-2 spaced apart from each other.

In relation to the light emitting area EMR-c1 of FIG. 9A and the light emitting area EMR-c2 of FIG. 9B, the light emitting area EMR-b1 of FIG. 8A may further include a second auxiliary light emitting layer EMLS-2. The description of the light emitting area EMR-b1 of FIG. 8A may be equally applied to the light emitting area EMR-c1 of FIG. 9A and the light emitting area EMR-c2 of FIG. 9B.

Referring to FIG. 9A, the middle light emitting layer EML3 may include a first auxiliary light emitting layer EMLS-1, and a second auxiliary light emitting layer EMLS-2 may be disposed between the middle light emitting layer EML3 and the lower light emitting layer EML1. In the light emitting area EMR-c1, the second auxiliary light emitting layer EMLS-2 may be adjacent to the hole transport region HTR (see FIGS. 3 to 6) rather than to the electron transport region ETR (see FIGS. 3 to 6).

Referring to FIG. 9B, the middle light emitting layer EML3 may include a first auxiliary light emitting layer EMLS-1, and a second auxiliary light emitting layer EMLS-2 may be disposed between the middle light emitting layer EML3 and the upper light emitting layer EML2. In the light emitting area EMR-c2, the second auxiliary light emitting layer EMLS-2 may be adjacent to the electron transport region ETR (see FIGS. 3 to 6) rather than to the hole transport region HTR (see FIGS. 3 to 6).

Referring to FIG. 9C, the lower light emitting layer EML1 may include a first auxiliary light emitting layer EMLS-1, and a second auxiliary light emitting layer EMLS-2 may be disposed between the lower light emitting layer EML1 and the middle light emitting layer EML3. In relation to the light emitting area EMR-c3 of FIG. 9C, the light emitting area EMR-b3 of FIG. 8C may further include a second auxiliary light emitting layer EMLS-2. The description of the light emitting area EMR-b3 of FIG. 8C may be equally applied to the light emitting area EMR-c3 of FIG. 9C. The second auxiliary light emitting layer EMLS-2 disposed between the lower light emitting layer EML1 and the middle light emitting layer EML3 may be adjacent to the hole transport region HTR (see FIGS. 3 to 6) rather than to the electron transport region ETR (see FIGS. 3 to 6).

Referring to FIG. 9D, the upper light emitting layer EML2 may include a first auxiliary light emitting layer EMLS-1, and a second auxiliary light emitting layer EMLS-2 may be disposed between the middle light emitting layer EML3 and the upper light emitting layer EML2. In relation to the light emitting area EMR-c4 of FIG. 9D, the light emitting area EMR-b2 of FIG. 8B may further include a second auxiliary light emitting layer EMLS-2. The description of the light emitting area EMR-b2 of FIG. 8B may be equally applied to the light emitting area EMR-c4 of FIG. 9D. The second auxiliary light emitting layer EMLS-2 disposed between the middle light emitting layer EML3 and the upper light emitting layer EML2 may be adjacent to the electron transport region ETR (see FIGS. 3 to 6) rather than to the hole transport region HTR (see FIGS. 3 to 6).

In FIGS. 9A to 9D, the second auxiliary light emitting layer EMLS-2 may include a thermally activated delayed fluorescence dopant, a hole transporting host, and an electron transporting host. In the first auxiliary light emitting layer EMLS-1 and the second auxiliary light emitting layer EMLS-2, each of the thermally activated delayed fluorescence dopant, the hole transporting host, and the electron transporting host may be the same.

FIGS. 10A to 10C show that the light emitting areas EMR-d1 to EMR-d3 further include a third auxiliary light emitting layer EMLS-3. The light emitting areas EMR-d1 to EMR-d3 may include a first auxiliary light emitting layer EMLS-1, a second auxiliary light emitting layer EMLS-2, and a third auxiliary light emitting layer EMLS-3, which are spaced apart from each other.

Referring to FIG. 10A, the middle light emitting layer EML3 may include a first auxiliary light emitting layer EMLS-1, and a second auxiliary light emitting layer EMLS-2 may be disposed between the lower light emitting layer EML1 and the middle light emitting layer EML3. A third auxiliary light emitting layer EMLS-3 may be disposed between the middle light emitting layer EML3 and the upper light emitting layer EML2. In relation to the light emitting area EMR-d1 of FIG. 10A, the light emitting area EMR-c1 of FIG. 9A or the light emitting area EMR-c2 of FIG. 9B may further include a third auxiliary light emitting layer EMLS-3. The descriptions of the light emitting area EMR-c1 of FIG. 9A and the light emitting area EMR-c2 of FIG. 9B may be equally applied to the light emitting area EMR-d1 of FIG. 10A.

Referring to FIG. 10B, the middle light emitting layer EML3 may include a first auxiliary light emitting layer EMLS-1, and the lower light emitting layer EML1 may include a third auxiliary light emitting layer EMLS-3. A second auxiliary light emitting layer EMLS-2 may be disposed between the lower light emitting layer EML1 and the middle light emitting layer EML3. In relation to the light emitting area EMR-d2 of FIG. 10B, the light emitting area EMR-c1 of FIG. 9A further includes a third auxiliary light emitting layer EMLS-3. In relation to the light emitting area EMR-d2 of FIG. 10B, the light emitting area EMR-c3 of FIG. 9C may further include an auxiliary light emitting layer disposed in the middle light emitting layer EML3. The descriptions of the light emitting area EMR-c1 of FIG. 9A and the light emitting area EMR-c3 of FIG. 9C may be equally applied to the light emitting area EMR-d2 of FIG. 10B.

Referring to FIG. 10C, the middle light emitting layer EML3 may include a first auxiliary light emitting layer EMLS-1, and the upper light emitting layer EML2 may include a third auxiliary light emitting layer EMLS-3. A second auxiliary light emitting layer EMLS-2 may be disposed between the middle light emitting layer EML3 and the upper light emitting layer EML2. In relation to the light emitting area EMR-d3 of FIG. 10C, the light emitting area EMR-c2 of FIG. 9B further includes a third auxiliary light emitting layer EMLS-3. In relation to the light emitting area EMR-d3 of FIG. 10C, the light emitting area EMR-c4 of FIG. 9D may further include an auxiliary light emitting layer EMLS-1 disposed in the middle light emitting layer EML3. The descriptions of the light emitting area EMR-c2 of FIG. 9B and the light emitting area EMR-c4 of FIG. 9D may be equally applied to the light emitting area EMR-d3 of FIG. 10C.

In FIGS. 10A to 10C, the third auxiliary light emitting layer EMLS-3 may include a thermally activated delayed fluorescence dopant, a hole transporting host, and an electron transporting host. In the first auxiliary light emitting layer EMLS-1, the second auxiliary light emitting layer EMLS-2, and the third auxiliary light emitting layer EMLS-3, the same thermally activated delayed fluorescence dopant, the same hole transporting host, and the same electron transporting host may be included.

In FIGS. 7A to 10C, light emitting areas EMR, EMR-a1 to EMR-a5, EMR-b1 to EMR-b3, EMR-c1 to EMR-c4, and EMR-d1 to EMR-d3 including one to three auxiliary light emitting layers EMLS-1, EMLS-2, and EMLS-3 are illustrated, but embodiments are not limited thereto. Referring to FIG. 11, the light emitting area EMR-d according to an embodiment may include n auxiliary light emitting layers EMLS_1, . . . EMLS_n-1, and EMLS_n. The light emitting area EMR-d of an embodiment may include m light emitting layers EML1, EML2, . . . EML_m-1, and EML_m arranged with n auxiliary light emitting layers EMLS_1, . . . EMLS_n-1, and EMLS_n interposed therebetween. In the light emitting area EMR-d of an embodiment, n may be a natural number greater than or equal to 1, m may be a natural number greater than or equal to 2, and n is less than m.

The n auxiliary light emitting layers EMLS_1, . . . EMLS_n-1, and EMLS_n and the m light emitting layers EML1, EML2, . . . EML_m-1, and EML_m may be alternately disposed in a thickness direction. For example, the light emitting element ED of an embodiment may include four auxiliary light emitting layers, and may include 5 or more light emitting layers arranged with auxiliary light emitting layers therebetween. However, this is only an example, and the number of auxiliary light emitting layers and the number of light emitting layers in the light emitting element ED according to an embodiment are not limited thereto.

In FIGS. 7A to 11, the thicknesses of the light emitting areas EMR, EMR-a1 to EMR-a5, EMR-b1 to EMR-b3, EMR-c1 to EMR-c4, EMR-d1 to EMR-d3, and EMR-e may be the same. When the number of auxiliary light emitting layers EMLS1, EMLS2, EMLS3, . . . EMLS_n-1, and EMLS_n increases, the thicknesses of the light emitting layers EML1, EML2, EML3, . . . EML_m-1, and EML_m may be reduced by the thicknesses of the auxiliary light emitting layers EMLS1, EMLS2, EMLS3, . . . EMLS_n-1, and EMLS_n, so that the thicknesses of the light emitting areas EMR, EMR-a1 to EMR-a5, EMR-b1 to EMR-b3, EMR-c1 to EMR-c4, EMR-d1 to EMR-d3, and EMR-e may be kept constant. Accordingly, the display device DD (see FIG. 1) including the light emitting element ED according to an embodiment may maintain a consistent level of thickness.

The light emitting layer including the phosphorescent dopant may emit light through Dexter Energy Transfer and Inter System Crossing (ISC) using the heavy atom effect of the phosphorescent dopant. For dexter energy transfer, the distance between the host and the dopant must be close, but as the distance increases, degradation due to intermolecular interactions may occur. Due to deterioration, the efficiency and lifetime of the light emitting element may be reduced.

The light emitting element of an embodiment may include light emitting areas EMR, EMR-a1 to EMR-a5, EMR-b1 to EMR-b3, EMR-c1 to EMR-c4, EMR-d1 to EMR-d3, and EMR-e including the first electrode EL1 and the second electrode EL2 facing each other, and a phosphorescent dopant disposed between the first electrode EL1 and the second electrode EL2. The light emitting area EMR, EMR-a1 to EMR-a5, EMR-b1 to EMR-b3, EMR-c1 to EMR-c4, EMR-d1 to EMR-d3, and EMR-e may include at least one auxiliary light emitting layer EMLS-1, EMLS-2, EMLS-3, . . . EMLS_n-1, and EMLS_n, and the auxiliary light emitting layers EMLS-1, EMLS-2, EMLS-3, . . . EMLS_n-1, and EMLS_n may include a thermally activated delayed fluorescence dopant.

The light emitting element of an embodiment may include at least one auxiliary light emitting layer EMLS-1, EMLS-2, EMLS-3, . . . EMLS_n-1, and EMLS_n disposed between the light emitting layers EML1, EML2, EML3, . . . EML_m-1, and EML_m including a phosphorescent dopant. The auxiliary light emitting layers EMLS-1, EMLS-2, EMLS-3, . . . EMLS_n-1, and EMLS_n may include a thermally activated delayed fluorescence dopant to minimize degradation due to interaction between the phosphorescent dopant and the host. Accordingly, the light emitting element according to an embodiment may have characteristics in which deterioration is minimized and efficiency and/or lifespan of the device may be improved.

In the light emitting element ED of an embodiment, the hole transporting host may include any compound selected from Compound Group 1. In the light emitting element ED of an embodiment, the light emitting areas EMR, EMR-a1 to EMR-a5, EMR-b1 to EMR-b3, EMR-c1 to EMR-c4, EMR-d1 to EMR-d3, and EMR-e may include any compound selected from Compound Group 1.

[Compound Group 1]

HT-01

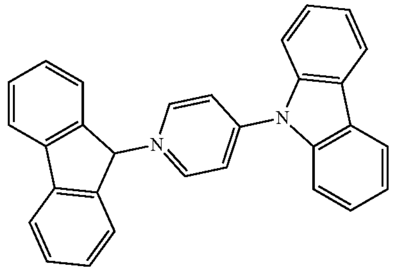

HT-02

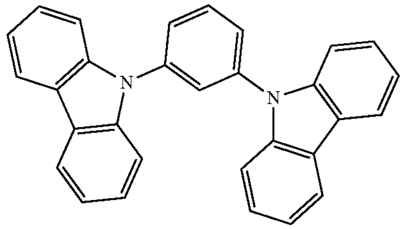

-continued
HT-03
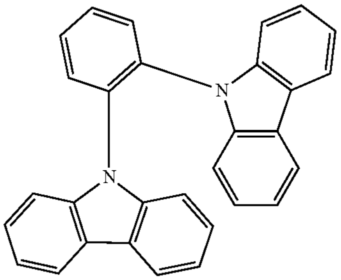
HT-04
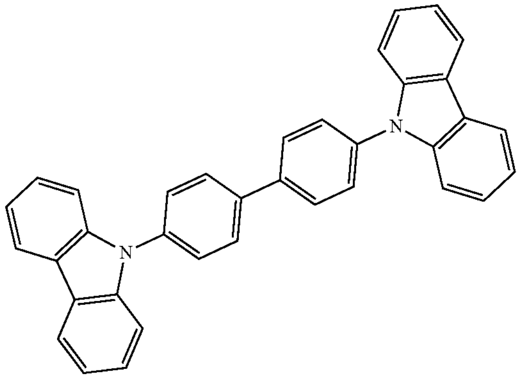
HT-05
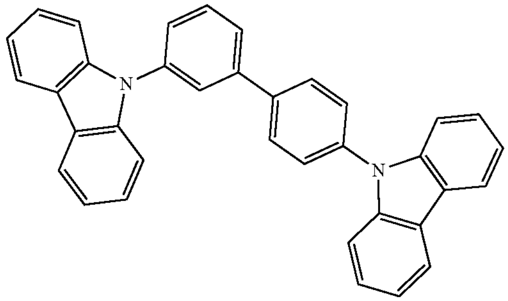
HT-06
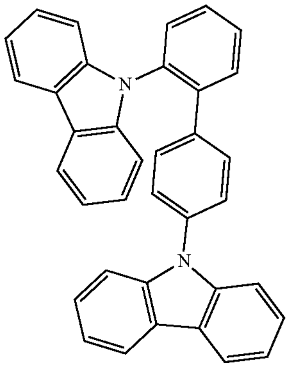
-continued
HT-07
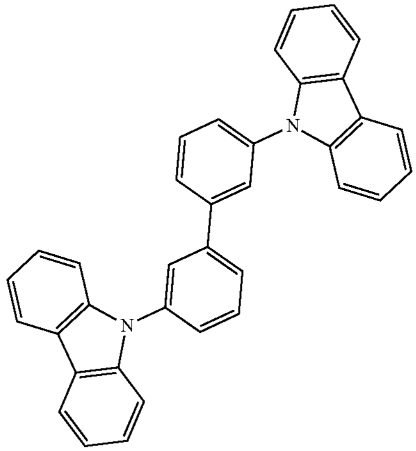
HT-08
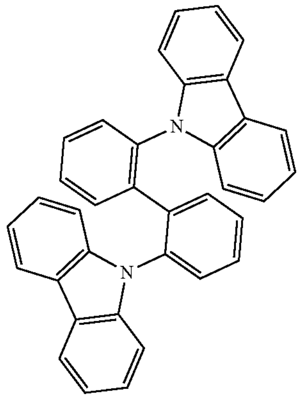
HT-09
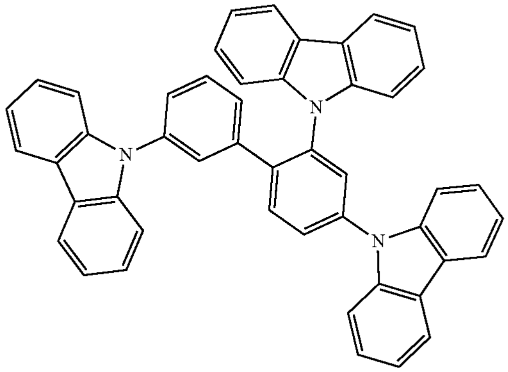

-continued
HT-10
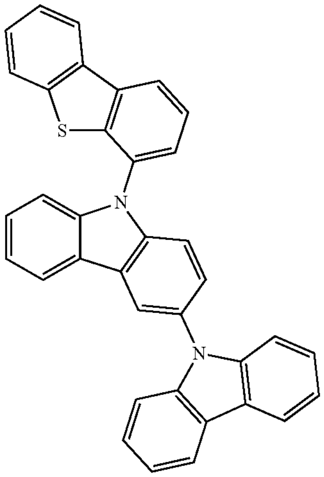
HT-11
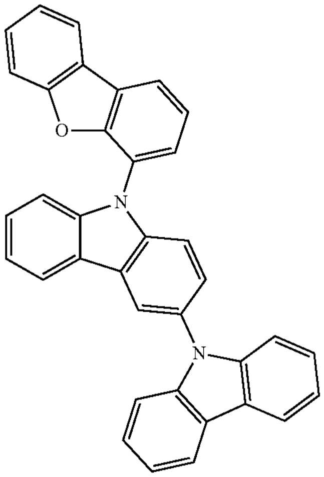
HT-12
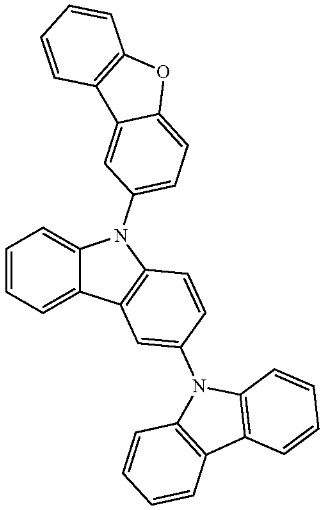
-continued
HT-13
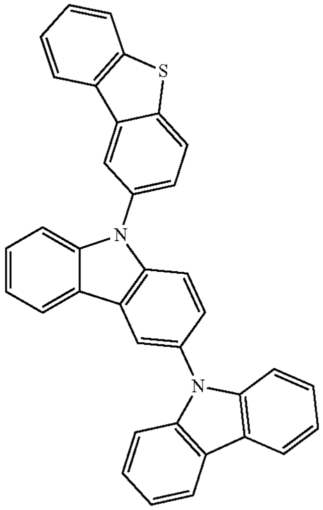
HT-14
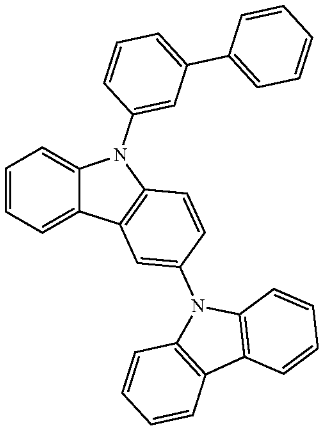
HT-15
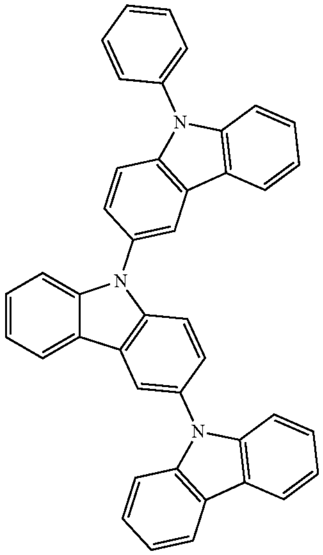

-continued

HT-16

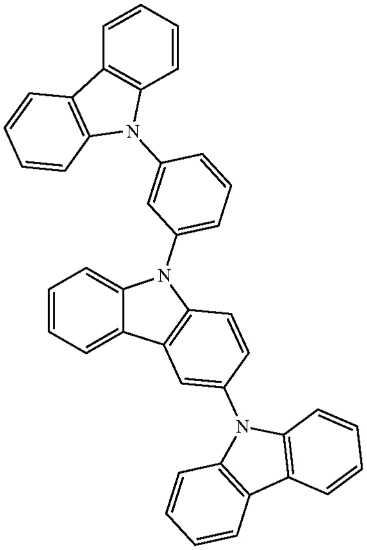

HT-17

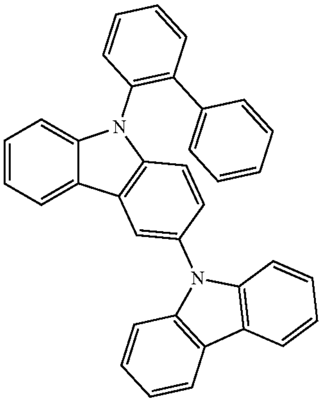

In the light emitting element ED according to an embodiment, the electron transporting host may include any compound selected from Compound Group 2. In the light emitting element ED of an embodiment, the light emitting areas EMR, EMR-a1 to EMR-a5, EMR-b1 to EMR-b3, EMR-c1 to EMR-c4, EMR-d1 to EMR-d3, and EMR-e may include any compound selected from Compound Group 2.

[Compound Group 2]

ET01

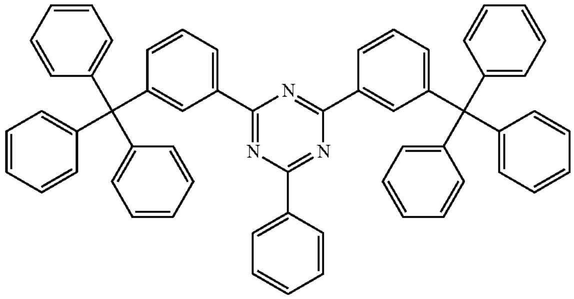

-continued

ET02

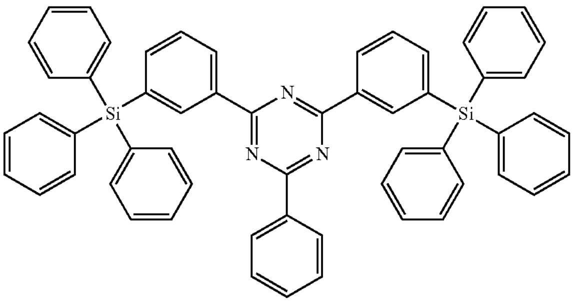

ET03

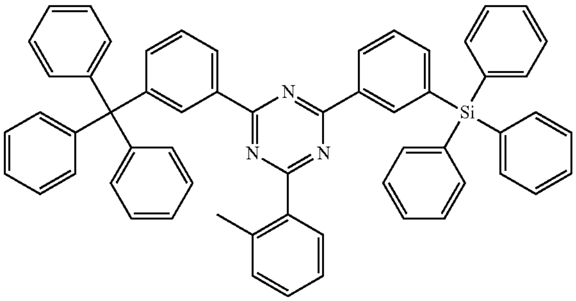

ET04

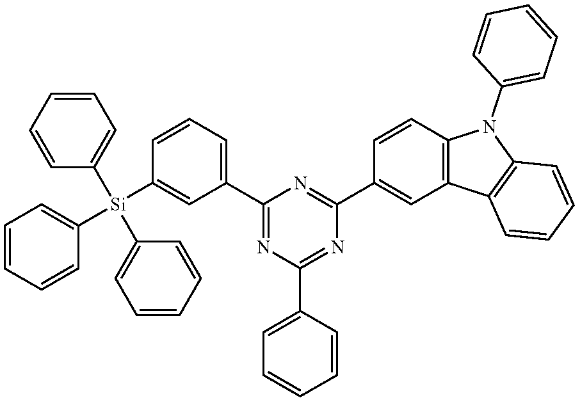

ET05

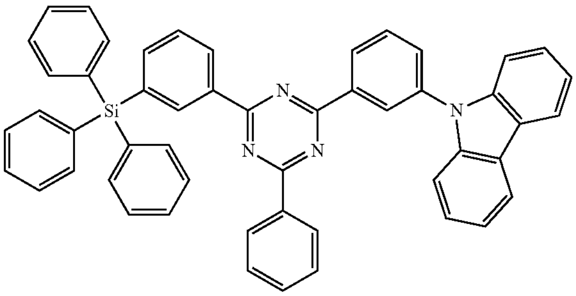

-continued
ET06
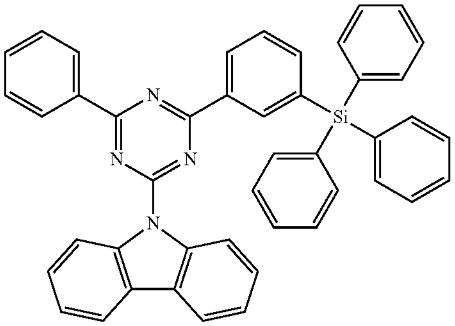
ET07
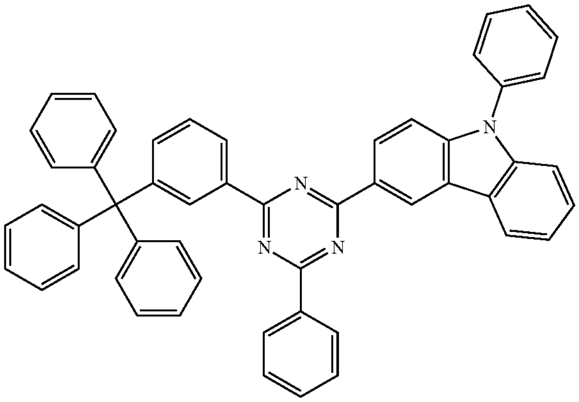
ET08
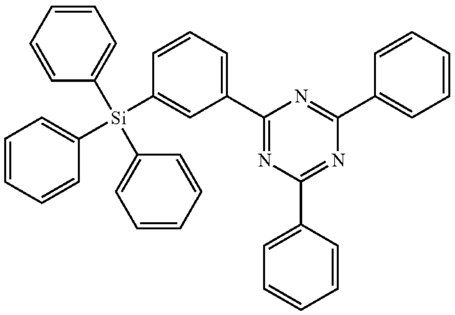
ET09
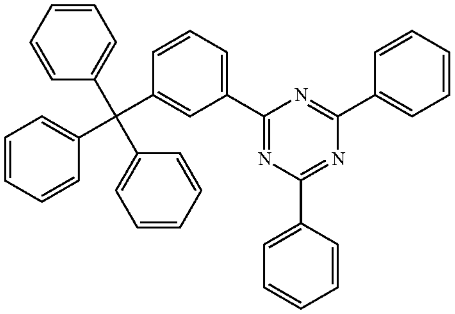
-continued
ET010
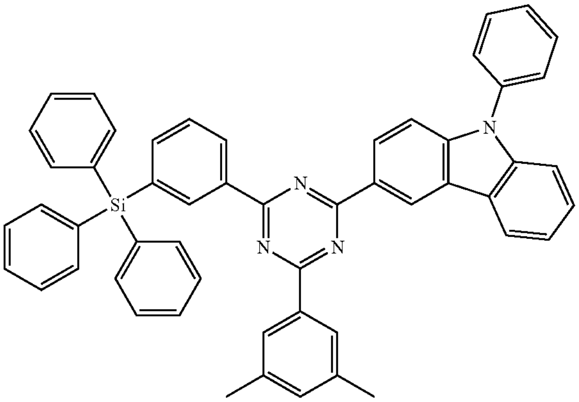
ET011
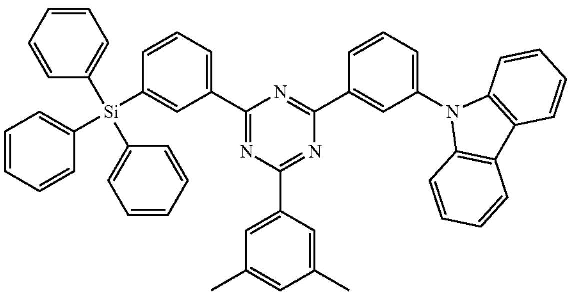
ET012
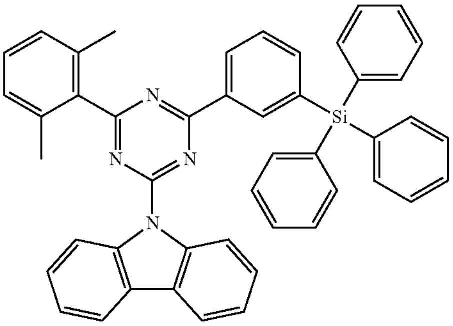
ET013
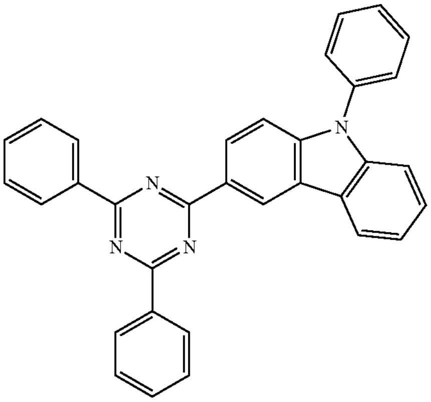

-continued
ET014
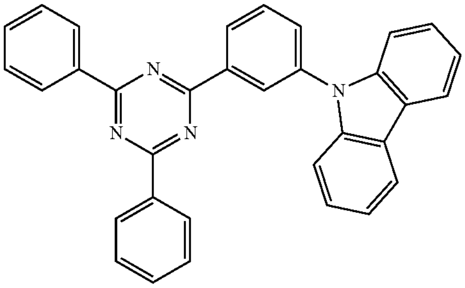
ET015
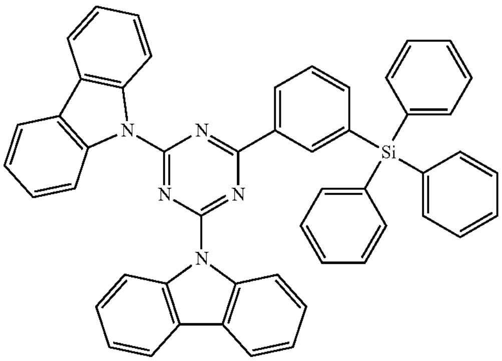
In the light emitting element ED according to an embodiment, the phosphorescent dopant may include any compound selected from Compound Group 3. In the light emitting element ED of an embodiment, the light emitting layers EML1, EML2, EML3, . . . EML_m-1, and EML_m may include any compound selected from Compound Group 3.
[Compound Group 3]
PD-1
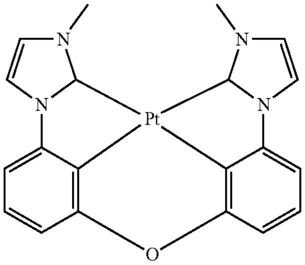
PD-2
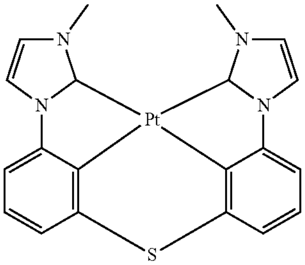
-continued
PD-3
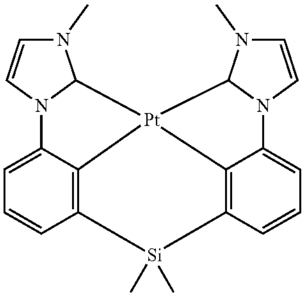
PD-4
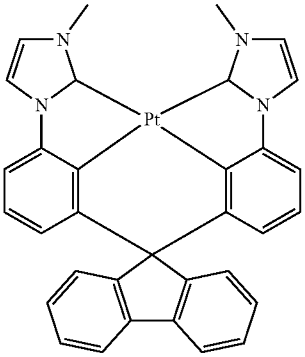
PD-5
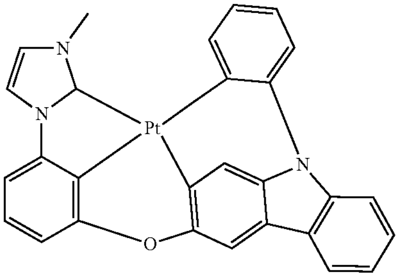
PD-6
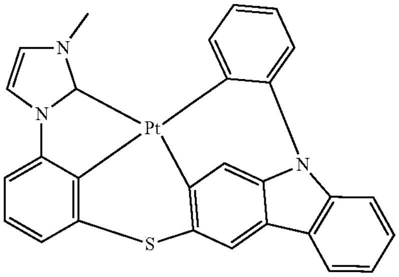
PD-7
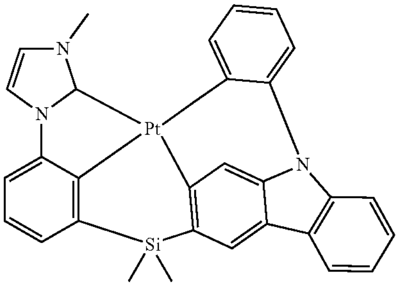

-continued
PD-8
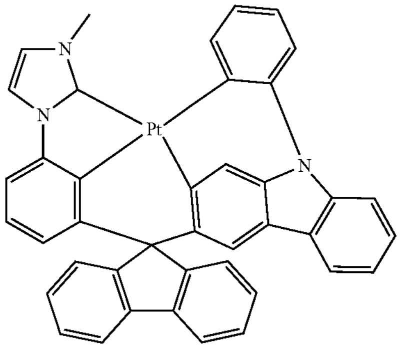
PD-9
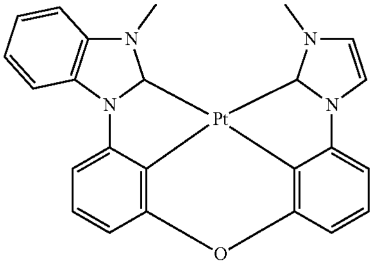
PD-10
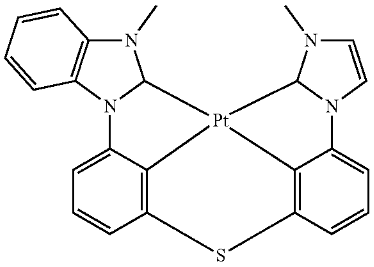
PD-11
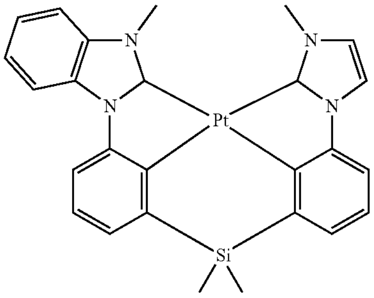
PD-12
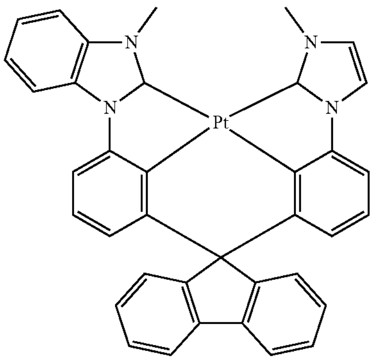
-continued
PD-13
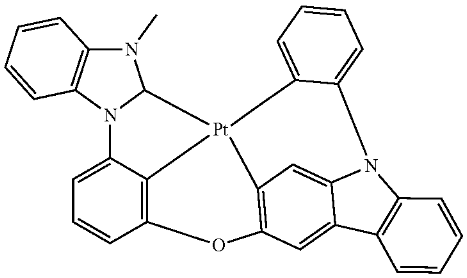
PD-14
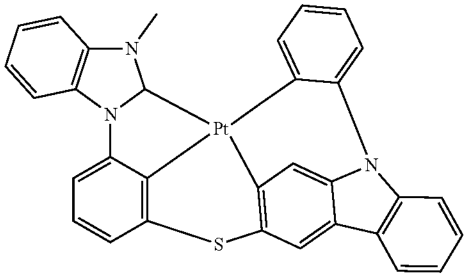
PD-15
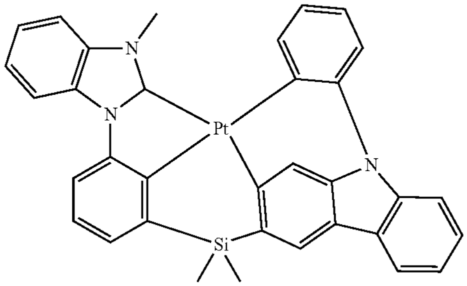
PD-16
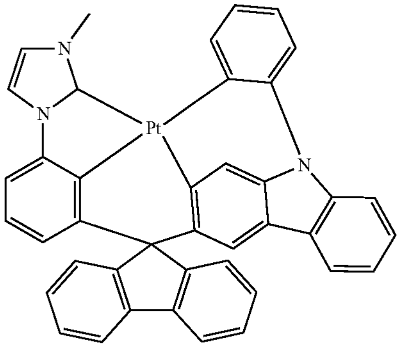
PD-17
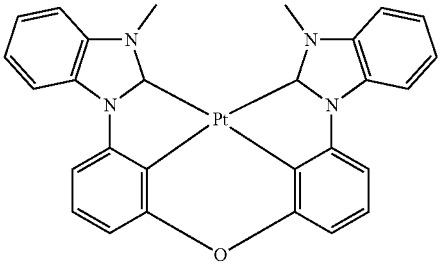

-continued
PD-18
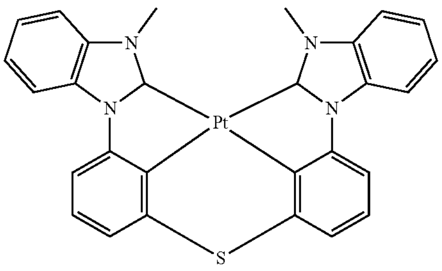
PD-19
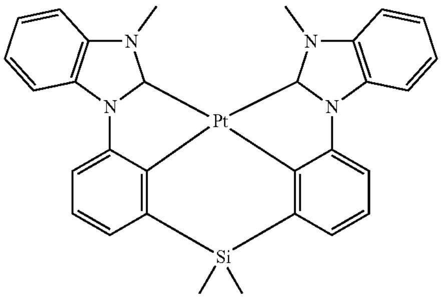
PD-20
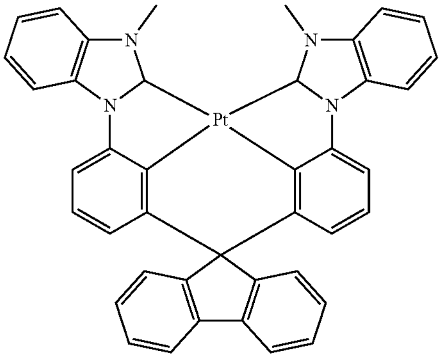
PD-21
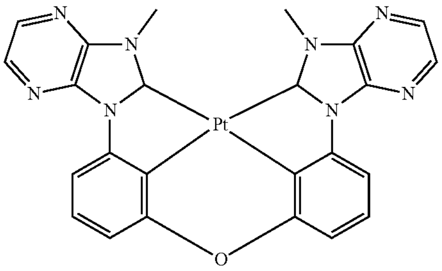
PD-22
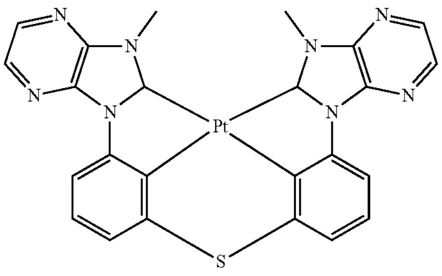
-continued
PD-23
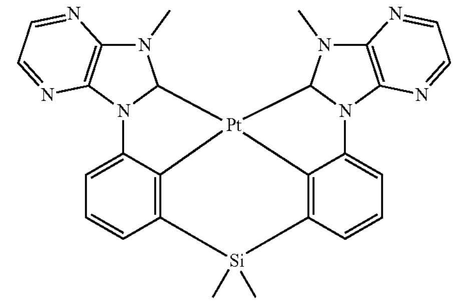
PD-24
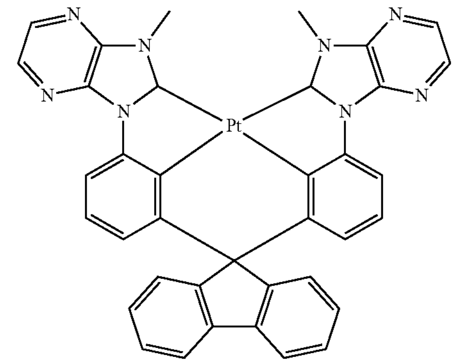
PD-25
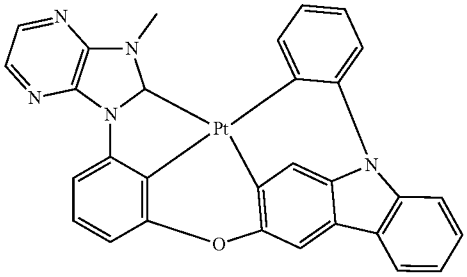
PD-26
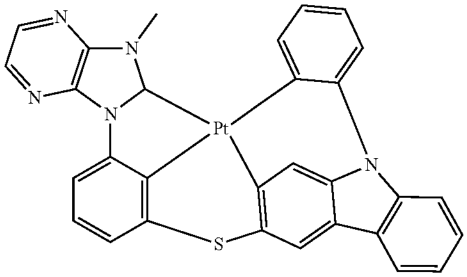
PD-27
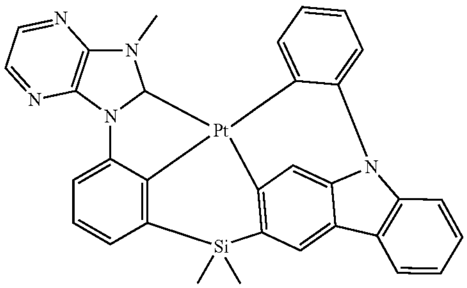

-continued
PD-28
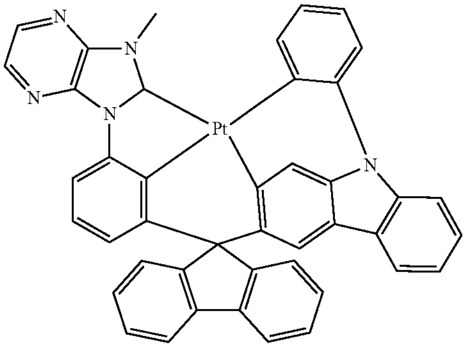
PD-29
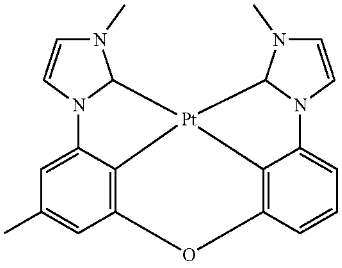
PD-30
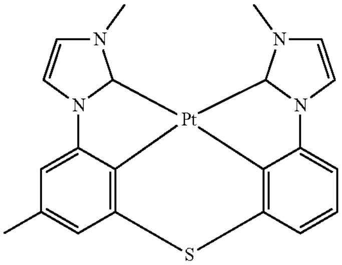
PD-31
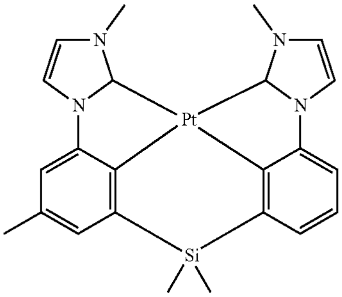
PD-32
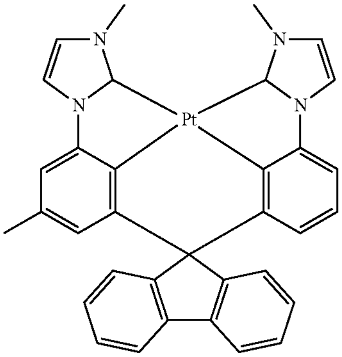
-continued
PD-33
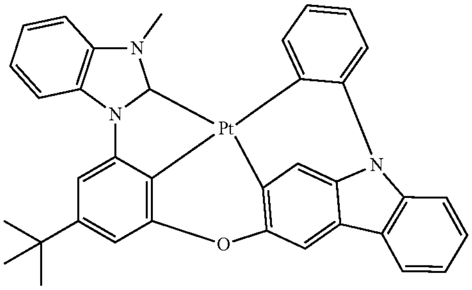
PD-34
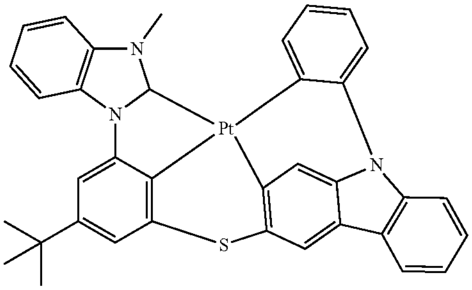
PD-35
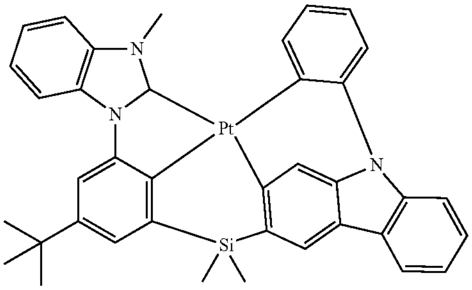
PD-36
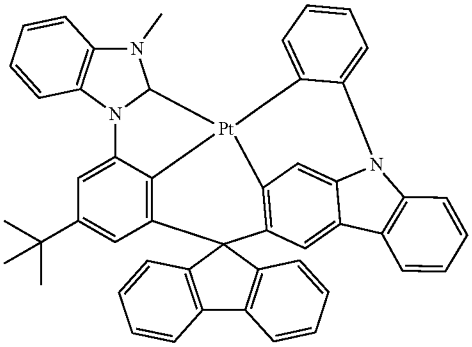
PD-37
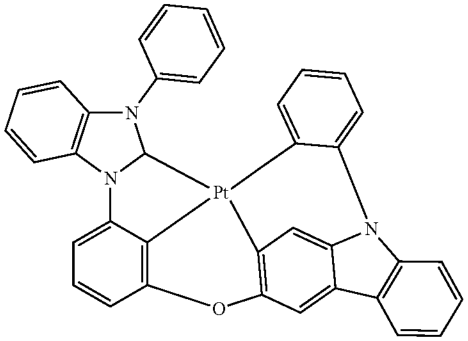

-continued
PD-38
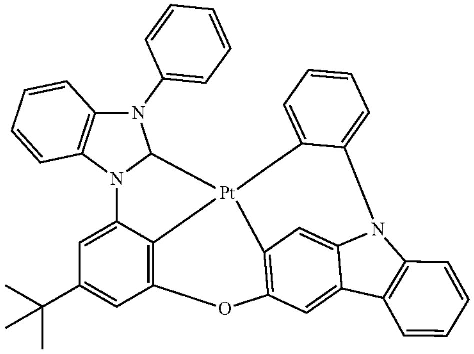
PR-1
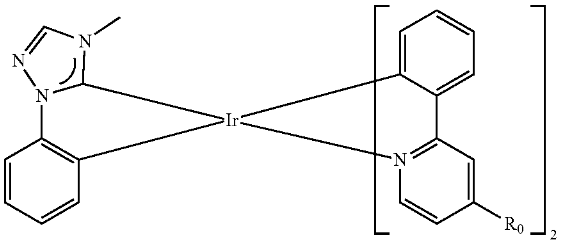
PR-2
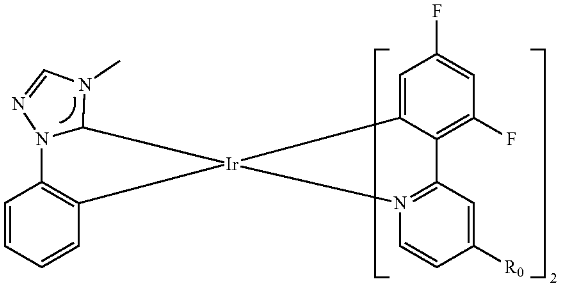
PR-3
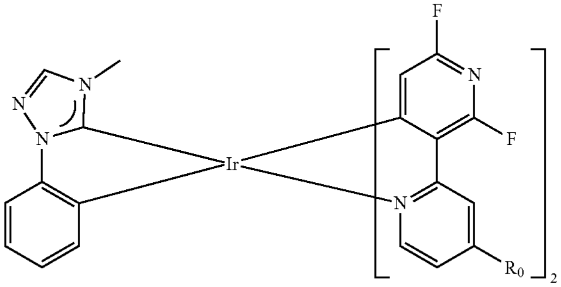
PR-4
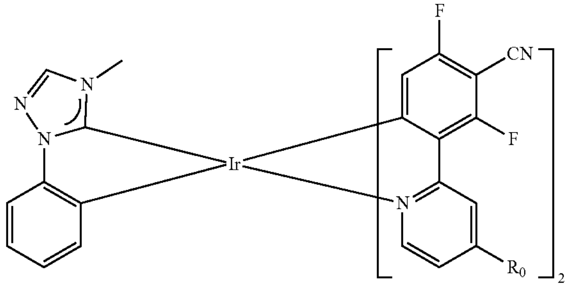
-continued
PR-5
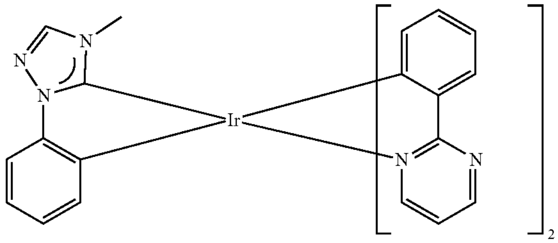
PR-6
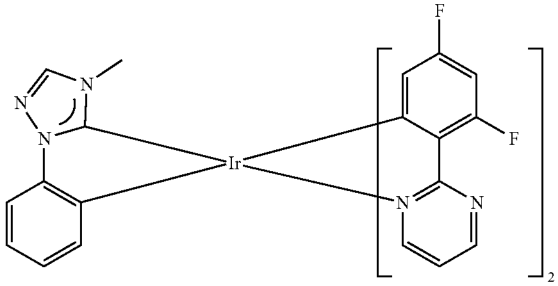
PR-7
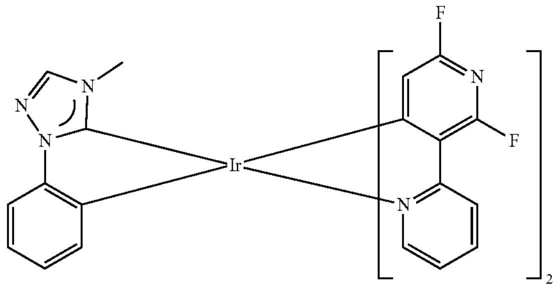
PR-8
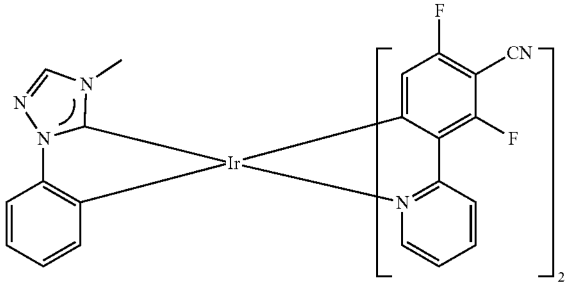
PR-9
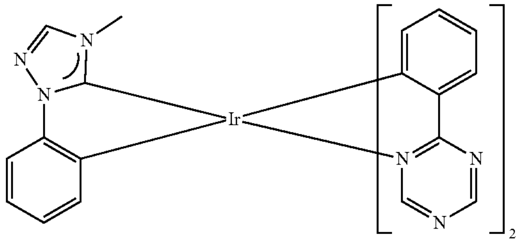

-continued
PR-10
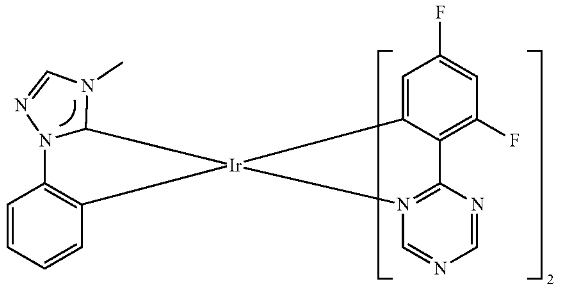
PR-11
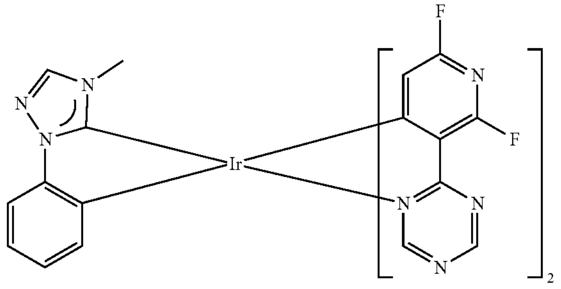
PR-12
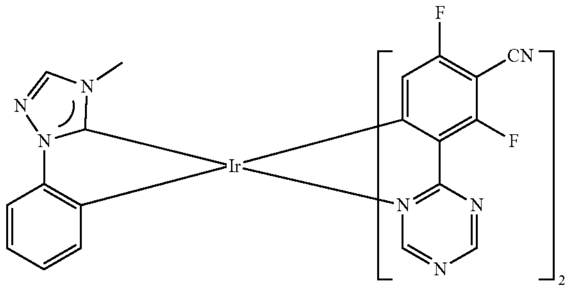
PR-13
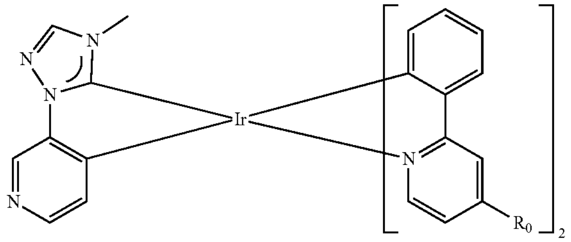
PR-14
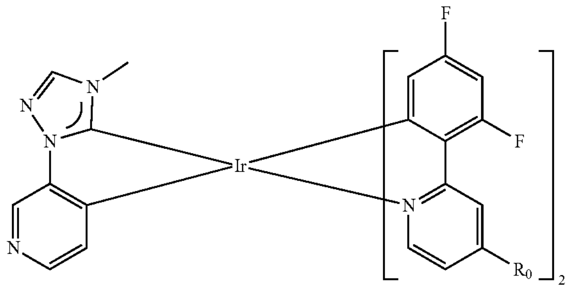
-continued
PR-15
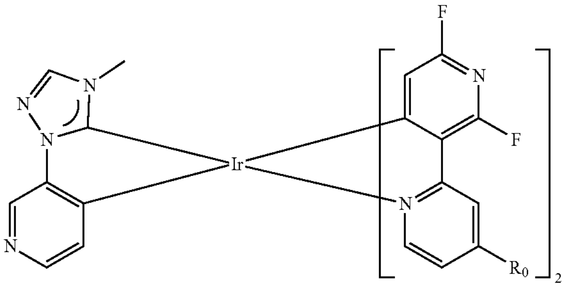
PR-16
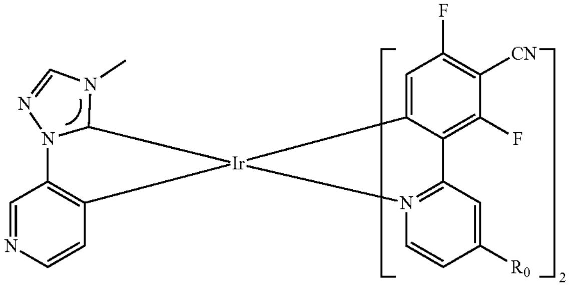
PR-17
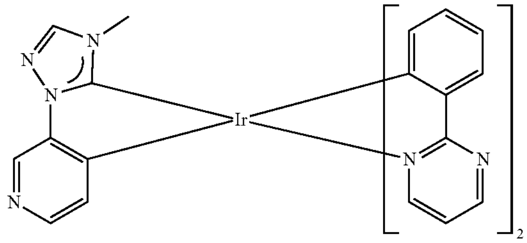
PR-18
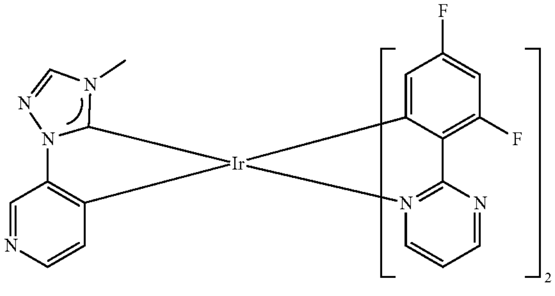
PR-19
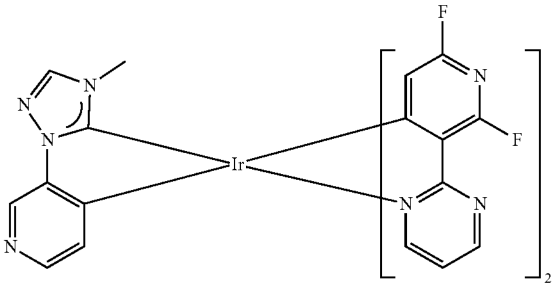

-continued
PR-20
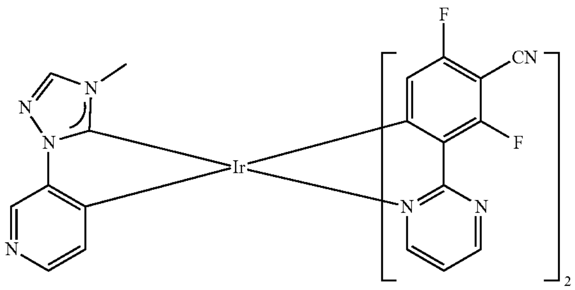
PR-21
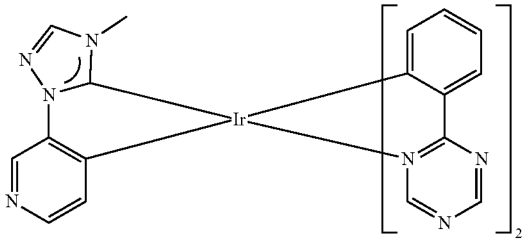
PR-22
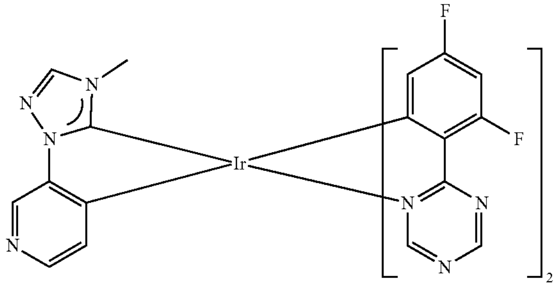
PR-23
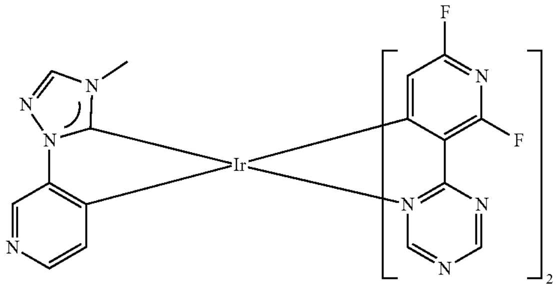
PR-24
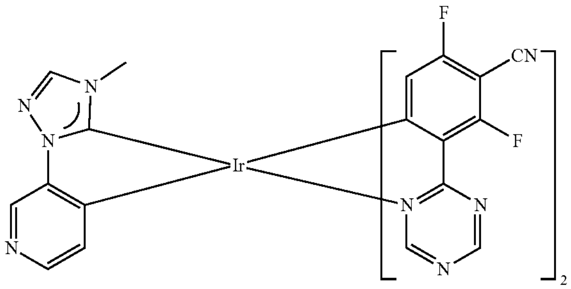
-continued
PR-25
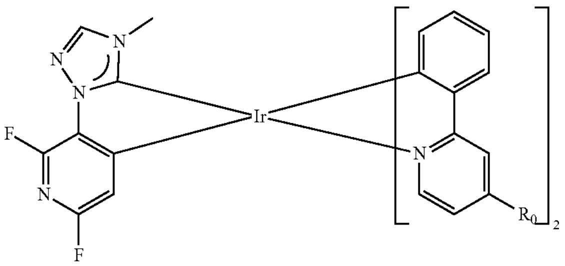
PR-26
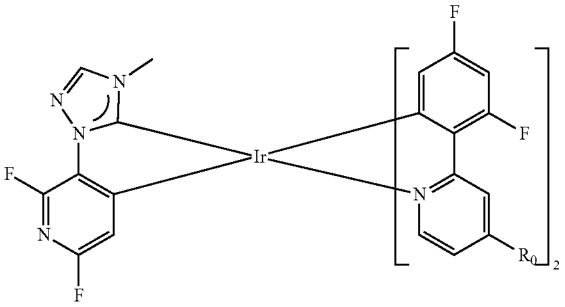
PR-27
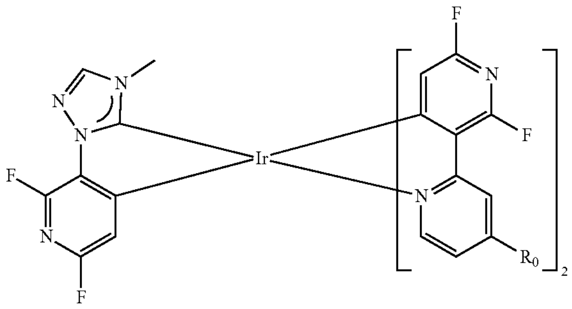
PR-28
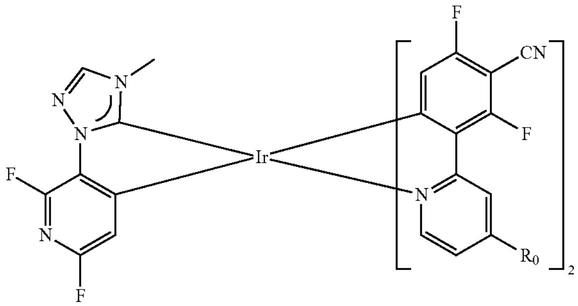
PR-29
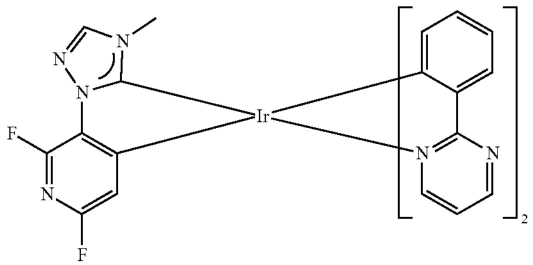

-continued

PR-30

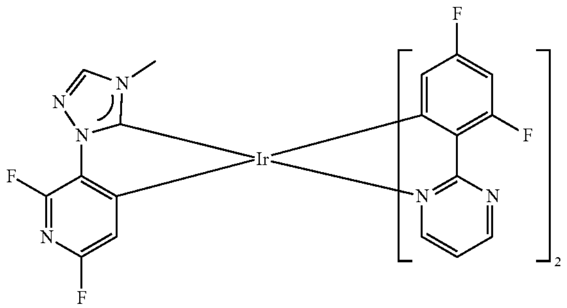

PR-31

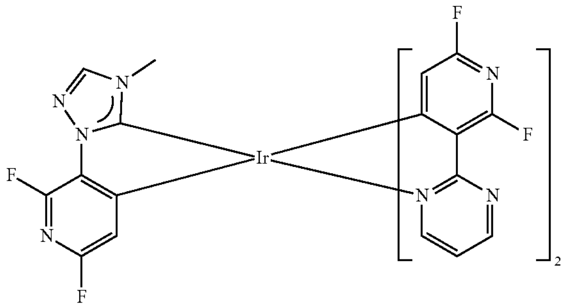

PR-32

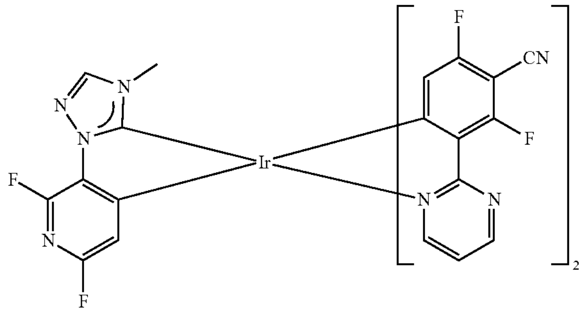

PR-33

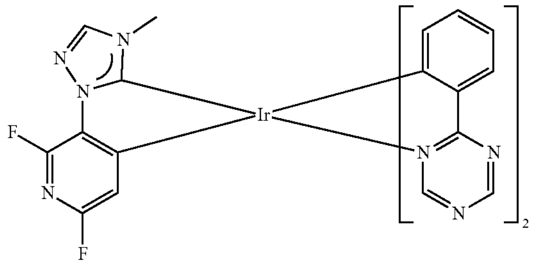

PR-34

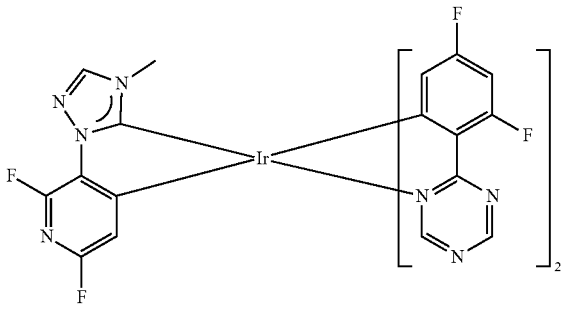

-continued

PR-35

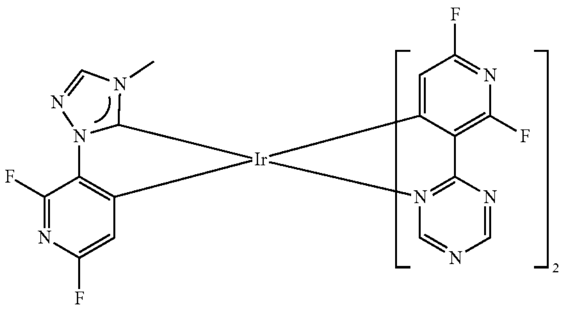

PR-36

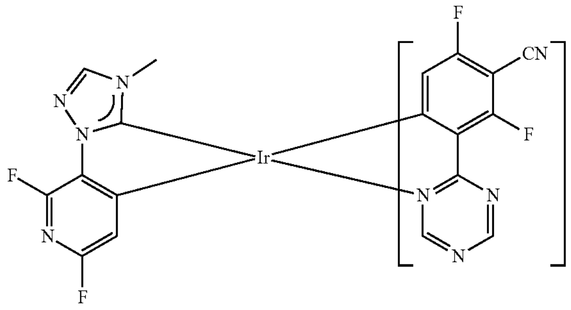

In Compound Group 3, $R_0$ may be a hydrogen atom, a methyl group, an isopropyl group, a t-butyl group, or a dimethylamine group.

In the light emitting element ED of an embodiment, the thermally activated delayed fluorescence dopant may include any compound selected from Compound Group 4. In the light emitting element ED of an embodiment, the auxiliary light emitting layers EMLS-1, EMLS-2, EMLS-3, . . . EMLS_n-1, and EMLS_n may include any compound selected from Compound Group 4.

[Compound Group 4]

D-01

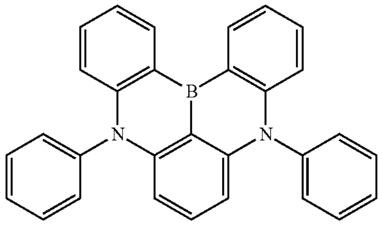

D-02

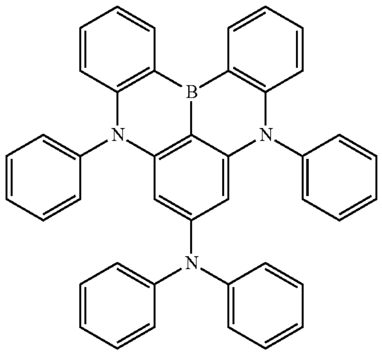

-continued
D-03
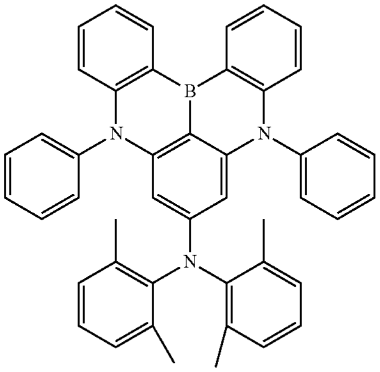
D-04
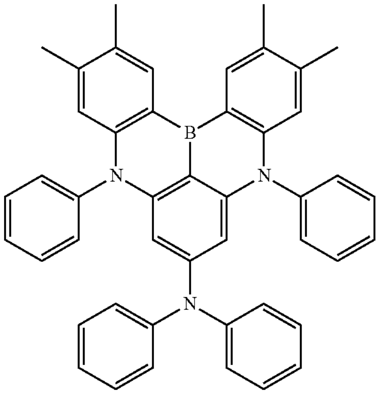
D-05
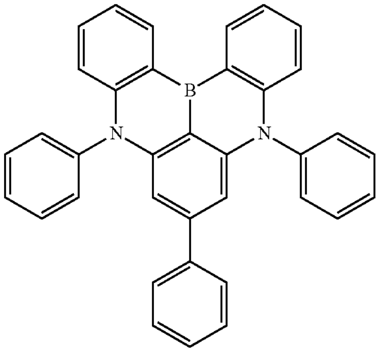
D-06
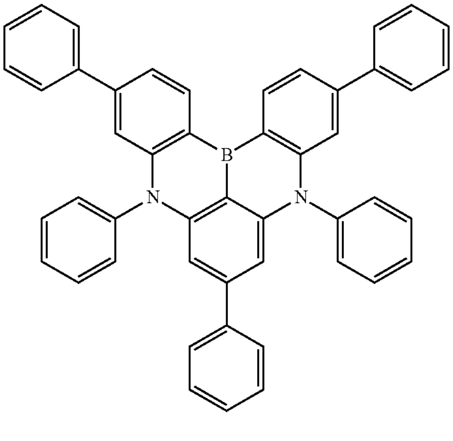
-continued
D-07
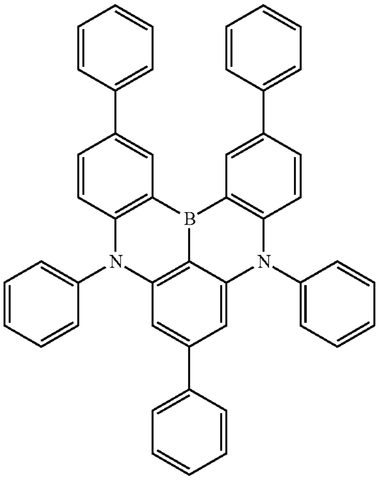
D-08
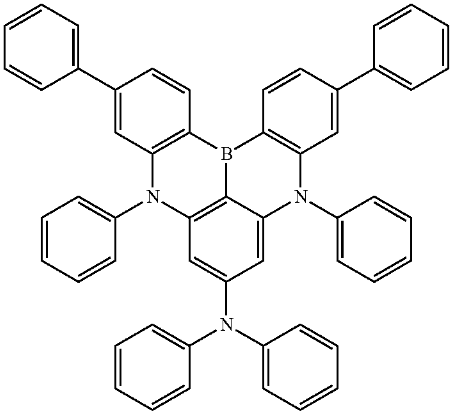
D-09
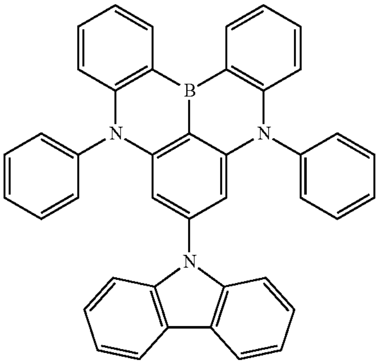

-continued
D-10
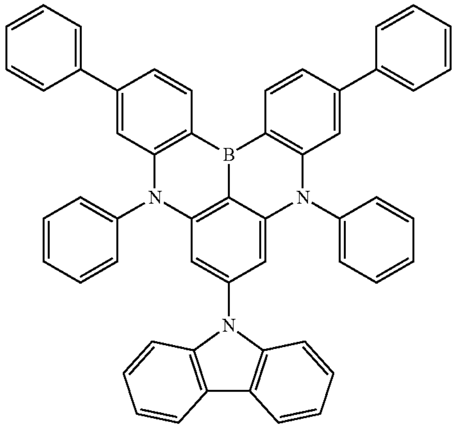
D-11
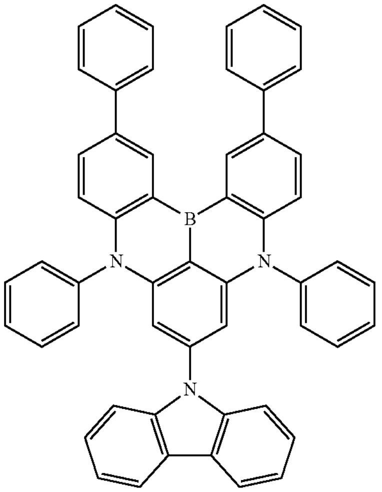
D-12
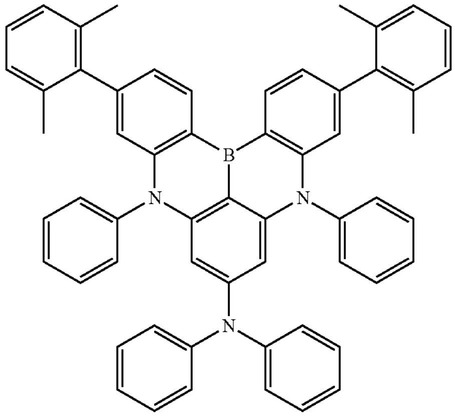
-continued
D-13
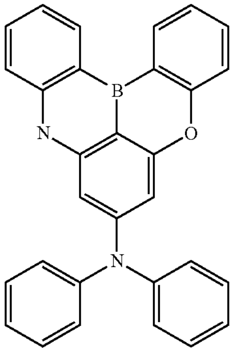
D-14
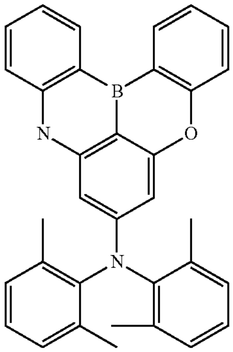
D-15
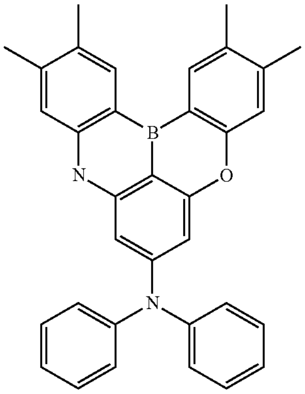
D-16
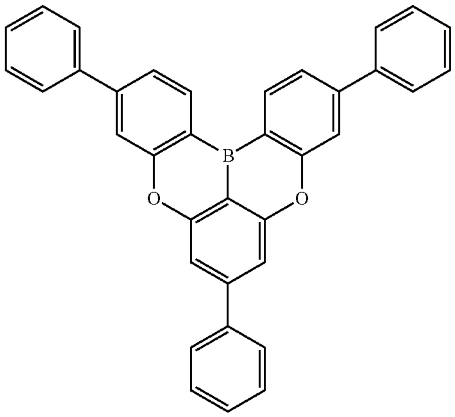

-continued
D-17
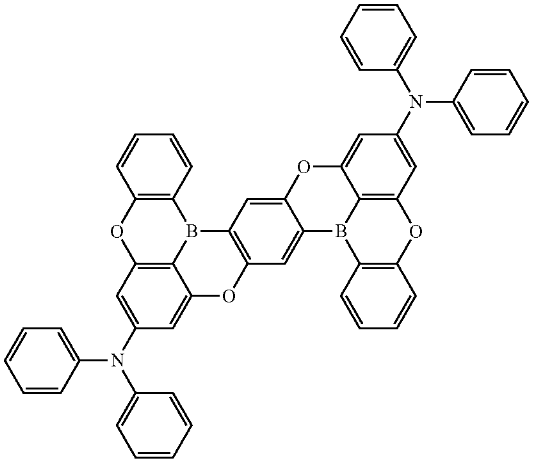
D-18
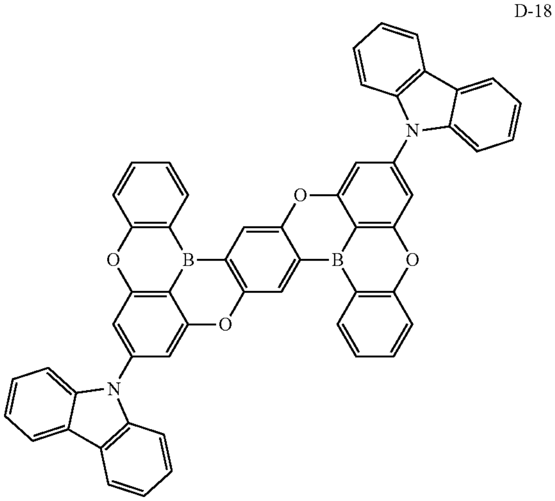
D-19
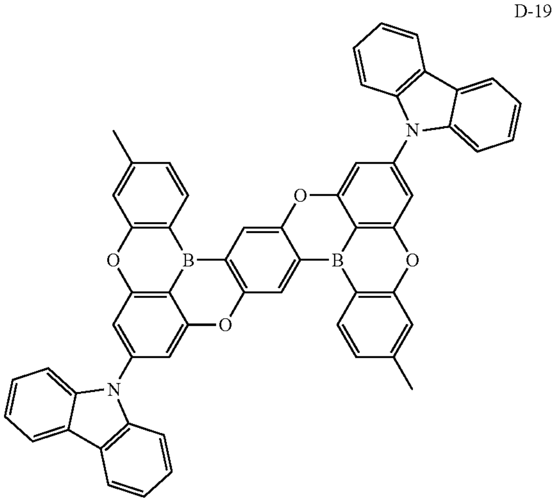
-continued
D-20
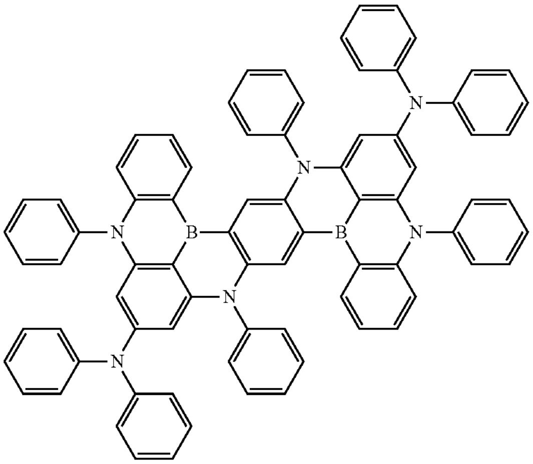
D-21
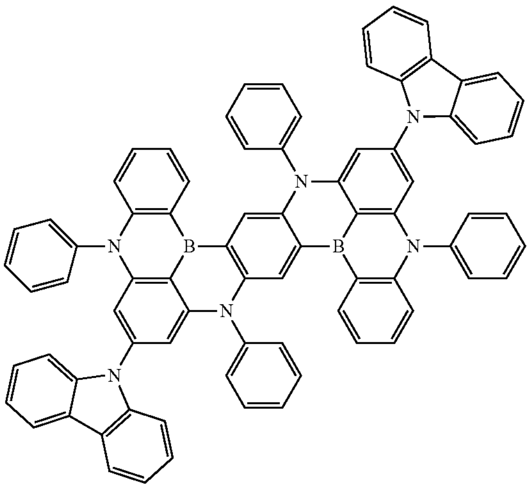
D-22
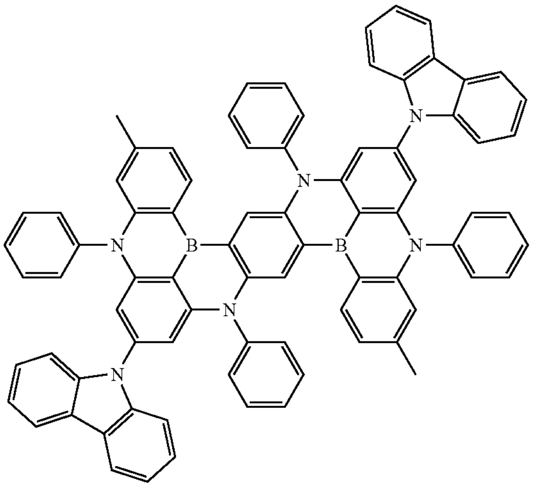

-continued
DA-01
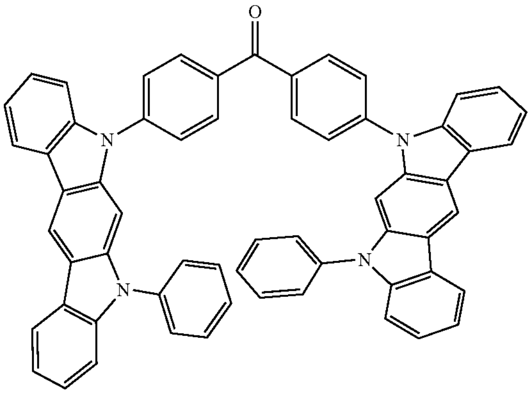
DA-02
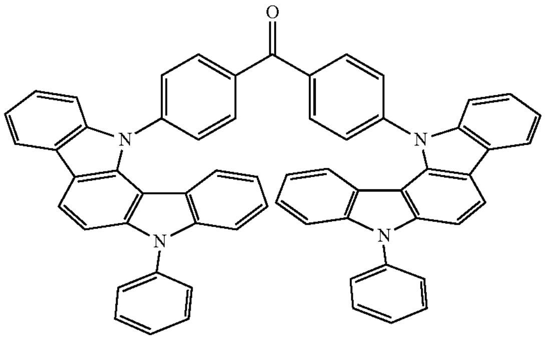
DA-03
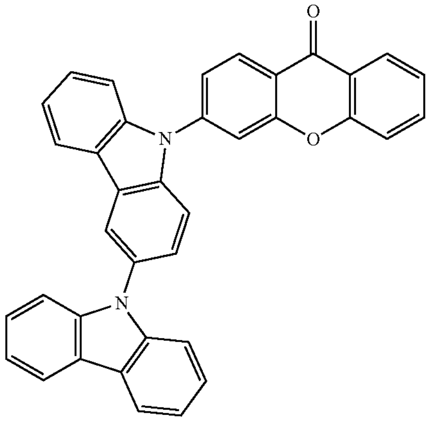
DA-04
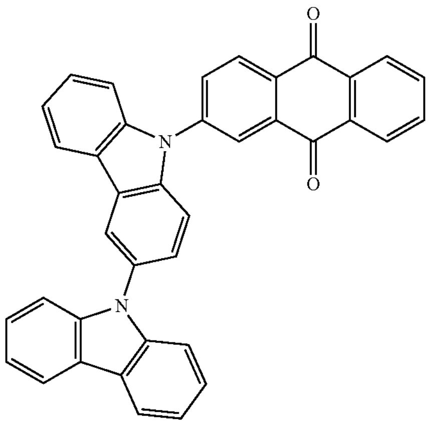
-continued
DA-05
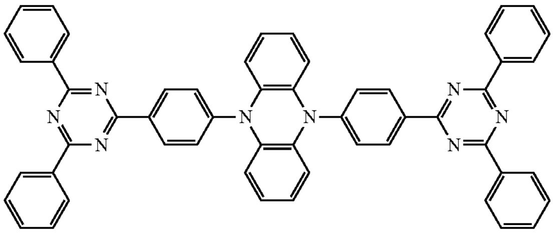
DA-06
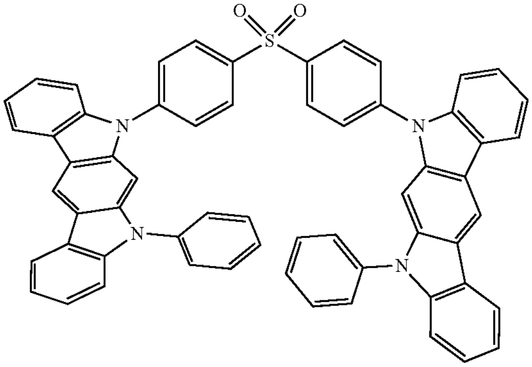
DA-07
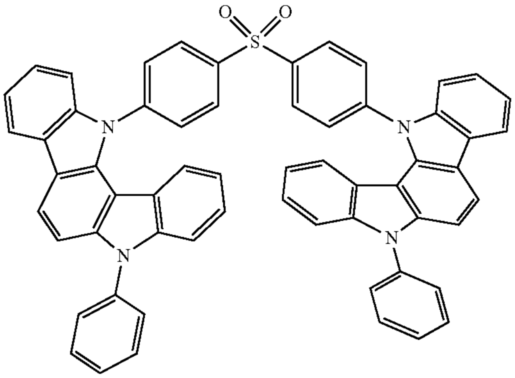
DA-08
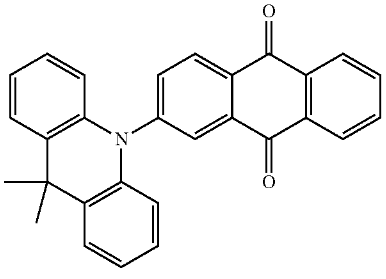
DA-09
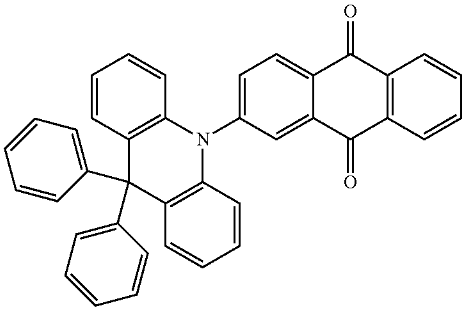

-continued
DA-10
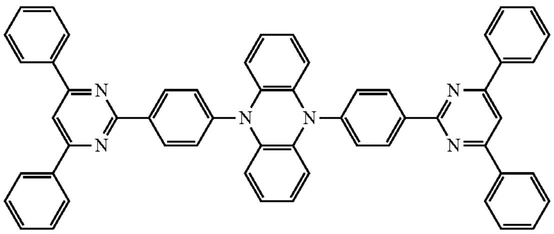
DA-11
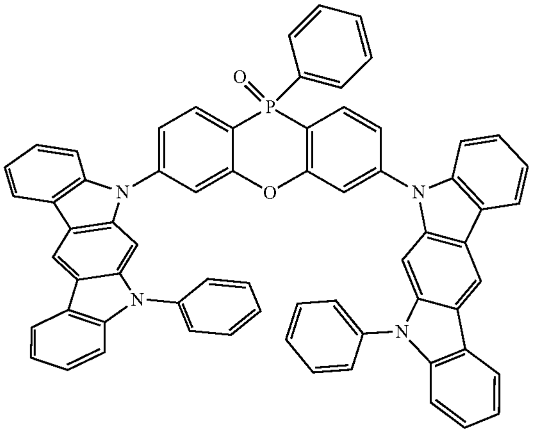
DA-12
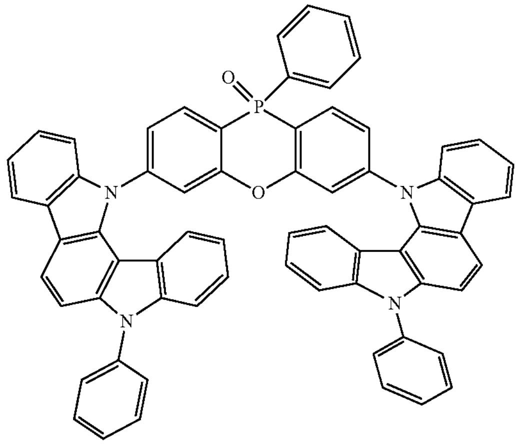
DA-13
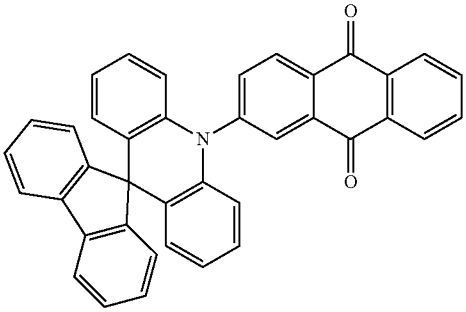
-continued
DA-14
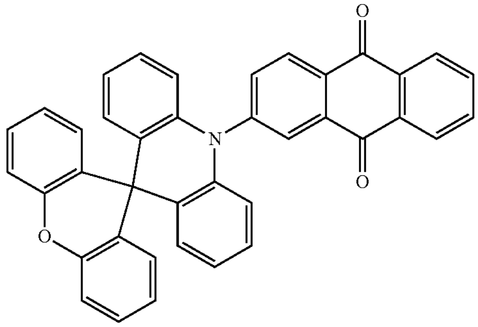
DA-15
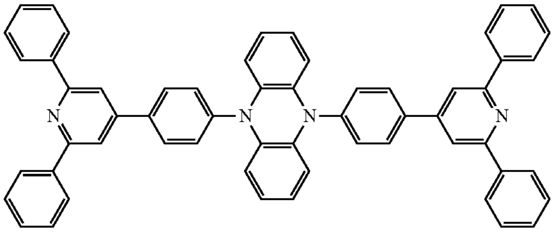
DA-16
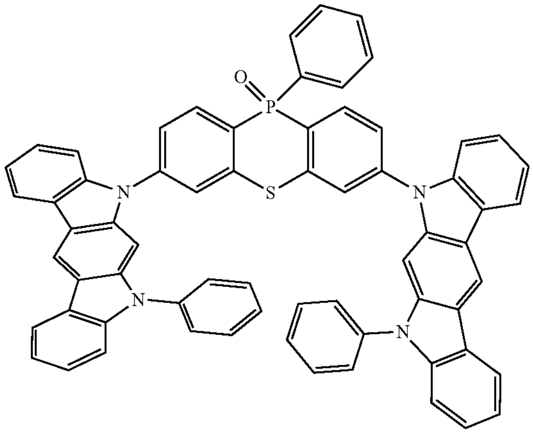
DA-17
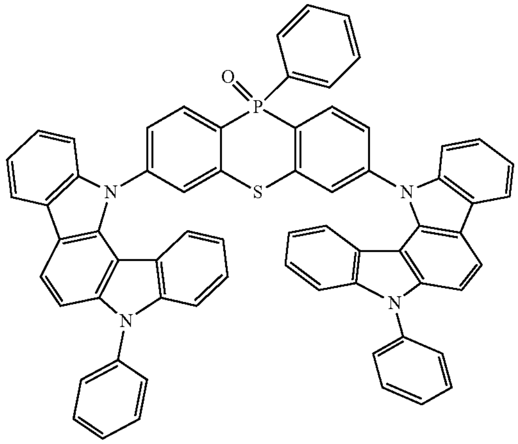

-continued
DA-18
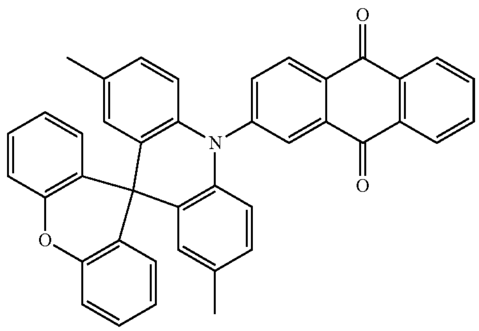
DA-19
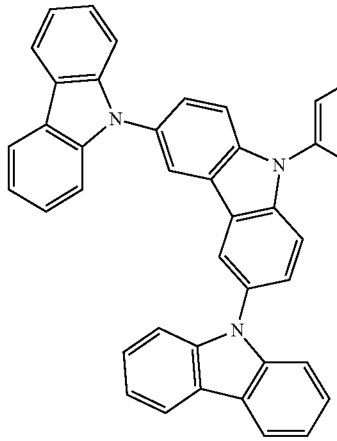
DA-20
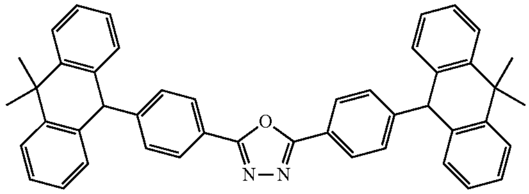
DA-21
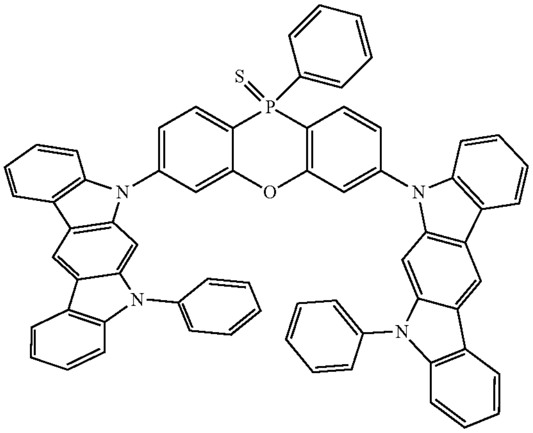
-continued
DA-22
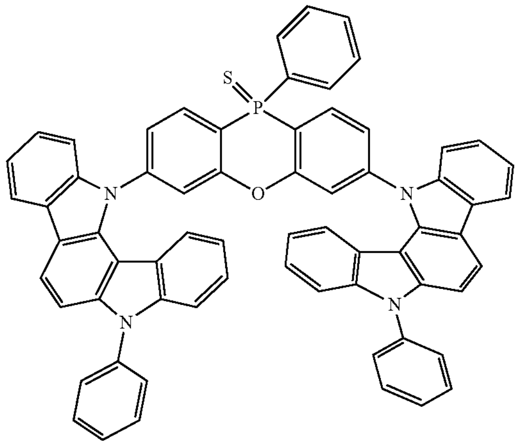
DA-23
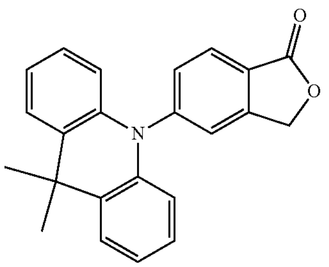
DA-24
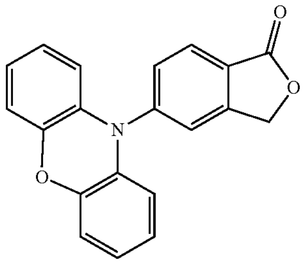
DA-25
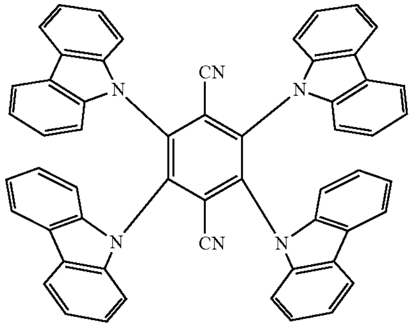
DA-26
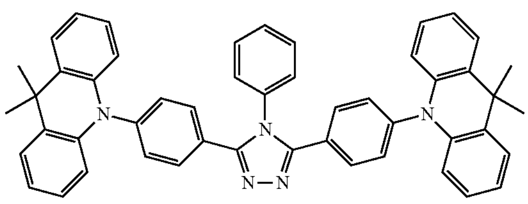

-continued

DA-27

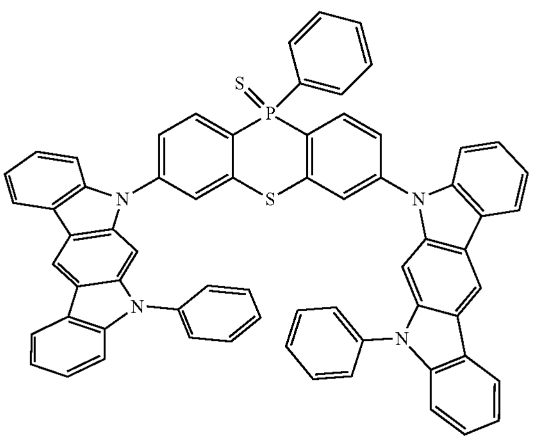

DA-28

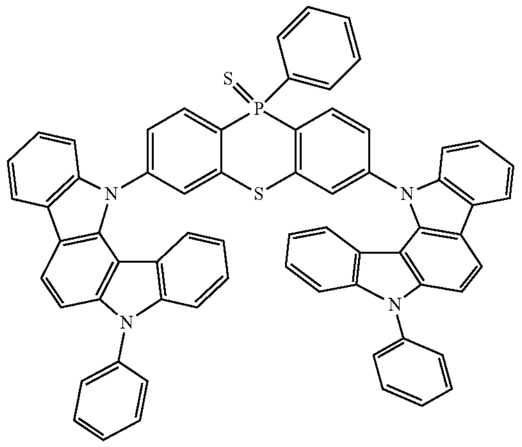

DA-29

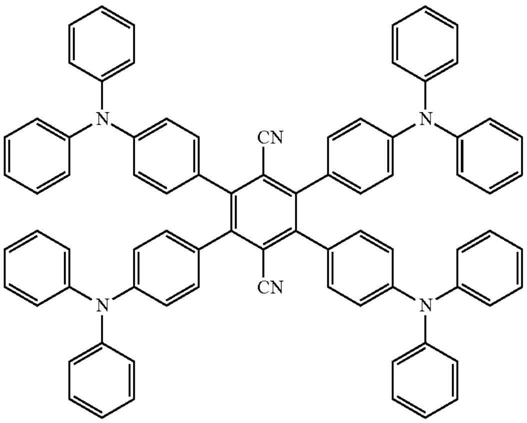

-continued

DA-30

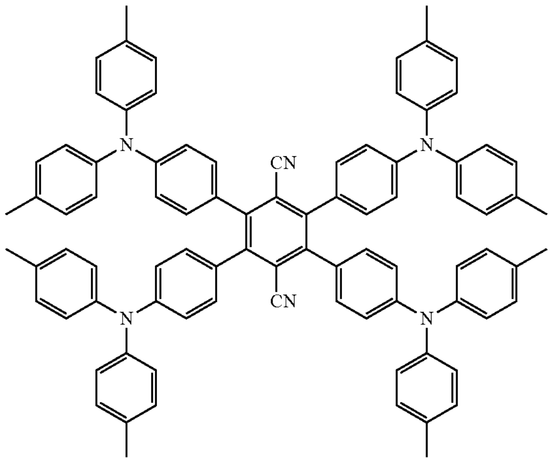

In Compound Group 4, D-01 to D-22 may be donor-acceptor type (DA-type) thermally activated delayed fluorescence dopants. In Compound Group 4, DA-01 to DA-30 may be multiple resonance type (MR-type) thermally activated delayed fluorescence dopants.

Referring to FIGS. 3 to 6, the first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide, for example, indium tin oxide (ITO), indium zinc oxide (IZO), zinc oxide (ZnO), or indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multi-layer structure including a reflective or transflective film formed of the above material, and a transparent conductive film formed of indium tin oxide (ITO), indium zinc oxide (IZO), zinc oxide (ZnO), and indium tin zinc oxide (ITZO). For example, the first electrode EL1 may have a three-layer structure of ITO/Ag/ITO. However, embodiments are not limited thereto, and the first electrode EL1 may include the above-described metal material, a combination of two or more metal materials selected from among the above-described metal materials, or an oxide of the above-described metal materials. A thickness of the first electrode EL1 may be in a range of about 700 Å to about 10,000 Å. For example, a thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission auxiliary layer (not shown), and an electron blocking layer EBL. A thickness of the hole transport region HTR may be, for example, in a range of about 50 Å to about 15,000 Å.

The hole transport region HTR may be a layer made of a single material, a layer made of different materials, or a multilayer structure including layers made of different materials.

For example, the hole transport region HTR may have a single-layer structure of a hole injection layer HIL or a hole transport layer HTL, or may have a single-layer structure made of a hole injection material and a hole transport material. For example, the hole transport region HTR may have a single layer structure made of different materials, or may have a structure of a hole injection layer HIL/hole transport layer HTL, a hole injection layer HIL/hole transport layer HTL/buffer layer (not shown), a hole injection layer HIL/buffer layer (not shown), a hole transport layer HTL/buffer layer (not shown), or a hole injection layer HIL/hole transport layer HTL/electron blocking layer EBL, which are stacked in its respective stated order from the first electrode EL1, but embodiments are not limited thereto.

A hole transport region HTR may be formed using various methods such as vacuum deposition, spin coating, casting, Langmuir-Blodgett (LB), inkjet printing, laser printing, and laser induced thermal imaging (LITI).

In the specification, the term "substituted or unsubstituted" as used herein may mean a group that is unsubstituted or substituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the specification, the term "combined with an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each independently be monocyclic or polycyclic. A ring formed by adjacent group being combined may itself be connected to another ring to form a spiro structure.

In the specification, the term "adjacent group" may mean a substituent substituted on an atom directly connected to the atom in which the substituent is substituted, another substituent substituted for the atom in which the substituent is substituted, or a substituent sterically closest to the corresponding substituent. For example, two methyl groups may be interpreted as "adjacent groups" to each other in 1,2-dimethylbenzene, and two ethyl groups may be interpreted as "adjacent groups" to each other In 1,1-diethylcyclopentane (1,1-diethylcyclopentane). For example, two methyl groups in 4,5-dimethylphenanthrene may be interpreted as "adjacent groups" to each other.

In the specification, examples of a halogen atom may include a fluorine atom, a chlorine atom, a bromine atom, or an iodine atom.

In the specification, an alkyl group may be a straight chain, a branched chain, or a ring type. The number of carbon atoms in an alkyl group may be 1 or more and 50 or less, 1 or more and 30 or less, 1 or more and 20 or less, 1 or more and 10 or less, or 1 or more and 6 or less. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, and the like, but embodiments are not limited thereto.

In the specification, an alkenyl group may be a hydrocarbon group including one or more carbon double bonds in the middle or terminal of an alkyl group having 2 or more carbon atoms. The alkenyl group may be a straight chain or a branched chain. The number of carbon atoms in the alkenyl group is not particularly limited, but may be 2 or more and 30 or less, 2 or more and 20 or less, or 2 or more and 10 or less.

In the specification, an alkynyl group may be a hydrocarbon group including one or more carbon triple bonds in the middle or terminal of an alkyl group having 2 or more carbon atoms. The alkenyl group may be a straight chain or a branched chain. The number of carbon atoms in the alkynyl group is not particularly limited, but may be 2 or more and 30 or less, 2 or more and 20 or less, or 2 or more and 10 or less.

In the specification, a hydrocarbon ring group may be any functional group or substituent derived from an aliphatic hydrocarbon ring. The hydrocarbon ring group may be a saturated hydrocarbon ring group having a number of ring-forming carbon atoms of 5 or more and 20 or less.

In the specification, an aryl group may be any functional group or substituent derived from an aromatic hydrocarbon ring. The aryl group may be a monocyclic aryl group or a polycyclic aryl group. The number of ring-forming carbon atoms of the aryl group may be 6 or more and 30 or less, 6 or more and 20 or less, or 6 or more and 15 or less. Examples of the aryl group may include a phenyl group, a naphthyl group, a fluorenyl group, an anthracenyl group, a phenanthryl group, a biphenyl group, a terphenyl group, a quarterphenyl group, a quinquephenyl group, a sexyphenyl group, a triphenylenyl group, a pyrenyl group, a benzofluoranthenyl group, a chrysenyl group, and the like, but embodiments are not limited thereto.

In the specification, a heterocycle may include one or more of B, O, N, P, Si, or S as a heteroatom. When the heterocycle includes two or more heteroatoms, the two or more heteroatoms may be the same as or different from each other. The heterocycle may be monocyclic or polycyclic, and the heterocycle may be a heteroaryl group. The number of ring-forming carbon atoms of the heterocycle may be 2 or more and 30 or less, 2 or more and 20 or less, or 2 or more and 10 or less.

In the specification, a heteroaryl group may include one or more of B, O, N, P, Si, or S as a heteroatom. When the heteroaryl group includes two or more heteroatoms, the two or more heteroatoms may be the same as or different from each other. The heteroaryl group may be monocyclic or polycyclic. The number of ring-forming carbon atoms of the heteroaryl group may be 2 or more and 30 or less, 2 or more and 20 or less, or 2 or more and 10 or less. Examples of heteroaryl groups may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, quinazoline group, quinoxaline group, phenoxazine group, phthalazine group, pyrido pyrimidine group, pyrido pyrazine group, pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, and a dibenzofuran group, but embodiments are not limited thereto.

In the specification, the above description of the aryl group may be applied to an arylene group, except that the arylene group is a divalent group. The above description of the heteroaryl group may be applied to a heteroarylene group, except that the heteroarylene group is a divalent group.

In the specification, a direct linkage may be a single bond.

In the specification,

 and each represents a binding site to a neighboring atom.

The hole transport region HTR may include a compound represented by Formula H-1.

[Formula H-1]

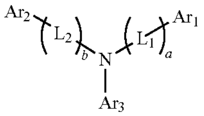

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is 2 or more, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

In an embodiment, the compound represented by Formula H-1 may be a monoamine compound. In another embodiment, the compound represented by Formula H-1 may be a diamine compound in which at least one of $Ar_1$ to $Ar_3$ includes an amine group as a substituent. In still another embodiment, the compound represented by Formula H-1 may be a carbazole-based compound including a substituted or unsubstituted carbazole group in at least one of $Ar_1$ and $Ar_2$, or a fluorene-based compound including a substituted or unsubstituted fluorene group in at least one of $Ar_1$ and $Ar_2$.

The compound represented by Formula H-1 may be any one selected from Compound Group H. However, the compounds listed in Compound Group H are only examples, and the compound represented by Formula H-1 is not limited to Compound Group H.

[Compound Group H]

H-1-1

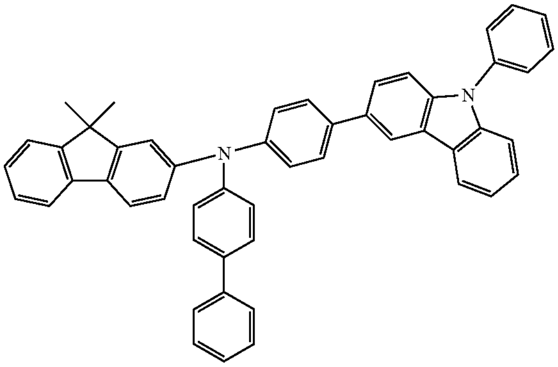

H-1-2

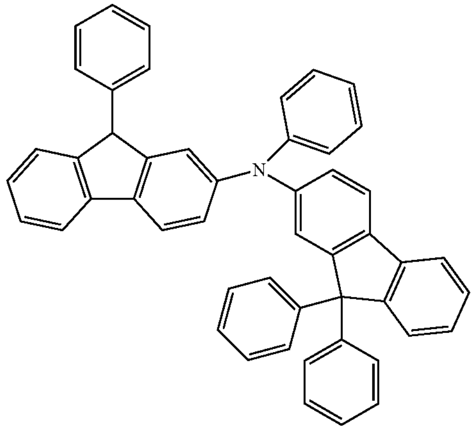

H-1-3

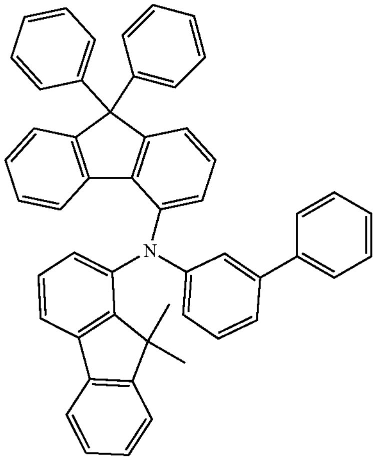

H-1-4
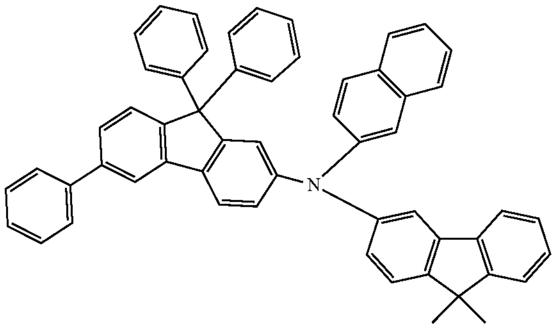
H-1-5
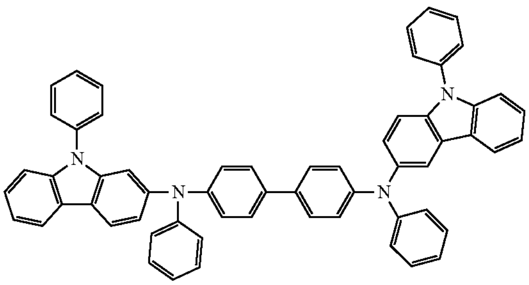
H-1-6
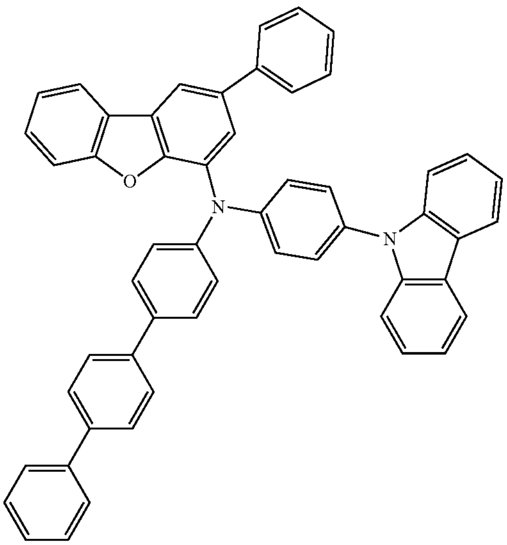
H-1-7
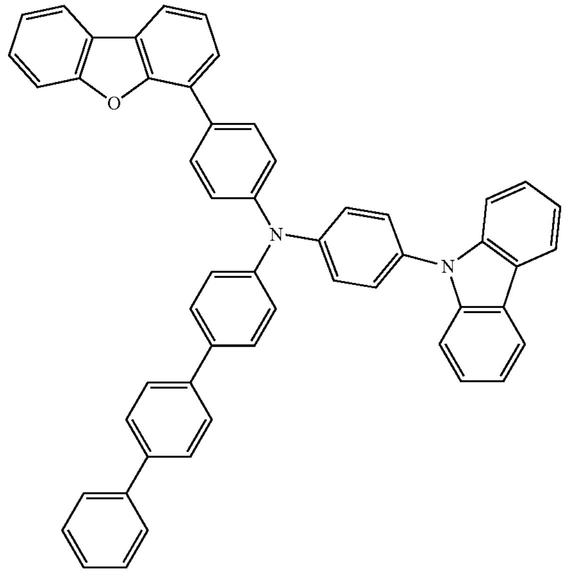
H-1-8
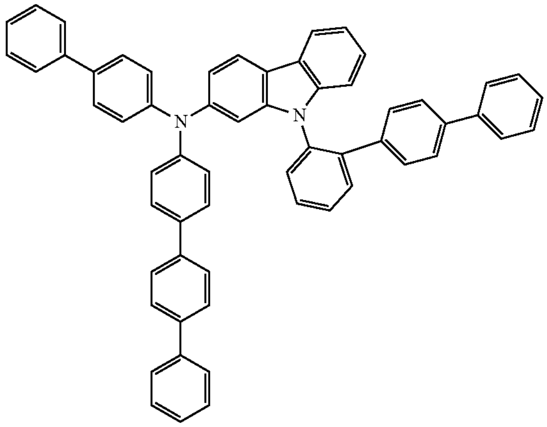
H-1-9
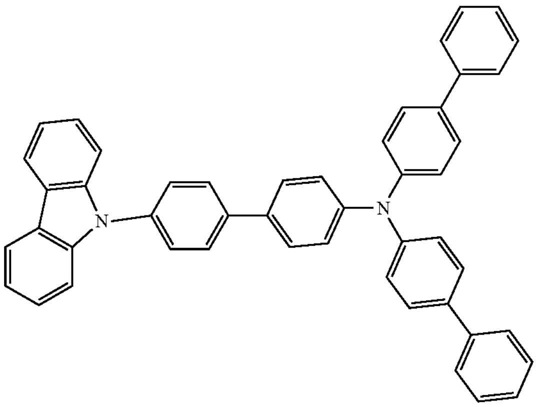

-continued
H-1-10
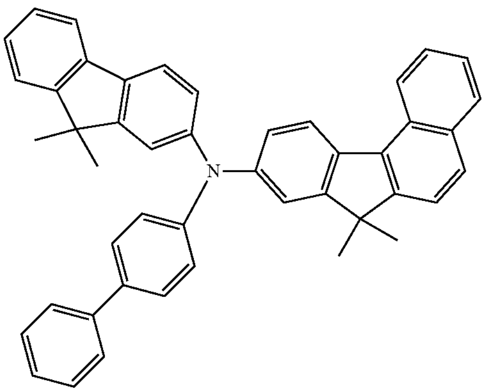
H-1-11
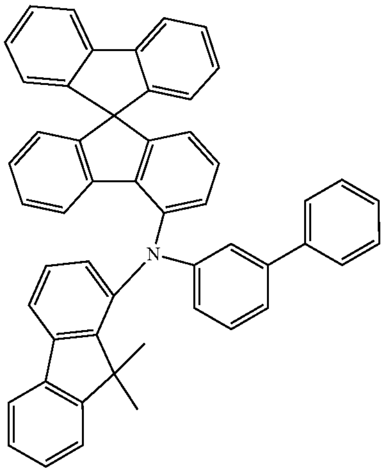
H-1-12
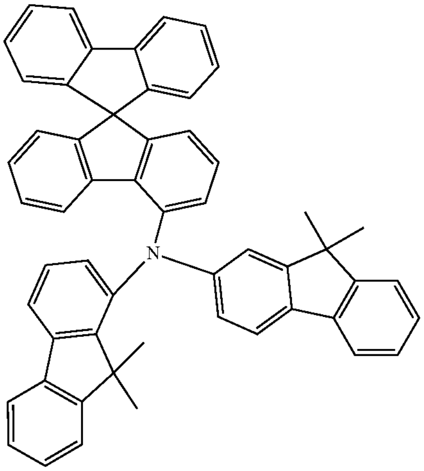
-continued
H-1-13
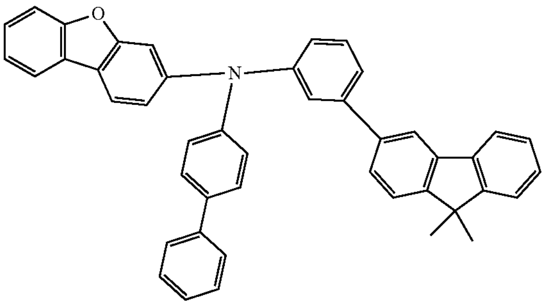
H-1-14
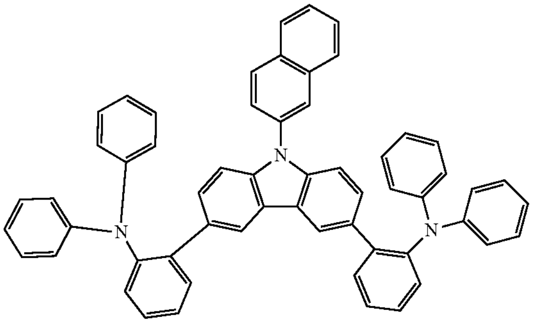
H-1-15
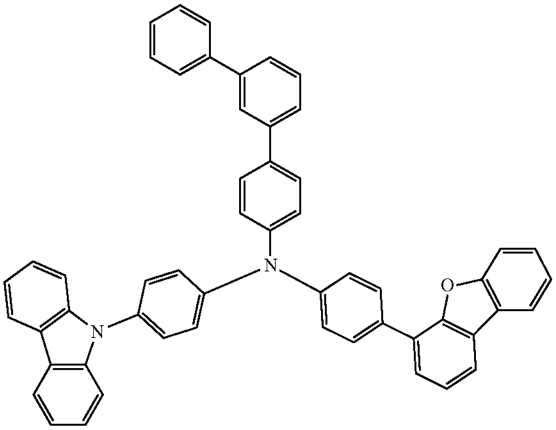

-continued

H-1-16

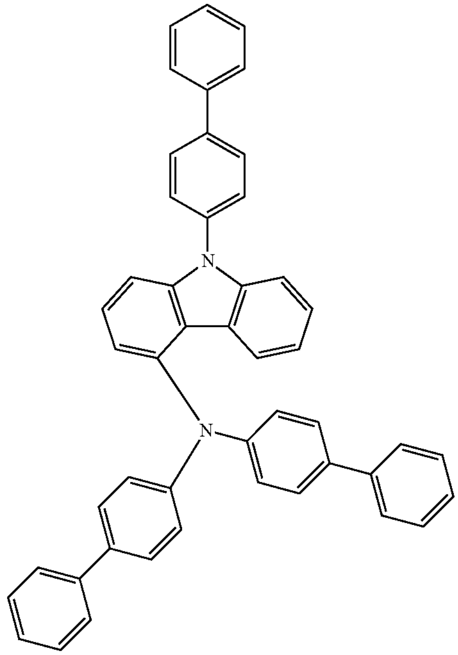

H-1-17

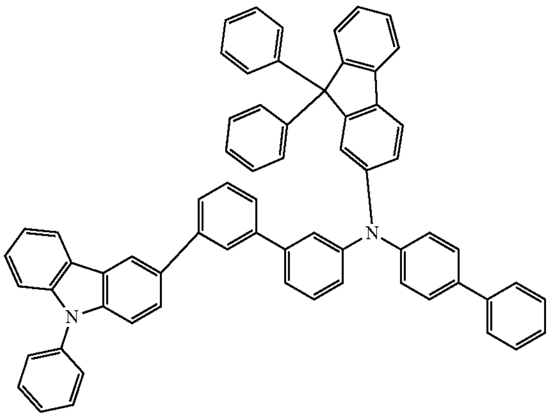

H-1-18

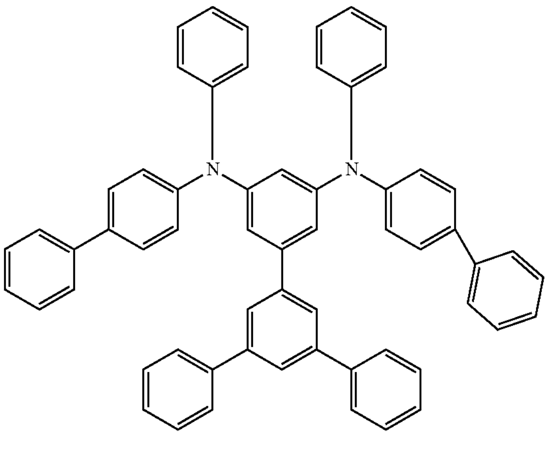

-continued

H-1-19

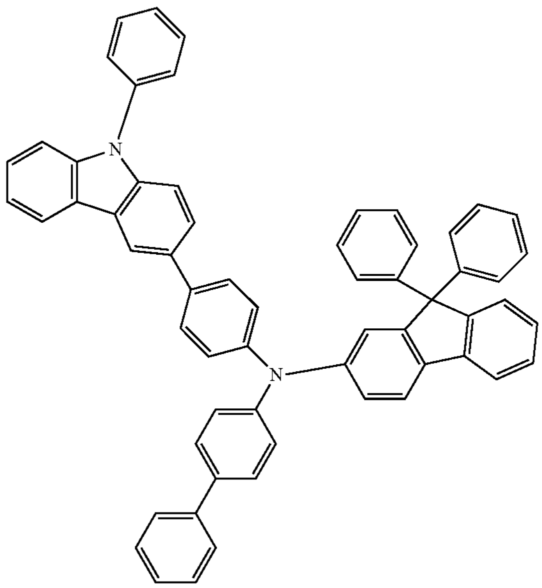

The hole transport region HTR may include a phthalocyanine compound such as copper phthalocyanine, DNTPD ($N^1$,$N^{1'}$-([1,1'-biphenyl]-4,4'-diyl)bis($N^1$-phenyl-$N^4$,$N^4$-di-m-tolylbenzene-1,4-diamine)), m-MTDATA (4,4',4"-[tris(3-methylphenyl)phenylamino]triphenylamine), TDATA (4, 4'4"-Tris(N,N-diphenylamino)triphenylamine), 2-TNATA (4,4',4"-tris[N(2-naphthyl)-N-phenylamino]-triphenylamine), PEDOT/PSS (Poly(3,4-ethylenedioxythiophene)/Poly (4-styrenesulfonate)), PANI/DBSA (Polyaniline/Dodecylbenzenesulfonic acid), PANI/CSA (Polyaniline/Camphor sulfonicacid), PANI/PSS (Polyaniline/Poly(4-styrenesulfonate)), NPB (N,N'-di(naphthalene-1-yl)-N,N'-diphenyl-benzidine), polyetherketone including triphenylamine (TPAPEK), 4-Isopropyl-4'-methyldiphenyliodonium [Tetrakis(pentafluorophenyl)borate], HATCN (dipyrazino[2,3-f: 2',3'-h]quinoxaline-2,3,6,7,10,11-hexacarbonitrile), and the like.

The hole transport region HTR may include an N-phenylcarbazole, a carbazole derivative such as polyvinylcarbazole, a fluorene derivative, TPD (N,N'-bis(3-methylphenyl)-N,N'-diphenyl-[1,1-biphenyl]-4,4'-diamine), a triphenylamine derivative such as TCTA (4,4',4"-tris(N-carbazolyl)triphenylamine), NPB (N,N'-di(naphthalene-1-yl)-N,N'-diplienyl-benzidine), TAPC (4,4'-Cyclohexylidene bis[N,N-bis(4-methylphenyl)benzenamine]), HMTPD (4,4'-Bis[N,N'-(3-tolyl)amino]-3,3'-dimethylbiphenyl), CzSi (9-(4-tert-Butylphenyl)-3,6-bis(triphenylsilyl)-9H-carbazole), CCP (9-phenyl-9H-3,9'-bicarbazole), mCP (1,3-Bis(N-carbazolyl)benzene), or mDCP (1,3-bis(1,8-dimethyl-9H-carbazol-9-yl)benzene). The hole transport region HTR may include the compounds of the hole transport region described above in at least one of a hole injection layer HIL, a hole transport layer HTL, and an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, a thickness of the hole injection layer HIL may be, for example, in a range of about 30 Å to about 1,000 Å. When the hole transport region HTR includes a hole transport layer HTL, a thickness of the hole transport layer HTL may be in a range of about 30 Å to about 1,000 Å. When the hole transport region HTR includes an electron blocking layer EBL, a thickness of the electron blocking layer EBL may be in a range of about 10 Å to about 1,000 Å. When the thickness of the hole transport region HTR, the hole injection layer HIL, the hole transport layer HTL, and the electron blocking layer EBL satisfy the above-described ranges, a satisfactory degree of hole transport characteristics may be obtained without a substantial increase in driving voltage.

The hole transport region HTR may further include a charge generating material to improve conductivity, in addition to the above-described materials. The charge generating material may be uniformly or non-uniformly dispersed in the hole transport region HTR. The charge generating material may be, for example, a p-dopant. The p-dopant may include at least one of a metal halide compound, a quinone derivative, a metal oxide, and a cyano group-containing compound, but is not limited thereto. For example, the p-dopant may include a metal halide compound such as CuI and RbI, a quinone derivative such as Tetracyanoquinodimethane (TCNQ) and F4-TCNQ (2,3,5,6-tetrafluoro-7,7'8,8-tetracyanoquinodimethane), a metal oxide such as tungsten oxide and molybdenum oxide, a cyano group-containing compound such as HATCN (dipyrazino[2,3-f: 2',3'-h]quinoxaline-2,3,6,7,10,11-hexacarbonitrile) and NDP9 (4-[[2,3-bis[cyano-(4-cyano-2,3,5,6-tetrafluorophenyl)methylidene] cyclopropylidene]-cyanomethyl]-2,3,5,6-tetrafluorobenzonitrile), and the like, but embodiments are not limited thereto.

As described above, the hole transport region HTR may further include at least one of a buffer layer (not shown) or an electron blocking layer EBL, in addition to the hole injection layer HIL and the hole transport layer HTL. The buffer layer (not shown) may increase light emission efficiency by compensating for a resonance distance according to a wavelength of light emitted from the light emitting area EMR. A material which may be included in the hole transport region HTR may be included in the buffer layer (not shown). The electron blocking layer EBL may prevent electron injection from the electron transport region ETR to the hole transport region HTR.

In FIGS. 3 to 6, an electron transport region ETR is provided on a light emitting area EMR. The electron transport region ETR may include at least one of a hole blocking layer HBL, an electron transport layer ETL, and an electron injection layer EIL, but embodiments are not limited thereto.

The electron transport region ETR may be a layer made of a single material, a layer made of different materials, or a multilayer structure including layers made of different materials.

For example, the electron transport region ETR may have a single-layer structure of an electron injection layer EIL or an electron transport layer ETL, or may have a single-layer structure including an electron injection material and an electron transport material. The electron transport region ETR may have a single layer structure made of different materials, or may have a structure in which an electron transport layer ETL/electron injection layer EIL, or a hole blocking layer HBL/electron transport layer ETL/electron injection layer EIL are stacked in its respective stated order, but embodiments are not limited thereto. A thickness of the electron transport region ETR may be, for example, in a range of about 1,000 Å to about 1,500 Å.

An electron transport region ETR may be formed using various methods such as vacuum deposition, spin coating, casting, Langmuir-Blodgett (LB), inkjet printing, laser printing, and laser induced thermal imaging (LITI).

The electron transport region (ETR) may include a compound represented by Formula ET-1.

[Formula ET-1]

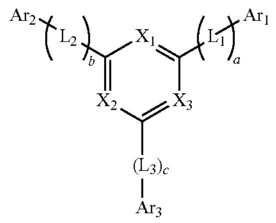

In Formula ET-1, at least one of $X_1$ to $X_3$ may be N and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In the Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR, for example, may include $Alq_3$ (Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, TPBi (1,3,5-Tri(1-phenyl-1H-benzo[d]imidazol-2-yl)benzene), BCP (2,9-Dimethyl-4,7-diphenyl-1,10-phenanthroline), Bphen (4,7-Diphenyl-1,10-phenanthroline), TAZ (3-(4-Biphenylyl)-4-phenyl-5-tert-butylphenyl-1,2,4-triazole), NTAZ (4-(Naphthalen-1-yl)-3,5-diphenyl-4H-1,2,4-triazole), tBu-PBD (2-(4-Biphenylyl)-5-(4-tert-butylphenyl)-1,3,4-oxadiazole), Balq (Bis(2-methyl-8-quinolinolato-N1,O8)-(1,1'-Biphenyl-4-olato) aluminum), $Bebq_2$ (beryllium bis(benzoquinolin-10-olate)), ADN (9,10-di(naphthalene-2-yl)anthracene), BmPyPhB (1,3-Bis[3,5-di(pyridin-3-yl)phenyl]benzene), or a mixture thereof.

The electron transport region ETR may include a metal halide such as LiF, NaCl, CsF, RbCl, RbI, CuI, and KI, a lanthanide metal such as Yb, and a co-deposition material of the above metal halide and the lanthanide metal. For example, the electron transport region ETR may include KI:Yb, RbI:Yb, and the like as a co-deposition material. The electron transport region ETR may include a metal oxide such as $Li_2O$ or BaO, or 8-hydroxyl-Lithium quinolate (Liq), but embodiments are not limited thereto. The electron transport region ETR may also be formed of a mixture of an electron transport material and an insulating organo metal salt. The organo metal salt may be a material having an energy band gap equal to or greater than about 4 eV. For example, the organo metal salt may include metal acetate, metal benzoate, metal acetoacetate, metal acetylacetonate, or metal stearate.

The electron transport region ETR may further include, in addition to the above-described materials, at least one of BCP (2,9-dimethyl-4,7-diphenyl-1,10-phenanthroline), TSPO1 (diphenyl(4-(triphenylsilyl)phenyl)phosphine oxide), and Bphen (4,7-diphenyl-1,10-phenanthroline), but embodiments are not limited thereto.

The electron transport region ETR may include the above-described compounds of the electron transport region ETR in at least one of an electron injection layer EIL, an electron transport layer ETL, or a hole blocking layer HBL.

When the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. When the thickness of the electron transport layer ETL satisfies the above-described range, a satisfactory electron transport characteristic may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described range, a satisfactory electron injection characteristic may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), or indium tin zinc oxide (ITZO).

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgYb). In another embodiment, the second electrode EL2 may have a multi-layer structure including a reflective or transflective film formed of the above-described materials, and a transparent conductive film formed of indium tin oxide (ITO), indium zinc oxide (IZO), zinc oxide (ZnO), and indium tin zinc oxide (ITZO). For example, the second electrode EL2 may include the above-described metal material, a combination of two or more metal materials selected from among the above-described metal materials, or an oxide of the above-described metal materials.

Although not shown in the drawing, the second electrode EL2 may be electrically connected to an auxiliary electrode. When the second electrode EL2 is electrically connected to the auxiliary electrode, the resistance of the second electrode EL2 may be reduced.

In an embodiment, the light emitting element ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, or the like.

For example, when the capping layer CPL includes an organic material, organics may include α-NPD, NPB, TPD, m-MTDATA, $Alq_3$, CuPc, TPD15 (N4,N4,N4',N4'-tetra (biphenyl-4-yl) biphenyl-4,4'-diamine), TCTA (4,4',4''-Tris (carbazol-9-yl) triphenylamine), or may include an epoxy resin, or an acrylate such as methacrylate. However, embodiments are not limited thereto, and the capping layer CPL may include at least one of Compounds P1 to P5.

P1

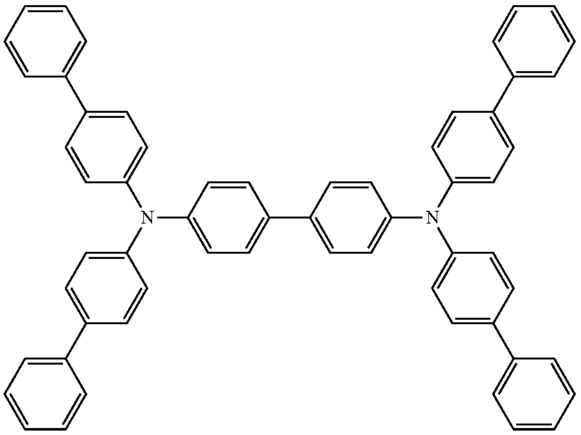

P2

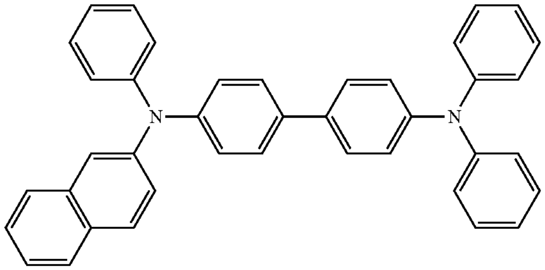

-continued

P3

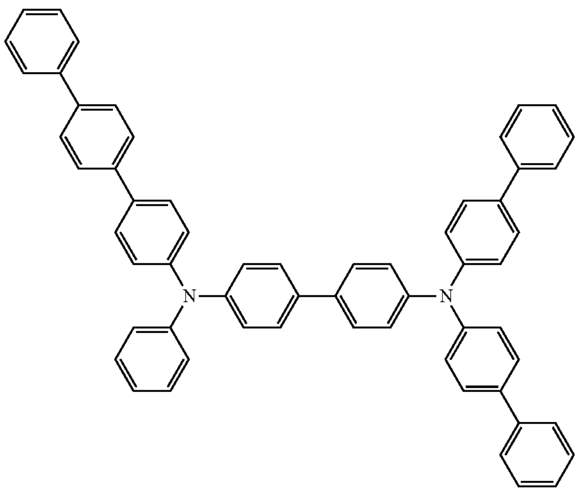

P4

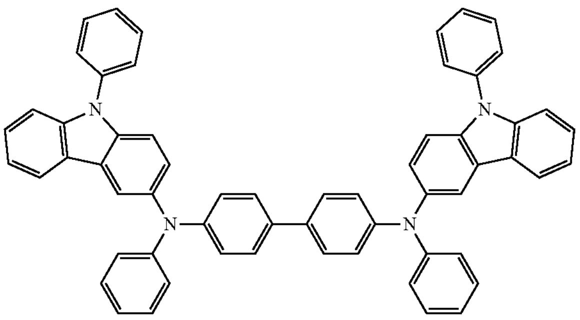

P5

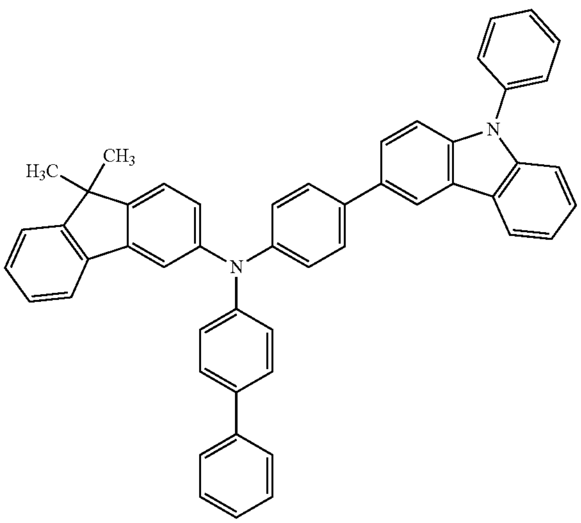

A refractive index of the capping layer CPL may be equal to or greater than about 1.6. For example, a refractive index of the capping layer CPL may be equal to or greater than about 1.6 with respect to light in a wavelength range of about 550 nm to about 660 nm.

Hereinafter, a light emitting element according to an embodiment will be described in detail with reference to the Examples and the Comparative Examples. The Examples shown below are only illustrations for understanding the disclosure, and the scope thereof is not limited thereto.

Embodiment

1. Fabrication of Light Emitting Element

The light emitting elements of Comparative Examples 1 to 6, Comparative Examples X-1 to X-3, Comparative Examples Y-1 to Y-3, Embodiments A-2 to A-7, B-2 to B-5, B-7, B-8, C-2 to C-5, C-7, and C-8 were manufactured by the following method. The light emitting elements of Comparative Examples 1 to 6 are light emitting elements that do not include an auxiliary light emitting layer in a light emitting area including a phosphorescent dopant. The light emitting elements of Comparative Examples X-1 to X-3 are light emitting elements including one auxiliary light emitting layer including a thermally activated delayed fluorescence dopant in a light emitting area including a fluorescent dopant. The light emitting elements of Comparative Examples Y-1 to Y-3 are light emitting elements including an auxiliary light emitting layer including a phosphorescent dopant in a light emitting area including a thermally activated delayed fluorescence dopant.

The light emitting elements of Comparative Examples X-1 to X-3 and Y-1 to Y-3 include a light emitting area having the same configuration as the light emitting area of FIG. 7A. For example, the light emitting elements of Comparative Examples X-1 to X-3 and Y-1 to Y-3 include one auxiliary light emitting layer disposed between two light emitting layers.

The light emitting elements of Embodiments A-2 to A-7, B-2 to B-5, B-7, B-8, C-2 to C-5, C-7, and C-8 are light emitting elements according to an embodiment. The light emitting element of Embodiment A-2 includes a light emitting area having the same structure as the light emitting area EMR of FIG. 7A. The light emitting element of Embodiment A-3 includes a light emitting area having a same structure as the light emitting area EMR-a3 of FIG. 7D. The light emitting element of Embodiment A-4 includes a light emitting area having a same structure as the light emitting area EMR-a4 of FIG. 7E. The light emitting element of Embodiment A-5 includes a light emitting area having a same structure as the light emitting area EMR-a2 of FIG. 7C. The light emitting element of Embodiment A-6 includes a light emitting area having a same structure as the light emitting area EMR-a2 of FIG. 7B. The light emitting element of Embodiment A-7 includes a light emitting area having a same structure as the light emitting area EMR-a5 of FIG. 7F. In Embodiments A-2 to A-7, the phosphorescent dopant included in the light emitting layers is the same, and the concentration of the phosphorescent dopant in each of the light emitting layers is the same.

The light emitting element of Embodiment B-2 includes a light emitting area having a same structure as the light emitting area EMR-b1 of FIG. 8A. The light emitting element of Embodiment B-3 includes a light emitting area having a same structure as the light emitting area EMR-c1 of FIG. 9A. The light emitting element of Embodiment B-4 includes a light emitting area having a same structure as the light emitting area EMR-d1 of FIG. 10A. The light emitting element of Embodiment B-5 includes a light emitting area having a same structure as the light emitting area EMR-d2 of FIG. 10B. The light emitting element of Embodiment B-7 includes a light emitting area having a same structure as the light emitting area EMR-b2 of FIG. 8B. The light emitting element of Embodiment B-8 includes a light emitting area having a same structure as the light emitting area EMR-b3 of FIG. 8C. In the light emitting elements of Embodiments B-2 to B-5, B-7, and B-8, the phosphorescent dopant concentration of the light emitting area decreases from the bottom to the top.

The light emitting element of Embodiment C-2 includes a light emitting area having a same structure as the light emitting area EMR-b1 of FIG. 8A. The light emitting element of Embodiment C-7 includes a light emitting area having a same structure as the light emitting area EMR-b3 of FIG. 8C. The light emitting element of Embodiment C-8 includes a light emitting area having a same structure as the light emitting area EMR-b2 of FIG. 8B. The light emitting element of Embodiment C-3 includes a light emitting area having a same structure as the light emitting area EMR-c2 of FIG. 9B. The light emitting element of Embodiment C-4 includes a light emitting area having a same structure as the light emitting area EMR-d1 of FIG. 10A. The light emitting element of Embodiment C-5 includes a light emitting area having a same structure as the light emitting area EMR-d3 of FIG. 10C. In the light emitting elements of Embodiments C-2 to C-5, C-7, and C-8, the phosphorescent dopant concentration of the light emitting area increases from the bottom to the top. The light emitting elements of Comparative Example and Embodiment were manufactured in the following way.

A light emitting layer was formed by depositing a hole transporting host and an electron transporting host in a weight ratio of 5:5, and a phosphorescent dopant (doping at 10 wt % to 30 wt %) on the hole transport layer. An auxiliary light emitting layer was formed by depositing a hole transporting host and an electron transporting host in a weight ratio of 5:5, and a thermally activated delayed fluorescence dopant (0.5 wt % to 2.0 wt %) on the light emitting layer. A light emitting layer and an auxiliary light emitting layer were alternately and repeatedly deposited to form a light emitting area with a thickness of 300 Å.

ETL1 was deposited on the light emitting area to form an electron transport layer with a thickness of 300 Å, and a second electrode with a thickness of 1200 Å was formed of A1. In this way, the light emitting elements of Comparative Examples 1 to 6, Embodiments A-2 to A-7, B-2 to B-5, B-7, B-8, C-2 to C-5, C-7, and C-8 were formed.

The light emitting elements of Comparative Examples X-1 to X-3 were manufactured in a same manner as the light emitting elements of the embodiment except for forming a light emitting layer using a blue fluorescent dopant TPD instead of a phosphorescent dopant. The light emitting elements of Comparative Examples Y-1 to Y-3 were manufactured in a same manner as the light emitting elements of the embodiment except for forming a light emitting layer using a thermally activated delayed fluorescence dopant instead of a phosphorescent dopant, and forming an auxiliary light emitting layer with a phosphorescent dopant instead of a thermally activated delayed fluorescence dopant.

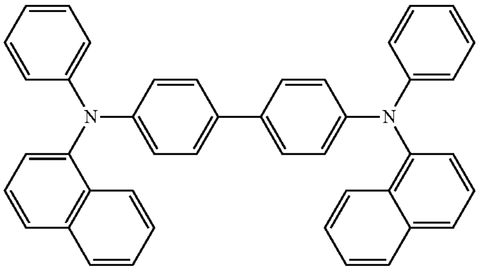

NPB

-continued

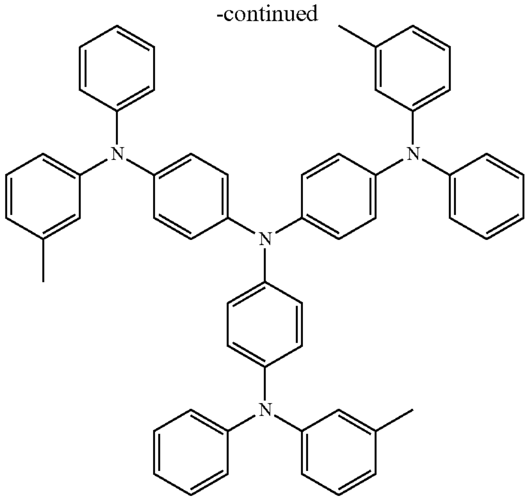

m-MTDATA

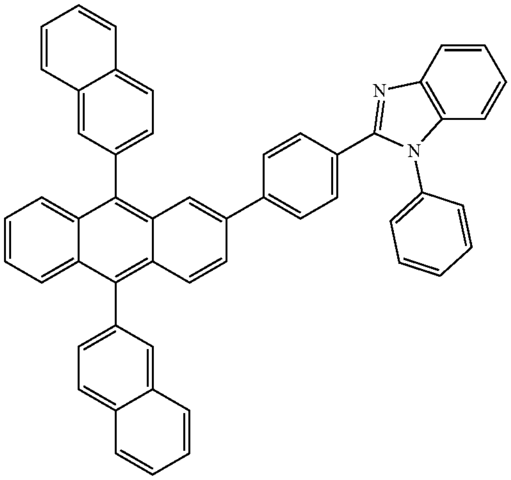

ETL1

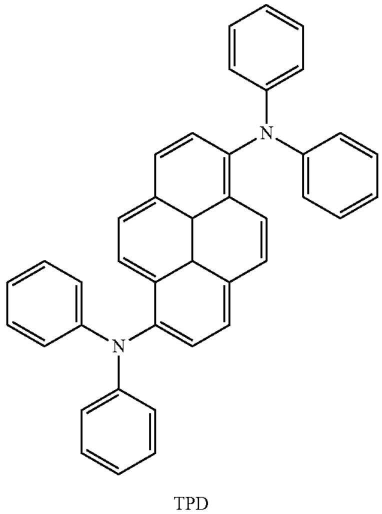

TPD

The hole transporting host and electron transporting host used in forming the light emitting area of the light emitting elements of Comparative Examples 1 to 6, X-1 to X-3, and Y-1 to Y-3, and Embodiments A-1 to A-6, B-1 to B-6, and C-1 to C-6 are shown in Table 1 below. Table 1 shows host combinations 1 to 6 of the hole transporting host and the electron transporting host.

TABLE 1
| Classification | Hole transporting host | Electron transporting host |
|---|---|---|
| Host combination 1 | 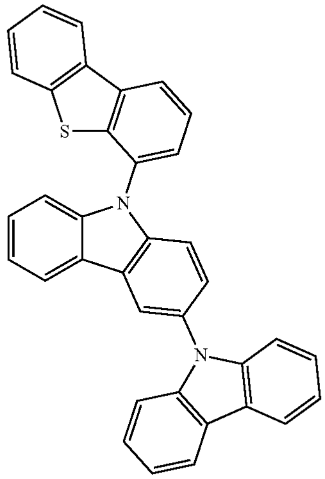 HT-10 | 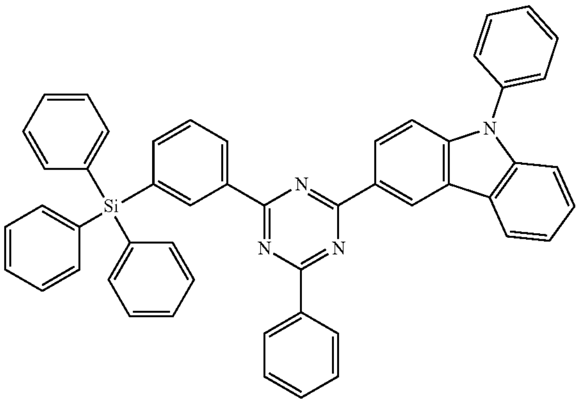 ET04 |
| Host combination 2 | 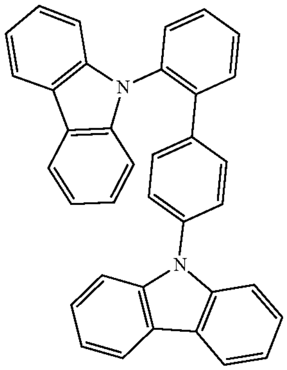 [SMILES: c1ccc(-n2c3ccccc3c3ccccc32)c(-c2ccc(-n3c4ccccc4c4ccccc43)cc2)c1] HT-06 | 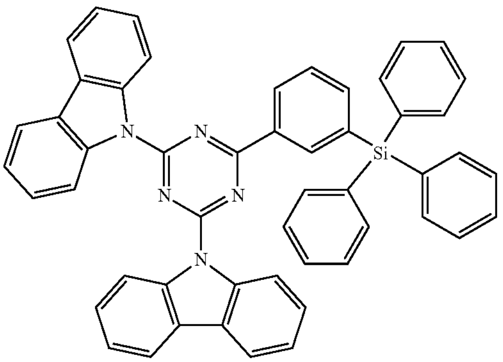 ET015 |
| Host combination 3 | 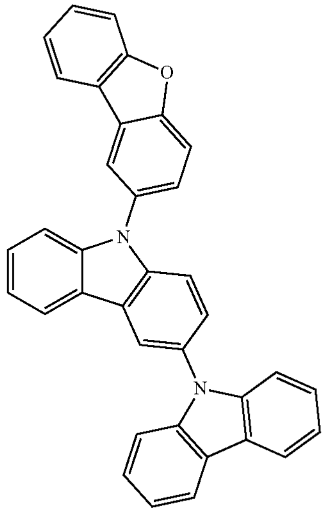 [SMILES: c1ccc2c(c1)oc1ccc(-n3c4ccccc4c4cc(-n5c6ccccc6c6ccccc65)ccc43)cc12] HT-12 | 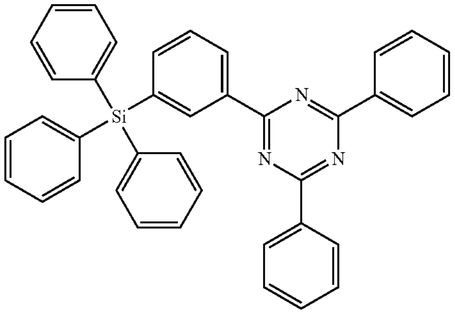 ET08 |

TABLE 1-continued
| Classification | Hole transporting host | Electron transporting host |
| --- | --- | --- |
| Host combination 4 | 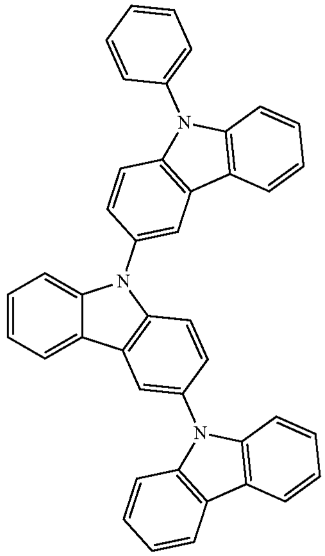 [SMILES: c1ccc(-n2c3ccccc3c3cc(-n4c5ccccc5c5cc(-n6c7ccccc7c7ccccc76)ccc54)ccc32)cc1] HT-15 | 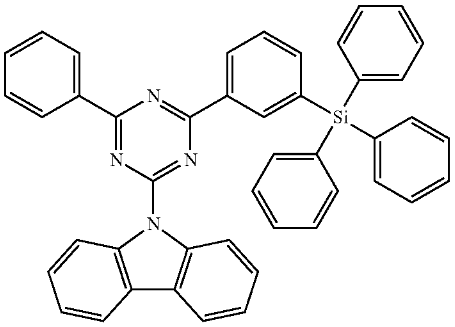 ET06 |
| Host combination 5 | 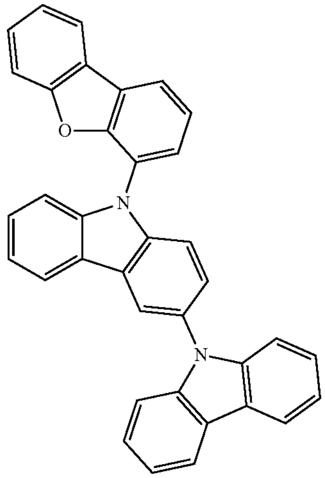 HT-11 | 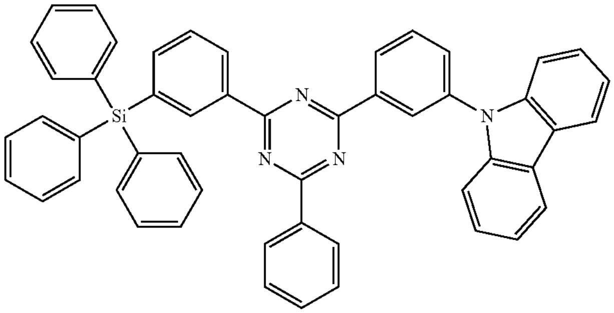 ET05 |
| Host combination 6 | 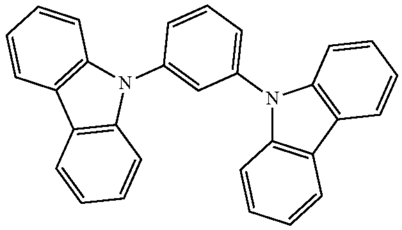 [SMILES: c1cc(-n2c3ccccc3c3ccccc32)cc(-n2c3ccccc3c3ccccc32)c1] HT-02 | 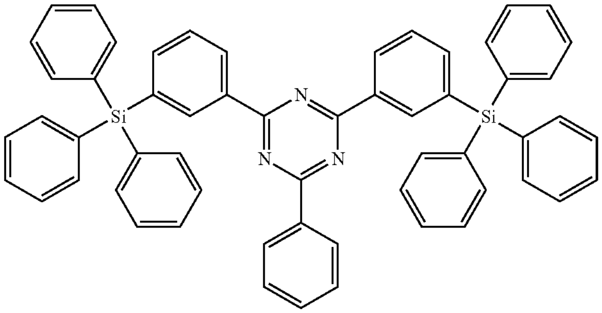 ET02 |

2. Efficiency and Lifetime Evaluation of Light Emitting Element

Tables 2 to 25 evaluate the efficiency and lifetime of the light emitting elements of Comparative Example and Embodiment. In Tables 2 to 25, the light emitting elements of Comparative Examples X-1 to X-3 and Y-1 to Y-3 include one auxiliary light emitting layer. The light emitting elements of Embodiments A-2, A-5, A-6, B-2, B-7, B-8, C-2, C-7, and C-8 include one auxiliary light emitting layer. The light emitting elements of Embodiments A-3, A-4, A-7, B-3 to B-5, and C-3 to C-5 include two or more auxiliary light emitting layers. The light emitting elements of Embodiments A-3, B-3, and C-3 include two auxiliary light emitting layers. The light emitting elements of Embodiments A-4, A-7, B-4, and B-5 include three auxiliary light emitting layers.

The phosphorescent dopant and thermally activated delayed fluorescence dopant used in the light emitting element of Comparative Example and Embodiment are as follows.

PD-1

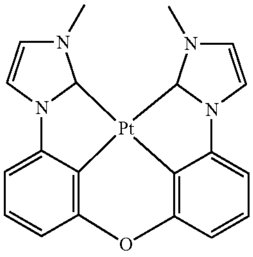

PD-3

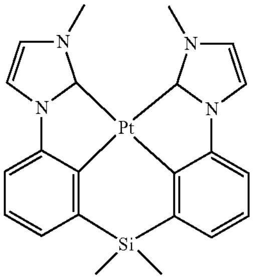

PD-5

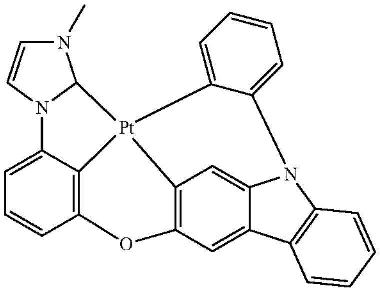

PD-9

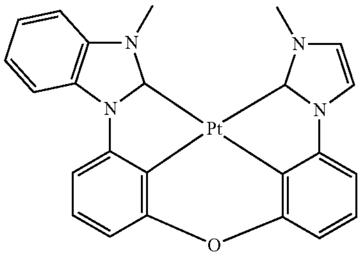

-continued

PD-25

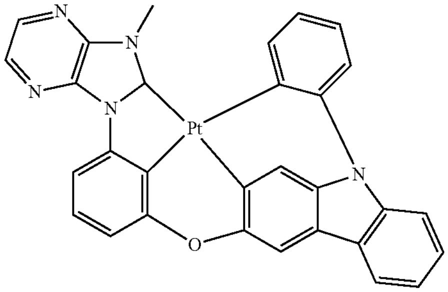

PD-33

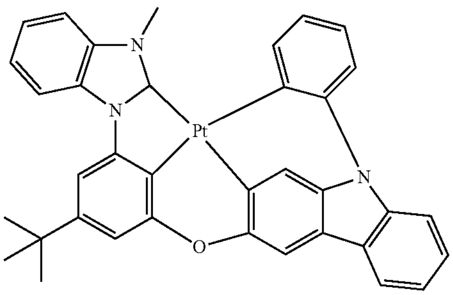

PR-5

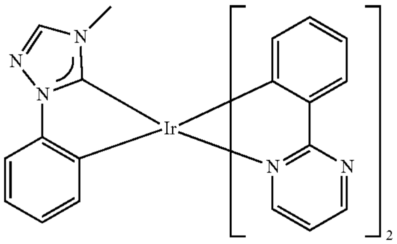

PR-8

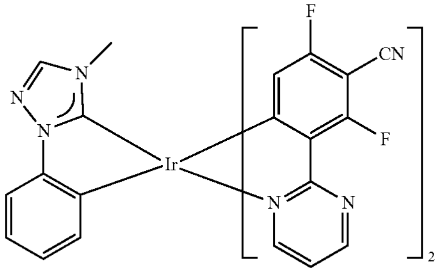

PR-17

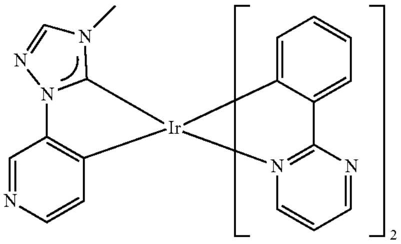

PR-19
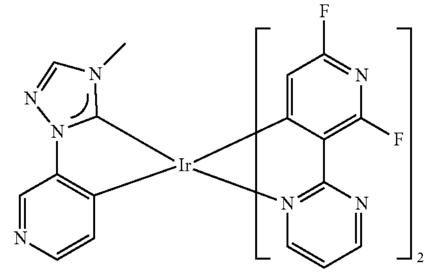
PR-24
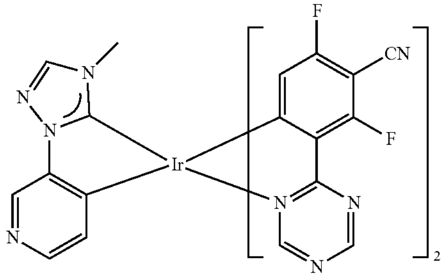
PR-29
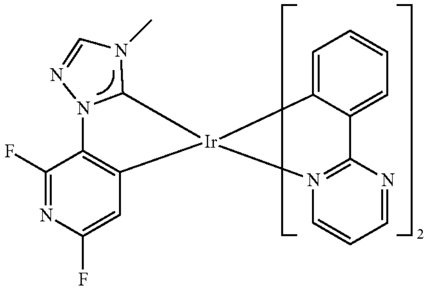
D-01
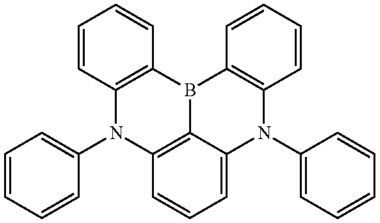
D-07
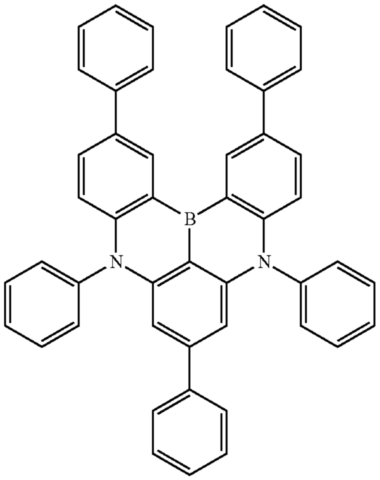
D-09
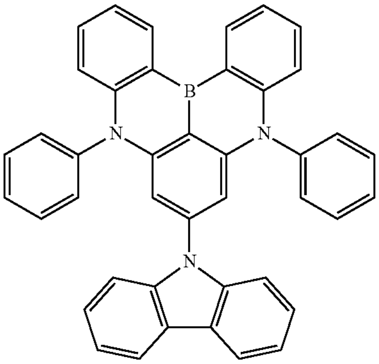
D-10
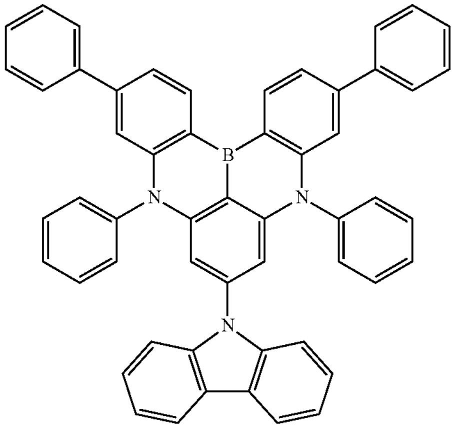
D-11
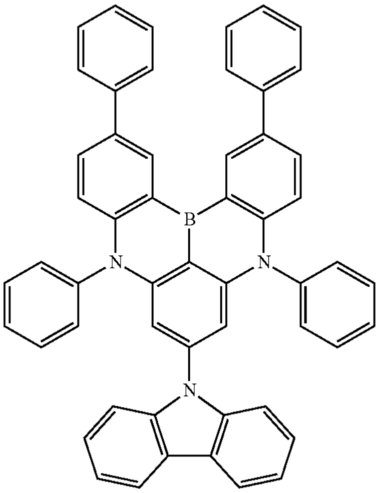

-continued

DA-02

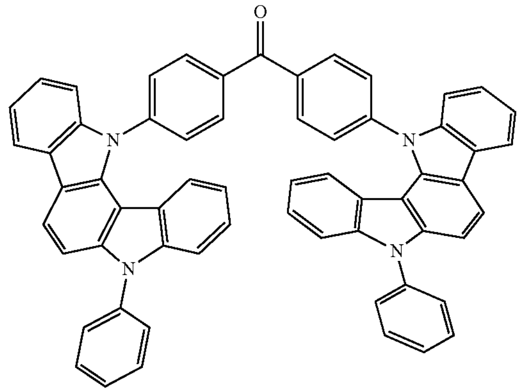

DA-13

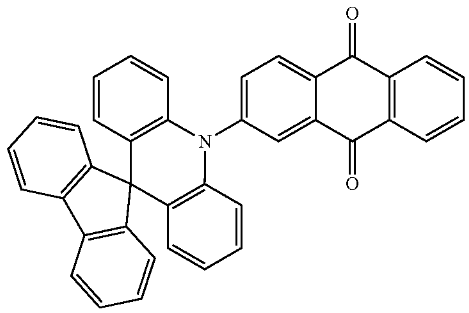

DA-15

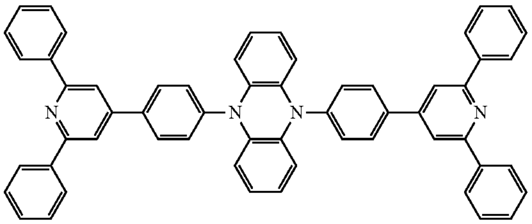

DA-16

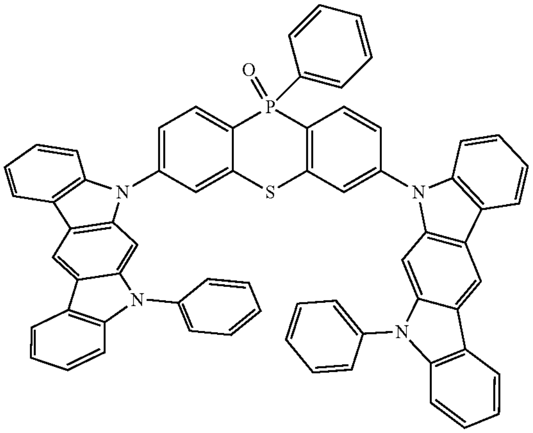

-continued

DA-17

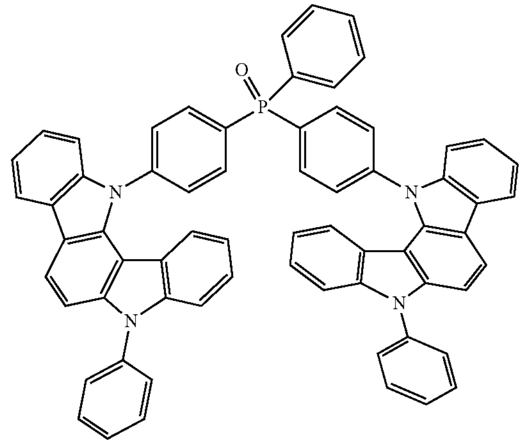

DA-25

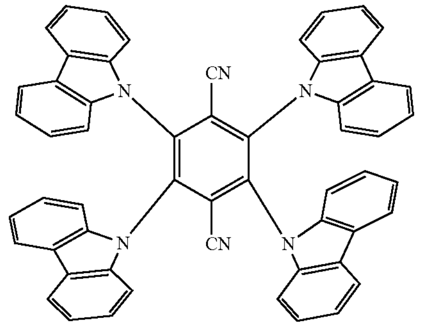

In Tables 2 to 25, TPD was used as the fluorescent dopant of Comparative Examples X-1 to X-3, as described above. In Tables 2 to 25, the luminous efficiency represents the efficiency value for a current density of 500 mA/cm$^2$. The lifetime T95 is expressed by measuring the time it takes for the initial luminance of 1,000 nits to decrease to 95%.

Table 2 shows the evaluation of luminous efficiency and lifetime in light emitting elements of Comparative Examples 1, X-1 to X-3, Y-1 to Y-3, and Embodiment including the hole transporting host and electron transporting host of host combination 1. In the light emitting elements of Comparative Examples 1, X-1 to X-3, and Y-1 to Y-3 and Embodiment in Table 2, PD-1 was used as the phosphorescent dopant, and D-01 was used as the thermally activated delayed fluorescence dopant in the light emitting element of Embodiment.

TABLE 2

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 1 | 21.3 | 38.4 | | | |
| Comparative Example X-1 | 15.4 | 34.1 | Comparative Example Y-1 | 20.1 | 35.1 |
| Comparative Example X-2 | 14.1 | 35.4 | Comparative Example Y-2 | 19.8 | 33.3 |
| Comparative Example X-3 | 15.3 | 31.1 | Comparative Example Y-3 | 20.2 | 34.5 |
| Embodiment A-5 | 23.5 | 62.55 | Embodiment A-3 | 24.3 | 80 |
| Embodiment A-2 | 22.2 | 60.15 | Embodiment A-4 | 24.1 | 79 |
| Embodiment A-6 | 21.9 | 58.8 | Embodiment A-7 | 25.3 | 82.4 |

TABLE 2-continued

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Embodiment B-2 | 23.1 | 60.75 | Embodiment B-3 | 24.0 | 78.8 |
| Embodiment B-7 | 22.0 | 59.7 | Embodiment B-4 | 25.5 | 84 |
| Embodiment B-8 | 23.1 | 60.75 | Embodiment B-5 | 24.1 | 79.6 |
| Embodiment C-2 | 21.9 | 58.2 | Embodiment C-3 | 24.1 | 77.8 |
| Embodiment C-7 | 21.6 | 58.35 | Embodiment C-4 | 23.5 | 77.2 |
| Embodiment C-8 | 22.1 | 58.8 | Embodiment C-5 | 23.4 | 76.6 |

Referring to Table 2, it may be seen that the light emitting element of Embodiment has superior efficiency and lifetime compared to the light emitting element of Comparative Example 1 that does not include an auxiliary light emitting layer. In comparison to the light emitting elements of Comparative Examples X-1 to X-3 including an auxiliary light emitting layer including a thermally activated delayed fluorescence dopant in a light emitting area including a fluorescent dopant, it may be seen that the light emitting element of Embodiment has excellent efficiency and lifetime. Compared to the light emitting elements of Comparative Examples Y-1 to Y-3 including an auxiliary light emitting layer including a phosphorescent dopant in a light emitting area including a thermally activated delayed fluorescence dopant, it may be seen that the light emitting element of Embodiment has excellent efficiency and lifetime. As the light emitting element of the embodiment includes an auxiliary light emitting layer including a thermally activated delayed fluorescence dopant in a light emitting area including a phosphorescent dopant, it is determined that the efficiency and lifetime have improved. Table 3 shows the evaluation of luminous efficiency and lifetime in light emitting elements of Comparative Examples 2, X-1 to X-3, and Y-1 to Y-3, and Embodiment including the hole transporting host and electron transporting host of host combination 2. In the light emitting elements of Comparative Examples 2, X-1 to X-3, and Y-1 to Y-3 and Embodiment in Table 3, PD-3 was used as the phosphorescent dopant, and D-11 was used as the thermally activated delayed fluorescence dopant in the light emitting element of Embodiment.

TABLE 3

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 2 | 20.9 | 37.8 | | | |
| Comparative Example X-1 | 14.4 | 32.1 | Comparative Example Y-1 | 21.1 | 34.7 |
| Comparative Example X-2 | 14.1 | 34.2 | Comparative Example Y-2 | 19.3 | 35.3 |
| Comparative Example X-3 | 14.3 | 32.5 | Comparative Example Y-3 | 20.3 | 33.5 |
| Embodiment A-5 | 24.1 | 63.45 | Embodiment A-3 | 25.0 | 82.2 |
| Embodiment A-2 | 23.2 | 61.2 | Embodiment A-4 | 24.5 | 80.2 |
| Embodiment A-6 | 21.8 | 58.05 | Embodiment A-7 | 26.0 | 84.4 |
| Embodiment B-2 | 22.8 | 63.75 | Embodiment B-3 | 23.5 | 78.2 |
| Embodiment B-7 | 22.5 | 60.45 | Embodiment B-4 | 26.1 | 85.4 |
| Embodiment B-8 | 25.1 | 58.8 | Embodiment B-5 | 23.6 | 79 |
| Embodiment C-2 | 22.5 | 57.15 | Embodiment C-3 | 24.2 | 78.4 |
| Embodiment C-7 | 22.1 | 59.4 | Embodiment C-4 | 24.6 | 78.6 |
| Embodiment C-8 | 21.9 | 57.75 | Embodiment C-5 | 24.1 | 76.4 |

Table 4 shows the evaluation of luminous efficiency and lifetime in the light emitting elements of Comparative Example and Embodiment including the hole transporting host and the electron transporting host of host combination 3, respectively. In the light emitting elements of Comparative Examples 3, X-1 to X-3, and Y-1 to Y-3 and Embodiment in Table 4, PD-9 was used as the phosphorescent dopant, and D-09 was used as the thermally activated delayed fluorescence dopant in the light emitting element of Embodiment.

Table 4 shows the evaluation of luminous efficiency and lifetime in the light emitting elements of Comparative Example and Embodiment including the hole transporting host and the electron transporting host of host combination 3, respectively. In the light emitting elements of Comparative Examples 3, X-1 to X-3, and Y-1 to Y-3 and Embodiment in Table 4, PD-9 was used as the phosphorescent dopant, and D-09 was used as the thermally activated delayed fluorescence dopant in the light emitting element of Embodiment.

TABLE 4

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 3 | 19.9 | 36.7 | | | |
| Comparative Example X-1 | 13.7 | 31.7 | Comparative Example Y-1 | 21.4 | 33.5 |
| Comparative Example X-2 | 13.4 | 32.2 | Comparative Example Y-2 | 20.4 | 34.4 |
| Comparative Example X-3 | 13.5 | 33.1 | Comparative Example Y-3 | 20.1 | 33.4 |
| Embodiment A-5 | 24.6 | 62.85 | Embodiment A-3 | 26.2 | 84.2 |
| Embodiment A-2 | 23.9 | 61.8 | Embodiment A-4 | 25.1 | 80.8 |
| Embodiment A-6 | 22.8 | 58.5 | Embodiment A-7 | 26.6 | 83.6 |
| Embodiment B-2 | 22.2 | 62.25 | Embodiment B-3 | 24.7 | 79.4 |
| Embodiment B-7 | 23.9 | 61.2 | Embodiment B-4 | 26.5 | 86 |
| Embodiment B-8 | 24.8 | 58.95 | Embodiment B-5 | 24.1 | 78.2 |
| Embodiment C-2 | 22.9 | 58.05 | Embodiment C-3 | 23.3 | 78 |
| Embodiment C-7 | 23.4 | 58.65 | Embodiment C-4 | 24.9 | 79 |
| Embodiment C-8 | 22.4 | 57.6 | Embodiment C-5 | 24.2 | 77.2 |

Table 5 shows the evaluation of luminous efficiency and lifetime in the light emitting elements of Comparative Example and Embodiment including the hole transporting host and the electron transporting host of host combination 4, respectively. In the light emitting elements of Comparative Examples 4, X-1 to X-3, and Y-1 to Y-3 and Embodiment in Table 5, PD-5 was used as the phosphorescent dopant, and D-10 was used as the thermally activated delayed fluorescence dopant in the light emitting element of Embodiment.

TABLE 5

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 4 | 20.5 | 37.2 | | | |
| Comparative Example X-1 | 14.1 | 31.9 | Comparative Example Y-1 | 22.3 | 34.7 |
| Comparative Example X-2 | 13.8 | 32.1 | Comparative Example Y-2 | 21.5 | 33.6 |
| Comparative Example X-3 | 13.6 | 32.4 | Comparative Example Y-3 | 21.7 | 32.8 |
| Embodiment A-5 | 24.2 | 61.65 | Embodiment A-3 | 26.4 | 84.6 |
| Embodiment A-2 | 23.7 | 60.75 | Embodiment A-4 | 25.5 | 81.4 |
| Embodiment A-6 | 23.1 | 59.1 | Embodiment A-7 | 26.7 | 84.2 |

TABLE 5-continued

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Embodiment B-2 | 22.2 | 58.65 | Embodiment B-3 | 25.1 | 79.8 |
| Embodiment B-7 | 24.0 | 61.8 | Embodiment B-4 | 25.9 | 84.6 |
| Embodiment B-8 | 23.5 | 58.2 | Embodiment B-5 | 25.7 | 80.6 |
| Embodiment C-2 | 23.2 | 57.9 | Embodiment C-3 | 23.2 | 77.2 |
| Embodiment C-7 | 23.5 | 58.8 | Embodiment C-4 | 24.5 | 78.2 |
| Embodiment C-8 | 22.1 | 57.3 | Embodiment C-5 | 24.0 | 76.6 |

Table 6 shows the evaluation of luminous efficiency and lifetime in the light emitting elements of Comparative Example and Embodiment including the hole transporting host and the electron transporting host of host combination 5, respectively. In the light emitting elements of Comparative Examples 5, X-1 to X-3, and Y-1 to Y-3 and Embodiment in Table 6, PD-33 was used as the phosphorescent dopant, and D-07 was used as the thermally activated delayed fluorescence dopant in the light emitting element of Embodiment.

TABLE 6

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 5 | 19.7 | 37.1 | | | |
| Comparative Example X-1 | 12.7 | 30.8 | Comparative Example Y-1 | 23.1 | 34.1 |
| Comparative Example X-2 | 13.3 | 31.3 | Comparative Example Y-2 | 22.7 | 33.5 |
| Comparative Example X-3 | 13.2 | 31.5 | Comparative Example Y-3 | 22.1 | 33.3 |
| Embodiment A-5 | 23.9 | 60.45 | Embodiment A-3 | 26.1 | 83.4 |
| Embodiment A-2 | 23.3 | 59.7 | Embodiment A-4 | 25.2 | 81.2 |
| Embodiment A-6 | 22.9 | 58.65 | Embodiment A-7 | 26.4 | 83.6 |
| Embodiment B-2 | 22.5 | 58.05 | Embodiment B-3 | 25.5 | 80.4 |
| Embodiment B-7 | 23.8 | 61.05 | Embodiment B-4 | 26.3 | 84.2 |
| Embodiment B-8 | 23.3 | 57.9 | Embodiment B-5 | 25.5 | 80.2 |
| Embodiment C-2 | 23.5 | 58.35 | Embodiment C-3 | 23.5 | 77.2 |
| Embodiment C-7 | 23.8 | 59.7 | Embodiment C-4 | 24.9 | 79.2 |
| Embodiment C-8 | 22.3 | 57.9 | Embodiment C-5 | 24.6 | 77.4 |

Table 7 shows the evaluation of luminous efficiency and lifetime in the light emitting elements of Comparative Example and Embodiment including the hole transporting host and the electron transporting host of host combination 6, respectively. In the light emitting elements of Comparative Examples 6, X-1 to X-3, and Y-1 to Y-3 and Embodiment in Table 7, PD-25 was used as the phosphorescent dopant, and D-11 was used as the thermally activated delayed fluorescence dopant in the light emitting element of Embodiment.

TABLE 7

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 6 | 19.3 | 36.4 | | | |
| Comparative Example X-1 | 13.9 | 31.5 | Comparative Example Y-1 | 22.7 | 33.3 |
| Comparative Example X-2 | 13.5 | 31.6 | Comparative Example Y-2 | 23.0 | 34.1 |
| Comparative Example X-3 | 13.4 | 31.9 | Comparative Example Y-3 | 22.5 | 33.7 |
| Embodiment A-5 | 23.6 | 59.85 | Embodiment A-3 | 26.3 | 83 |
| Embodiment A-2 | 23.5 | 59.55 | Embodiment A-4 | 25.5 | 79.8 |
| Embodiment A-6 | 23.2 | 58.95 | Embodiment A-7 | 26.2 | 82.8 |
| Embodiment B-2 | 22.1 | 57.6 | Embodiment B-3 | 26.6 | 84.4 |
| Embodiment B-7 | 23.6 | 60.75 | Embodiment B-4 | 26.7 | 86.2 |
| Embodiment B-8 | 23.4 | 58.05 | Embodiment B-5 | 25.9 | 90.2 |
| Embodiment C-2 | 23.8 | 58.8 | Embodiment C-3 | 23.3 | 76.8 |
| Embodiment C-7 | 23.2 | 58.95 | Embodiment C-4 | 24.4 | 78.2 |
| Embodiment C-8 | 22.6 | 57.75 | Embodiment C-5 | 24.2 | 77.6 |

Table 8 shows the evaluation of luminous efficiency and lifetime in light emitting elements of Comparative Examples 1, X-1 to X-3, and Y-1 to Y-3, and Embodiment including the hole transporting host and electron transporting host of host combination 1. In the light emitting elements of Comparative Examples 1, X-1 to X-3, and Y-1 to Y-3 and Embodiment in Table 8, PD-1 was used as the phosphorescent dopant, and DA-02 was used as the thermally activated delayed fluorescence dopant in the light emitting element of Embodiment.

TABLE 8

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 1 | 21.3 | 38.4 | | | |
| Comparative Example X-1 | 12.5 | 29.3 | Comparative Example Y-1 | 19.2 | 31.2 |
| Comparative Example X-2 | 12.2 | 28.5 | Comparative Example Y-2 | 19.4 | 32.1 |
| Comparative Example X-3 | 12.2 | 28.8 | Comparative Example Y-3 | 19.1 | 31.7 |
| Embodiment A-5 | 23.0 | 61.1 | Embodiment A-3 | 22.3 | 71.6 |
| Embodiment A-2 | 21.7 | 58.8 | Embodiment A-4 | 22.1 | 70.7 |
| Embodiment A-6 | 21.4 | 57.5 | Embodiment A-7 | 23.2 | 73.7 |
| Embodiment B-2 | 22.6 | 59.4 | Embodiment B-3 | 22.1 | 70.5 |
| Embodiment B-7 | 21.5 | 58.3 | Embodiment B-4 | 23.4 | 75.1 |
| Embodiment B-8 | 22.6 | 59.4 | Embodiment B-5 | 22.1 | 71.2 |
| Embodiment C-2 | 21.4 | 56.9 | Embodiment C-3 | 22.1 | 69.6 |
| Embodiment C-7 | 21.1 | 57.0 | Embodiment C-4 | 21.6 | 69.1 |
| Embodiment C-8 | 21.6 | 57.5 | Embodiment C-5 | 21.5 | 68.5 |

Table 9 shows the evaluation of luminous efficiency and lifetime in light emitting elements of Comparative Examples 2, X-1 to X-3, and Y-1 to Y-3, and Embodiment including the hole transporting host and electron transporting host of host combination 2. In the light emitting elements of Comparative Examples 2, X-1 to X-3, and Y-1 to Y-3 and Embodiment in Table 9, PD-3 was used as the phosphorescent dopant, and DA-25 was used as the thermally activated delayed fluorescence dopant in the light emitting element of Embodiment.

TABLE 9

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 2 | 20.9 | 37.8 | | | |
| Comparative Example X-1 | 14.5 | 28.5 | Comparative Example Y-1 | 18.1 | 31.3 |
| Comparative Example X-2 | 14.3 | 28.0 | Comparative Example Y-2 | 17.4 | 31.2 |
| Comparative Example X-3 | 13.6 | 27.2 | Comparative Example Y-3 | 17.0 | 30.6 |
| Embodiment A-5 | 16.1 | 47.1 | Embodiment A-3 | 17.3 | 58.8 |
| Embodiment A-2 | 15.4 | 45.4 | Embodiment A-4 | 17.0 | 57.3 |
| Embodiment A-6 | 14.5 | 43.1 | Embodiment A-7 | 18.1 | 60.4 |
| Embodiment B-2 | 15.2 | 47.4 | Embodiment B-3 | 16.3 | 55.9 |
| Embodiment B-7 | 15.0 | 44.9 | Embodiment B-4 | 18.1 | 61.1 |
| Embodiment B-8 | 16.7 | 43.6 | Embodiment B-5 | 16.4 | 56.5 |
| Embodiment C-2 | 15.0 | 42.4 | Embodiment C-3 | 16.8 | 56.1 |
| Embodiment C-7 | 14.8 | 44.1 | Embodiment C-4 | 17.1 | 56.2 |
| Embodiment C-8 | 14.6 | 42.9 | Embodiment C-5 | 16.7 | 54.6 |

Table 10 shows the evaluation of luminous efficiency and lifetime in the light emitting elements of Comparative Example and Embodiment including the hole transporting host and the electron transporting host of host combination 3, respectively. In the light emitting elements of Comparative Examples 3, X-1 to X-3, and Y-1 to Y-3 and Embodiment in Table 10, PD-9 was used as the phosphorescent dopant, and DA-17 was used as the thermally activated delayed fluorescence dopant in the light emitting element of Embodiment.

TABLE 10

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 3 | 19.9 | 36.7 | | | |
| Comparative Example X-1 | 15.3 | 24.4 | Comparative Example Y-1 | 18.4 | 32.7 |
| Comparative Example X-2 | 15.1 | 24.0 | Comparative Example Y-2 | 17.6 | 32.6 |
| Comparative Example X-3 | 14.4 | 23.3 | Comparative Example Y-3 | 17.3 | 32.0 |
| Embodiment A-5 | 17.1 | 54.0 | Embodiment A-3 | 17.7 | 62.4 |
| Embodiment A-2 | 16.6 | 53.1 | Embodiment A-4 | 17.0 | 59.9 |
| Embodiment A-6 | 15.8 | 50.2 | Embodiment A-7 | 18.0 | 62.0 |
| Embodiment B-2 | 15.5 | 53.5 | Embodiment B-3 | 16.7 | 58.8 |
| Embodiment B-7 | 16.6 | 52.5 | Embodiment B-4 | 18.0 | 63.8 |
| Embodiment B-8 | 17.2 | 50.7 | Embodiment B-5 | 16.3 | 58.0 |
| Embodiment C-2 | 15.9 | 49.8 | Embodiment C-3 | 15.8 | 57.8 |
| Embodiment C-7 | 16.2 | 50.3 | Embodiment C-4 | 16.9 | 58.6 |
| Embodiment C-8 | 15.5 | 49.5 | Embodiment C-5 | 16.4 | 57.2 |

Table 11 shows the evaluation of luminous efficiency and lifetime in the light emitting elements of Comparative Example and Embodiment including the hole transporting host and the electron transporting host of host combination 4, respectively. In the light emitting elements of Comparative Examples 4, X-1 to X-3, and Y-1 to Y-3 and Embodiment in Table 11, PD-5 was used as the phosphorescent dopant, and DA-16 was used as the thermally activated delayed fluorescence dopant in the light emitting element of Embodiment.

TABLE 11

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 4 | 20.5 | 37.2 | | | |
| Comparative Example X-1 | 15.2 | 23.4 | Comparative Example Y-1 | 19.7 | 30.6 |
| Comparative Example X-2 | 14.8 | 23.5 | Comparative Example Y-2 | 19.0 | 29.6 |
| Comparative Example X-3 | 14.6 | 23.8 | Comparative Example Y-3 | 19.1 | 28.9 |
| Embodiment A-5 | 20.4 | 65.7 | Embodiment A-3 | 22.2 | 71.0 |
| Embodiment A-2 | 20.0 | 64.7 | Embodiment A-4 | 21.4 | 68.3 |
| Embodiment A-6 | 19.5 | 63.0 | Embodiment A-7 | 22.4 | 70.7 |
| Embodiment B-2 | 18.7 | 62.5 | Embodiment B-3 | 21.1 | 67.0 |
| Embodiment B-7 | 20.3 | 65.8 | Embodiment B-4 | 21.7 | 71.0 |
| Embodiment B-8 | 19.8 | 62.0 | Embodiment B-5 | 21.6 | 67.6 |
| Embodiment C-2 | 19.6 | 61.7 | Embodiment C-3 | 19.5 | 64.8 |
| Embodiment C-7 | 19.8 | 62.7 | Embodiment C-4 | 20.6 | 65.6 |
| Embodiment C-8 | 18.7 | 61.1 | Embodiment C-5 | 20.1 | 64.3 |

Table 12 shows the evaluation of luminous efficiency and lifetime in the light emitting elements of Comparative Example and Embodiment including the hole transporting host and the electron transporting host of host combination 5, respectively. In the light emitting elements of Comparative Examples 5, X-1 to X-3, and Y-1 to Y-3 and Embodiment in Table 12, PD-33 was used as the phosphorescent dopant, and DA-15 was used as the thermally activated delayed fluorescence dopant in the light emitting element of Embodiment.

TABLE 12

| Element manufacturing example | Effi-ciency (cd/A) | Life-time ($T_{95}$, hr) | Element manufacturing example | Effi-ciency (cd/A) | Life-time ($T_{95}$, hr) |
|---|---|---|---|---|---|
| Comparative Example 5 | 19.7 | 37.1 | | | |
| Comparative Example X-1 | 13.5 | 21.9 | Comparative Example Y-1 | 20.3 | 29.5 |
| Comparative Example X-2 | 14.2 | 22.3 | Comparative Example Y-2 | 19.9 | 29.0 |
| Comparative Example X-3 | 14.1 | 22.4 | Comparative Example Y-3 | 19.4 | 28.8 |
| Embodiment A-5 | 20.2 | 63.0 | Embodiment A-3 | 22.1 | 72.8 |
| Embodiment A-2 | 19.7 | 62.2 | Embodiment A-4 | 21.3 | 70.8 |
| Embodiment A-6 | 19.4 | 61.1 | Embodiment A-7 | 22.4 | 72.9 |
| Embodiment B-2 | 19.0 | 60.5 | Embodiment B-3 | 21.6 | 70.1 |
| Embodiment B-7 | 20.1 | 63.6 | Embodiment B-4 | 22.3 | 73.4 |
| Embodiment B-8 | 19.7 | 60.4 | Embodiment B-5 | 21.6 | 70.0 |
| Embodiment C-2 | 19.9 | 60.8 | Embodiment C-3 | 19.9 | 67.3 |
| Embodiment C-7 | 20.1 | 62.2 | Embodiment C-4 | 21.1 | 69.1 |
| Embodiment C-8 | 18.9 | 60.4 | Embodiment C-5 | 20.8 | 67.5 |

Table 13 shows the evaluation of luminous efficiency and lifetime in the light emitting elements of Comparative Example and Embodiment including the hole transporting host and the electron transporting host of host combination 6, respectively. In the light emitting elements of Comparative Examples 6, X-1 to X-3, and Y-1 to Y-3 and Embodiment in Table 13, PD-25 was used as the phosphorescent dopant, and DA-13 was used as the thermally activated delayed fluorescence dopant in the light emitting element of Embodiment.

TABLE 13

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 6 | 19.3 | 36.4 | | | |
| Comparative Example X-1 | 14.2 | 27.5 | Comparative Example Y-1 | 19.6 | 30.3 |
| Comparative Example X-2 | 13.8 | 27.6 | Comparative Example Y-2 | 19.9 | 31.1 |
| Comparative Example X-3 | 13.7 | 27.8 | Comparative Example Y-3 | 19.5 | 30.7 |
| Embodiment A-5 | 20.6 | 63.7 | Embodiment A-3 | 24.0 | 66.3 |
| Embodiment A-2 | 20.5 | 63.4 | Embodiment A-4 | 23.3 | 63.8 |
| Embodiment A-6 | 20.3 | 62.8 | Embodiment A-7 | 23.9 | 66.2 |
| Embodiment B-2 | 19.3 | 61.4 | Embodiment B-3 | 24.3 | 67.4 |
| Embodiment B-7 | 20.6 | 64.7 | Embodiment B-4 | 24.4 | 68.9 |
| Embodiment B-8 | 20.4 | 61.8 | Embodiment B-5 | 23.6 | 72.1 |
| Embodiment C-2 | 20.8 | 62.6 | Embodiment C-3 | 21.3 | 61.4 |
| Embodiment C-7 | 20.3 | 62.8 | Embodiment C-4 | 22.3 | 62.5 |
| Embodiment C-8 | 19.7 | 61.5 | Embodiment C-5 | 22.1 | 62.0 |

Table 14 shows the evaluation of luminous efficiency and lifetime in the light emitting elements of Comparative Example and Embodiment including the hole transporting host and the electron transporting host of host combination 1, respectively. In the light emitting elements of Comparative Examples 1, X-1 to X-3, and Y-1 to Y-3 and Embodiment in Table 14, PR-5 was used as the phosphorescent dopant, and D-01 was used as the thermally activated delayed fluorescence dopant in the light emitting element of Embodiment.

TABLE 14

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 1 | 20.3 | 36.2 | | | |
| Comparative Example X-1 | 15.4 | 34.1 | Comparative Example Y-1 | 17.5 | 31.0 |
| Comparative Example X-2 | 14.1 | 35.4 | Comparative Example Y-2 | 17.3 | 29.4 |
| Comparative Example X-3 | 15.3 | 31.1 | Comparative Example Y-3 | 17.6 | 30.5 |
| Embodiment A-5 | 22.1 | 59.6 | Embodiment A-3 | 22.9 | 76.2 |
| Embodiment A-2 | 20.9 | 57.3 | Embodiment A-4 | 22.7 | 75.2 |
| Embodiment A-6 | 20.6 | 56.0 | Embodiment A-7 | 23.8 | 78.5 |
| Embodiment B-2 | 21.8 | 57.8 | Embodiment B-3 | 22.6 | 75.0 |

TABLE 14-continued

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Embodiment B-7 | 20.7 | 56.8 | Embodiment B-4 | 24.0 | 80.0 |
| Embodiment B-8 | 21.8 | 57.8 | Embodiment B-5 | 22.7 | 75.8 |
| Embodiment C-2 | 20.6 | 55.4 | Embodiment C-3 | 22.7 | 74.1 |
| Embodiment C-7 | 20.4 | 55.6 | Embodiment C-4 | 22.1 | 73.5 |
| Embodiment C-8 | 20.8 | 56.0 | Embodiment C-5 | 22.0 | 72.9 |

Table 15 shows the evaluation of luminous efficiency and lifetime in light emitting elements of Comparative Examples 2, X-1 to X-3, and Y-1 to Y-3, and Embodiment including the hole transporting host and electron transporting host of host combination 2. In the light emitting elements of Comparative Examples 2, X-1 to X-3, and Y-1 to Y-3 and Embodiment in Table 15, PR-8 was used as the phosphorescent dopant, and D-11 was used as the thermally activated delayed fluorescence dopant in the light emitting element of Embodiment.

TABLE 15

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 2 | 19.9 | 35.6 | | | |
| Comparative Example X-1 | 14.4 | 32.1 | Comparative Example Y-1 | 20.3 | 34.1 |
| Comparative Example X-2 | 14.1 | 34.2 | Comparative Example Y-2 | 18.6 | 34.7 |
| Comparative Example X-3 | 14.3 | 32.5 | Comparative Example Y-3 | 19.5 | 32.9 |
| Embodiment A-5 | 22.7 | 60.0 | Embodiment A-3 | 23.8 | 79.9 |
| Embodiment A-2 | 21.9 | 57.9 | Embodiment A-4 | 23.3 | 78.0 |
| Embodiment A-6 | 20.5 | 54.9 | Embodiment A-7 | 24.8 | 82.1 |
| Embodiment B-2 | 21.5 | 60.3 | Embodiment B-3 | 22.4 | 76.0 |
| Embodiment B-7 | 21.2 | 57.2 | Embodiment B-4 | 24.9 | 83.0 |
| Embodiment B-8 | 23.7 | 55.6 | Embodiment B-5 | 22.5 | 76.8 |
| Embodiment C-2 | 21.2 | 54.0 | Embodiment C-3 | 23.0 | 76.2 |
| Embodiment C-7 | 20.8 | 56.2 | Embodiment C-4 | 23.4 | 76.4 |
| Embodiment C-8 | 20.6 | 54.6 | Embodiment C-5 | 22.9 | 74.3 |

Table 16 shows the evaluation of luminous efficiency and lifetime in the light emitting elements of Comparative Example and Embodiment including the hole transporting host and the electron transporting host of host combination 3, respectively. In the light emitting elements of Comparative Examples 3, X-1 to X-3, and Y-1 to Y-3 and Embodiment in Table 16, PR-17 was used as the phosphorescent dopant, and D-09 was used as the thermally activated delayed fluorescence dopant in the light emitting element of Embodiment.

TABLE 16

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 3 | 19.0 | 34.6 | | | |
| Comparative Example X-1 | 13.7 | 31.7 | Comparative Example Y-1 | 19.7 | 30.7 |
| Comparative Example X-2 | 13.4 | 32.2 | Comparative Example Y-2 | 18.8 | 31.5 |
| Comparative Example X-3 | 13.5 | 33.1 | Comparative Example Y-3 | 18.5 | 30.6 |
| Embodiment A-5 | 23.2 | 58.1 | Embodiment A-3 | 24.9 | 75.1 |
| Embodiment A-2 | 22.5 | 57.1 | Embodiment A-4 | 23.9 | 72.1 |
| Embodiment A-6 | 21.5 | 54.1 | Embodiment A-7 | 25.3 | 74.6 |
| Embodiment B-2 | 20.9 | 57.6 | Embodiment B-3 | 23.5 | 70.8 |
| Embodiment B-7 | 22.5 | 56.6 | Embodiment B-4 | 25.2 | 76.7 |
| Embodiment B-8 | 23.4 | 54.5 | Embodiment B-5 | 22.9 | 69.8 |
| Embodiment C-2 | 21.6 | 53.7 | Embodiment C-3 | 22.2 | 69.6 |
| Embodiment C-7 | 22.0 | 54.2 | Embodiment C-4 | 23.7 | 70.5 |
| Embodiment C-8 | 21.1 | 53.3 | Embodiment C-5 | 23.0 | 68.9 |

Table 17 shows the evaluation of luminous efficiency and lifetime in the light emitting elements of Comparative Example and Embodiment including the hole transporting host and the electron transporting host of host combination 4, respectively. In the light emitting elements of Comparative Examples 4, X-1 to X-3, and Y-1 to Y-3 and Embodiment in Table 17, PR-19 was used as the phosphorescent dopant, and D-10 was used as the thermally activated delayed fluorescence dopant in the light emitting element of Embodiment.

TABLE 17

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 4 | 19.6 | 35.0 | | | |
| Comparative Example X-1 | 14.1 | 31.9 | Comparative Example Y-1 | 21.7 | 33.7 |
| Comparative Example X-2 | 13.8 | 32.1 | Comparative Example Y-2 | 20.9 | 32.7 |
| Comparative Example X-3 | 13.6 | 32.4 | Comparative Example Y-3 | 21.1 | 31.9 |
| Embodiment A-5 | 22.8 | 55.0 | Embodiment A-3 | 24.3 | 78.2 |
| Embodiment A-2 | 22.3 | 54.2 | Embodiment A-4 | 23.5 | 75.3 |
| Embodiment A-6 | 21.8 | 52.7 | Embodiment A-7 | 24.6 | 77.8 |
| Embodiment B-2 | 20.9 | 52.3 | Embodiment B-3 | 23.1 | 73.8 |
| Embodiment B-7 | 22.6 | 55.1 | Embodiment B-4 | 23.9 | 78.2 |
| Embodiment B-8 | 22.1 | 51.9 | Embodiment B-5 | 23.7 | 74.5 |
| Embodiment C-2 | 21.9 | 51.7 | Embodiment C-3 | 21.4 | 71.4 |
| Embodiment C-7 | 22.1 | 52.5 | Embodiment C-4 | 22.6 | 72.3 |
| Embodiment C-8 | 20.8 | 51.1 | Embodiment C-5 | 22.1 | 70.8 |

Table 18 shows the evaluation of luminous efficiency and lifetime in the light emitting elements of Comparative Example and Embodiment including the hole transporting host and the electron transporting host of host combination 5, respectively. In the light emitting elements of Comparative Examples 5, X-1 to X-3, and Y-1 to Y-3 and Embodiment in Table 18, PR-24 was used as the phosphorescent dopant, and D-07 was used as the thermally activated delayed fluorescence dopant in the light emitting element of Embodiment.

TABLE 18

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 5 | 18.8 | 35.0 | | | |
| Comparative Example X-1 | 12.7 | 30.8 | Comparative Example Y-1 | 21.8 | 32.5 |
| Comparative Example X-2 | 13.3 | 31.3 | Comparative Example Y-2 | 21.4 | 31.9 |
| Comparative Example X-3 | 13.2 | 31.5 | Comparative Example Y-3 | 20.8 | 31.7 |
| Embodiment A-5 | 22.5 | 57.5 | Embodiment A-3 | 24.3 | 76.9 |
| Embodiment A-2 | 22.0 | 56.8 | Embodiment A-4 | 23.5 | 74.9 |
| Embodiment A-6 | 21.6 | 55.8 | Embodiment A-7 | 24.6 | 77.1 |
| Embodiment B-2 | 21.2 | 55.2 | Embodiment B-3 | 23.8 | 74.2 |
| Embodiment B-7 | 22.4 | 58.1 | Embodiment B-4 | 24.5 | 77.7 |
| Embodiment B-8 | 22.0 | 55.1 | Embodiment B-5 | 23.8 | 74.0 |
| Embodiment C-2 | 22.1 | 55.5 | Embodiment C-3 | 21.9 | 71.2 |
| Embodiment C-7 | 22.4 | 56.8 | Embodiment C-4 | 23.2 | 73.0 |
| Embodiment C-8 | 21.0 | 55.1 | Embodiment C-5 | 22.9 | 71.4 |

Table 19 shows the evaluation of luminous efficiency and lifetime in the light emitting elements of Comparative Example and Embodiment including the hole transporting host and the electron transporting host of host combination 6, respectively. In the light emitting elements of Comparative Examples 6, X-1 to X-3, and Y-1 to Y-3 and Embodiment in Table 19, PR-29 was used as the phosphorescent dopant, and D-11 was used as the thermally activated delayed fluorescence dopant in the light emitting element of Embodiment.

TABLE 19

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 6 | 18.4 | 34.3 | | | |
| Comparative Example X-1 | 13.9 | 31.5 | Comparative Example Y-1 | 21.4 | 31.6 |
| Comparative Example X-2 | 13.5 | 31.6 | Comparative Example Y-2 | 21.7 | 32.4 |
| Comparative Example X-3 | 13.4 | 31.9 | Comparative Example Y-3 | 21.2 | 32.0 |
| Embodiment A-5 | 22.7 | 56.4 | Embodiment A-3 | 25.0 | 77.4 |
| Embodiment A-2 | 22.6 | 56.1 | Embodiment A-4 | 24.3 | 74.4 |
| Embodiment A-6 | 22.3 | 55.5 | Embodiment A-7 | 24.9 | 77.2 |
| Embodiment B-2 | 21.3 | 54.3 | Embodiment B-3 | 25.3 | 78.7 |

TABLE 19-continued

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Embodiment B-7 | 22.7 | 57.2 | Embodiment B-4 | 25.4 | 80.3 |
| Embodiment B-8 | 22.5 | 54.7 | Embodiment B-5 | 24.7 | 84.1 |
| Embodiment C-2 | 22.9 | 55.4 | Embodiment C-3 | 22.2 | 71.6 |
| Embodiment C-7 | 22.3 | 55.5 | Embodiment C-4 | 23.2 | 72.9 |
| Embodiment C-8 | 21.7 | 54.4 | Embodiment C-5 | 23.0 | 72.3 |

Table 20 shows the evaluation of luminous efficiency and lifetime in light emitting elements of Comparative Examples 1, X-1 to X-3, and Y-1 to Y-3, and Embodiment including the hole transporting host and electron transporting host of host combination 1. In the light emitting elements of Comparative Examples 1, X-1 to X-3, and Y-1 to Y-3 and Embodiment in Table 20, PR-5 was used as the phosphorescent dopant, and DA-02 was used as the thermally activated delayed fluorescence dopant in the light emitting element of Embodiment.

TABLE 20

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 1 | 20.3 | 36.2 | | | |
| Comparative Example X-1 | 12.5 | 29.3 | Comparative Example Y-1 | 16.5 | 31.7 |
| Comparative Example X-2 | 12.2 | 28.5 | Comparative Example Y-2 | 16.3 | 30.1 |
| Comparative Example X-3 | 12.2 | 28.8 | Comparative Example Y-3 | 16.6 | 31.2 |
| Embodiment A-5 | 21.5 | 54.4 | Embodiment A-3 | 21.8 | 70.5 |
| Embodiment A-2 | 20.3 | 52.3 | Embodiment A-4 | 21.6 | 69.6 |
| Embodiment A-6 | 20.0 | 51.1 | Embodiment A-7 | 22.6 | 72.6 |
| Embodiment B-2 | 21.2 | 52.7 | Embodiment B-3 | 21.5 | 69.4 |
| Embodiment B-7 | 20.1 | 51.8 | Embodiment B-4 | 22.8 | 74.0 |
| Embodiment B-8 | 21.2 | 52.7 | Embodiment B-5 | 21.6 | 70.1 |
| Embodiment C-2 | 20.0 | 50.5 | Embodiment C-3 | 21.6 | 68.6 |
| Embodiment C-7 | 19.8 | 50.7 | Embodiment C-4 | 21.0 | 68.0 |
| Embodiment C-8 | 20.2 | 51.1 | Embodiment C-5 | 20.9 | 67.4 |

Table 21 shows the evaluation of luminous efficiency and lifetime in light emitting elements of Comparative Examples 2, X-1 to X-3, Y-1 to Y-3, and Embodiment including the hole transporting host and electron transporting host of host combination 2. In the light emitting elements of Comparative Example 2, X-1 to X-3, and Y-1 to Y-3 and Embodiment in Table 21, PR-8 was used as the phosphorescent dopant, and DA-25 was used as the thermally activated delayed fluorescence dopant in the light emitting element of Embodiment.

TABLE 21

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 2 | 19.9 | 35.6 | | | |
| Comparative Example X-1 | 14.5 | 28.5 | Comparative Example Y-1 | 19.7 | 33.1 |
| Comparative Example X-2 | 14.3 | 28.0 | Comparative Example Y-2 | 18.1 | 33.7 |
| Comparative Example X-3 | 13.6 | 27.2 | Comparative Example Y-3 | 19.0 | 32.0 |
| Embodiment A-5 | 21.8 | 57.2 | Embodiment A-3 | 23.1 | 75.3 |
| Embodiment A-2 | 21.0 | 55.2 | Embodiment A-4 | 22.6 | 73.5 |
| Embodiment A-6 | 19.7 | 52.3 | Embodiment A-7 | 24.1 | 77.3 |
| Embodiment B-2 | 20.6 | 57.5 | Embodiment B-3 | 21.8 | 71.6 |
| Embodiment B-7 | 20.4 | 54.5 | Embodiment B-4 | 24.2 | 78.2 |
| Embodiment B-8 | 22.8 | 53.0 | Embodiment B-5 | 21.9 | 72.3 |
| Embodiment C-2 | 20.4 | 51.5 | Embodiment C-3 | 22.4 | 71.8 |
| Embodiment C-7 | 20.0 | 53.6 | Embodiment C-4 | 22.7 | 72.0 |
| Embodiment C-8 | 19.8 | 52.0 | Embodiment C-5 | 22.3 | 70.0 |

Table 22 shows the evaluation of luminous efficiency and lifetime in the light emitting elements of Comparative Example and Embodiment including the hole transporting host and the electron transporting host of host combination 3, respectively. In the light emitting elements of Comparative Example 3, X-1 to X-3, and Y-1 to Y-3 and Embodiment in Table 22, PR-17 was used as the phosphorescent dopant, and DA-17 was used as the thermally activated delayed fluorescence dopant in the light emitting element of Embodiment.

TABLE 22

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 3 | 19.0 | 34.6 | | | |
| Comparative Example X-1 | 15.3 | 24.4 | Comparative Example Y-1 | 19.1 | 32.3 |
| Comparative Example X-2 | 15.1 | 24.0 | Comparative Example Y-2 | 18.3 | 31.9 |
| Comparative Example X-3 | 14.4 | 23.3 | Comparative Example Y-3 | 18.0 | 32.2 |
| Embodiment A-5 | 22.6 | 52.9 | Embodiment A-3 | 24.4 | 69.2 |
| Embodiment A-2 | 21.9 | 52.0 | Embodiment A-4 | 23.4 | 66.4 |
| Embodiment A-6 | 20.9 | 49.3 | Embodiment A-7 | 24.8 | 68.7 |
| Embodiment B-2 | 20.3 | 52.4 | Embodiment B-3 | 23.0 | 65.2 |
| Embodiment B-7 | 21.9 | 51.5 | Embodiment B-4 | 24.7 | 70.7 |
| Embodiment B-8 | 22.7 | 49.6 | Embodiment B-5 | 22.5 | 64.3 |
| Embodiment C-2 | 21.0 | 48.9 | Embodiment C-3 | 21.8 | 64.1 |
| Embodiment C-7 | 21.4 | 49.3 | Embodiment C-4 | 23.2 | 65.0 |
| Embodiment C-8 | 20.5 | 48.5 | Embodiment C-5 | 22.6 | 63.5 |

Table 23 shows the evaluation of luminous efficiency and lifetime in the light emitting elements of Comparative Example and Embodiment including the hole transporting host and the electron transporting host of host combination 4, respectively. In the light emitting elements of Comparative Example 4, X-1 to X-3, and Y-1 to Y-3 and Embodiment in Table 23, PR-19 was used as the phosphorescent dopant, and DA-16 was used as the thermally activated delayed fluorescence dopant in the light emitting element of Embodiment.

TABLE 23

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 4 | 19.6 | 35.0 | | | |
| Comparative Example X-1 | 15.2 | 23.4 | Comparative Example Y-1 | 20.9 | 32.4 |
| Comparative Example X-2 | 14.8 | 23.5 | Comparative Example Y-2 | 20.1 | 31.5 |
| Comparative Example X-3 | 14.6 | 23.8 | Comparative Example Y-3 | 20.3 | 30.7 |
| Embodiment A-5 | 22.2 | 52.9 | Embodiment A-3 | 23.3 | 74.3 |
| Embodiment A-2 | 21.7 | 52.1 | Embodiment A-4 | 22.6 | 71.6 |
| Embodiment A-6 | 21.2 | 50.7 | Embodiment A-7 | 23.6 | 74.0 |
| Embodiment B-2 | 20.3 | 50.3 | Embodiment B-3 | 22.2 | 70.2 |
| Embodiment B-7 | 22.0 | 53.0 | Embodiment B-4 | 22.9 | 74.3 |
| Embodiment B-8 | 21.5 | 49.9 | Embodiment B-5 | 22.8 | 70.8 |
| Embodiment C-2 | 21.3 | 49.7 | Embodiment C-3 | 20.5 | 67.9 |
| Embodiment C-7 | 21.5 | 50.5 | Embodiment C-4 | 21.7 | 68.7 |
| Embodiment C-8 | 20.2 | 49.2 | Embodiment C-5 | 21.2 | 67.3 |

Table 24 shows the evaluation of luminous efficiency and lifetime in the light emitting elements of Comparative Example and Embodiment including the hole transporting host and the electron transporting host of host combination 5, respectively. In the light emitting elements of Comparative Examples 5, X-1 to X-3, and Y-1 to Y-3 and Embodiment in Table 24, PR-24 was used as the phosphorescent dopant, and DA-15 was used as the thermally activated delayed fluorescence dopant in the light emitting element of Embodiment.

TABLE 24

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 5 | 18.8 | 35.0 | | | |
| Comparative Example X-1 | 13.5 | 21.9 | Comparative Example Y-1 | 20.5 | 30.4 |
| Comparative Example X-2 | 14.2 | 22.3 | Comparative Example Y-2 | 20.2 | 29.8 |
| Comparative Example X-3 | 14.1 | 22.4 | Comparative Example Y-3 | 19.6 | 29.6 |
| Embodiment A-5 | 21.2 | 54.1 | Embodiment A-3 | 22.9 | 73.1 |
| Embodiment A-2 | 20.8 | 53.4 | Embodiment A-4 | 22.1 | 71.2 |
| Embodiment A-6 | 20.4 | 52.5 | Embodiment A-7 | 23.1 | 73.3 |
| Embodiment B-2 | 20.0 | 51.9 | Embodiment B-3 | 22.4 | 70.5 |

TABLE 24-continued

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Embodiment B-7 | 21.1 | 54.6 | Embodiment B-4 | 23.0 | 73.9 |
| Embodiment B-8 | 20.8 | 51.8 | Embodiment B-5 | 22.4 | 70.3 |
| Embodiment C-2 | 20.8 | 52.2 | Embodiment C-3 | 20.6 | 67.7 |
| Embodiment C-7 | 21.1 | 53.4 | Embodiment C-4 | 21.8 | 69.4 |
| Embodiment C-8 | 19.8 | 51.8 | Embodiment C-5 | 21.5 | 67.9 |

Table 25 shows the evaluation of luminous efficiency and lifetime in the light emitting elements of Comparative Example and Embodiment including the hole transporting host and the electron transporting host of host combination 6, respectively. In the light emitting elements of Comparative Examples 6, X-1 to X-3, and Y-1 to Y-3 and Embodiment in Table 25, PR-29 was used as the phosphorescent dopant, and DA-13 was used as the thermally activated delayed fluorescence dopant in the light emitting element of Embodiment.

TABLE 25

| Element manufacturing example | Efficiency (cd/A) | Lifetime ($T_{95}$, hr) | Element manufacturing example | Efficiency (cd/A) | Lifetime ($T_{95}$, hr) |
|---|---|---|---|---|---|
| Comparative Example 6 | 18.4 | 34.3 | | | |
| Comparative Example X-1 | 14.2 | 27.5 | Comparative Example Y-1 | 21.0 | 30.7 |
| Comparative Example X-2 | 13.8 | 27.6 | Comparative Example Y-2 | 21.3 | 31.4 |
| Comparative Example X-3 | 13.7 | 27.8 | Comparative Example Y-3 | 20.8 | 31.0 |
| Embodiment A-5 | 21.4 | 51.2 | Embodiment A-3 | 23.5 | 68.8 |
| Embodiment A-2 | 21.4 | 50.9 | Embodiment A-4 | 22.8 | 66.1 |
| Embodiment A-6 | 21.1 | 50.3 | Embodiment A-7 | 23.4 | 68.7 |
| Embodiment B-2 | 20.1 | 49.2 | Embodiment B-3 | 23.8 | 70.0 |
| Embodiment B-7 | 21.4 | 51.8 | Embodiment B-4 | 23.9 | 71.4 |
| Embodiment B-8 | 21.3 | 49.6 | Embodiment B-5 | 23.2 | 74.7 |
| Embodiment C-2 | 21.6 | 50.2 | Embodiment C-3 | 20.9 | 63.7 |
| Embodiment C-7 | 21.1 | 50.3 | Embodiment C-4 | 21.9 | 64.8 |
| Embodiment C-8 | 20.5 | 49.3 | Embodiment C-5 | 21.7 | 64.3 |

Referring to Tables 3 to 25, it may be seen that compared to the light emitting element of the Comparative Example, the light emitting element of Embodiment is superior in at least one of efficiency and lifetime. As the light emitting element of the embodiment includes an auxiliary light emitting layer including a thermally activated delayed fluorescence dopant in a light emitting area including a phosphorescent dopant, it is determined that at least one of efficiency and lifetime has improved. A light emitting element of an embodiment may include a first electrode, a second electrode disposed on the first electrode, and a light emitting area disposed between the first electrode and the second electrode and including a phosphorescent dopant, a hole transporting host, and an electron transporting host. The light emitting area may include at least one auxiliary light emitting layer spaced apart from the first electrode and the second electrode, and the auxiliary light emitting layer may include a thermally activated delayed fluorescence dopant, a hole transporting host, and an electron transporting host. As an auxiliary light emitting layer including a thermally activated delayed fluorescence dopant is disposed in a light emitting area including a phosphorescent dopant, the light emitting element of an embodiment may exhibit characteristics in which deterioration is minimized and at least one of efficiency and lifetime is improved.

The light emitting element of an embodiment may include a first light emitting layer, a second light emitting layer disposed on the first light emitting layer, and a first auxiliary light emitting layer disposed between the first light emitting layer and the second light emitting layer in a light emitting area. Each of the first light emitting layer, the second light emitting layer, and the first auxiliary light emitting layer may include a hole transporting host and an electron transporting host. The first light emitting layer may include a first phosphorescent dopant, the second light emitting layer may include a second phosphorescent dopant, and the first auxiliary light emitting layer may include a thermally activated delayed fluorescence dopant. Accordingly, the light emitting element of an embodiment may exhibit improved characteristics in at least one of efficiency and lifetime.

As the light emitting element of the embodiment includes an auxiliary light emitting layer including a thermally activated delayed fluorescence dopant in a light emitting area including a phosphorescent dopant, it shows that at least one of efficiency and lifetime has improved.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising a light emitting element, the light emitting element comprising:

a first electrode;

a second electrode disposed on the first electrode; and a light emitting area disposed between the first electrode and the second electrode, wherein the light emitting area comprises:

a first light emitting layer and a second light emitting layer;

at least one auxiliary light emitting layer comprising a first auxiliary light emitting layer;

a phosphorescent dopant comprising a first phosphorescent dopant and a second phosphorescent dopant;

a hole transporting host;

an electron transporting host; and wherein the at least one auxiliary light emitting layer comprises a thermally activated delayed fluorescence dopant, the hole transporting host, and the electron transporting host, the thermally activated delayed fluorescence dopant comprising a compound selected from Compound Group 4, the first light emitting layer comprises the first phosphorescent dopant, the second light emitting layer comprises the second phosphorescent dopant, and the first light emitting layer and the second light emitting layer are spaced apart, and the first auxiliary light emitting layer is disposed between the first light emitting layer and the second light emitting layer, and the hole transporting host and the electron transporting host are selected from any one among host combinations 1 to 6:

[Compound Group 4]

D-01

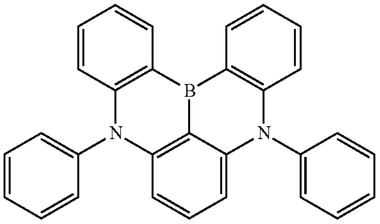

D-02

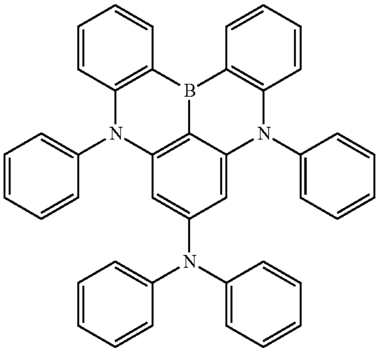

D-03

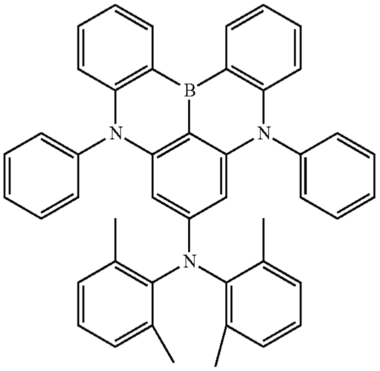

-continued
D-04
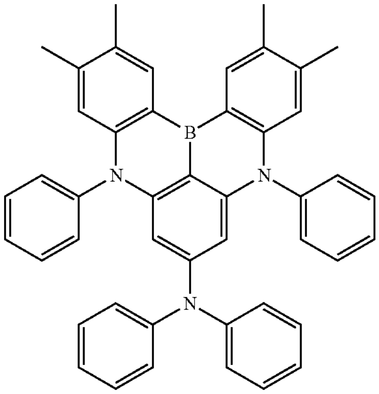
D-05
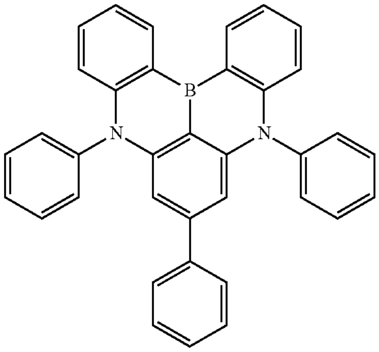
D-06
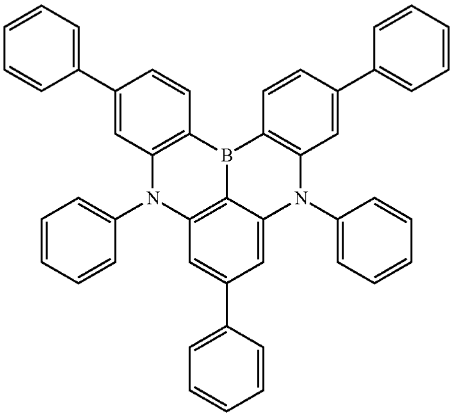
D-07
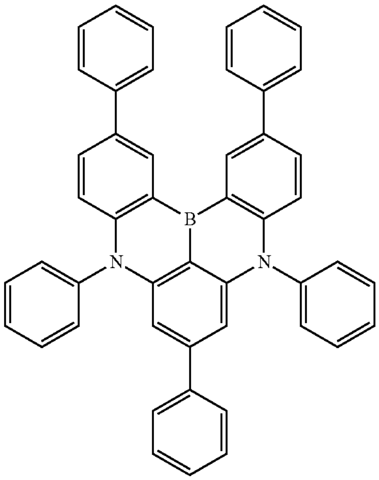
-continued
D-08
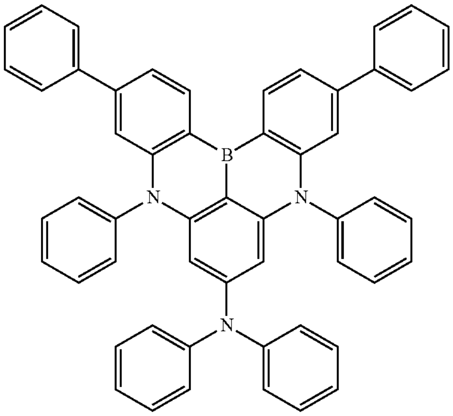
D-09
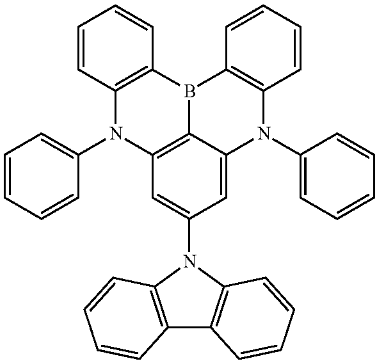
D-10
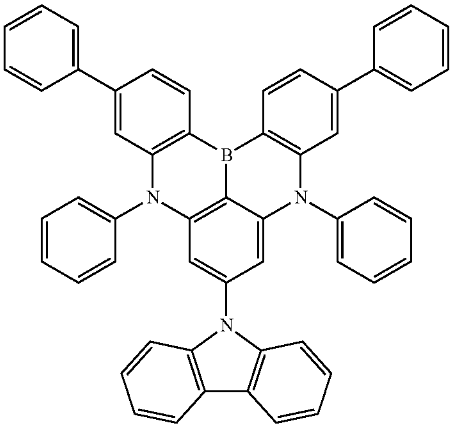

D-11
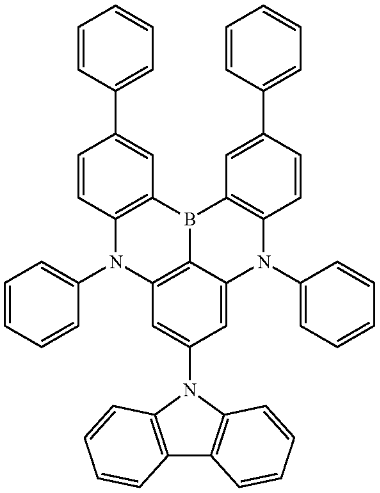
D-12
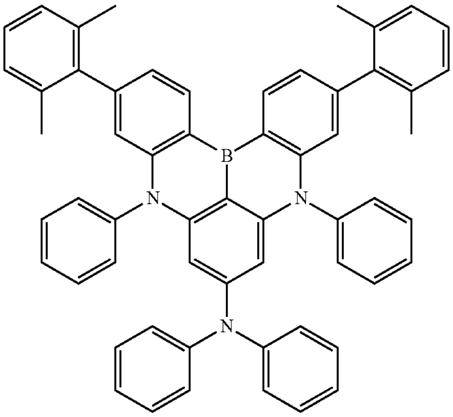
D-13
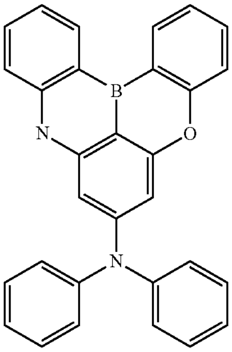
D-14
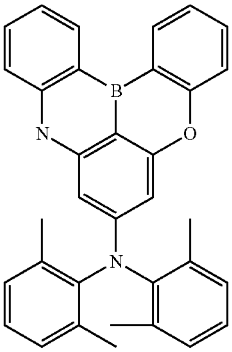
D-15
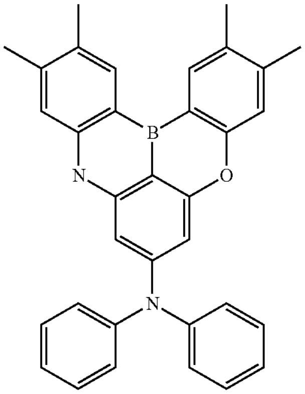
D-16
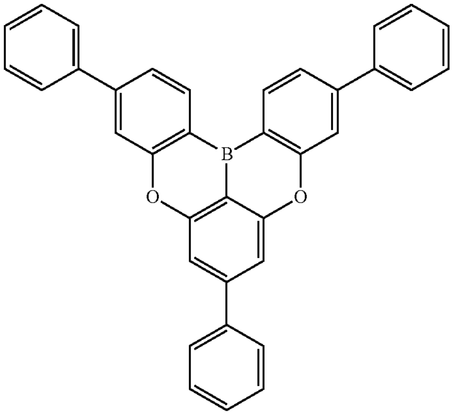
D-17
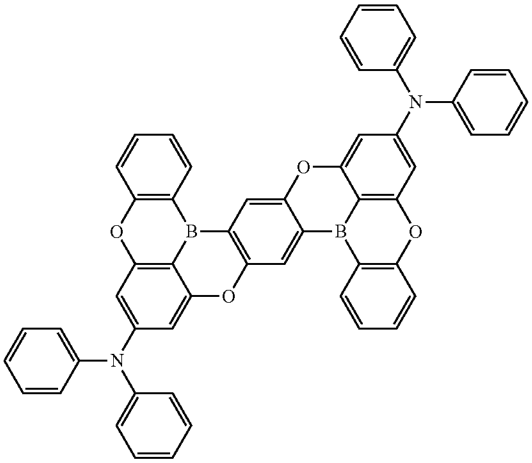

-continued
D-18
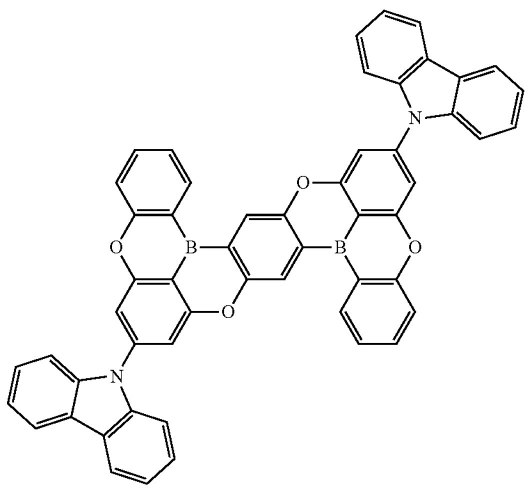
D-19
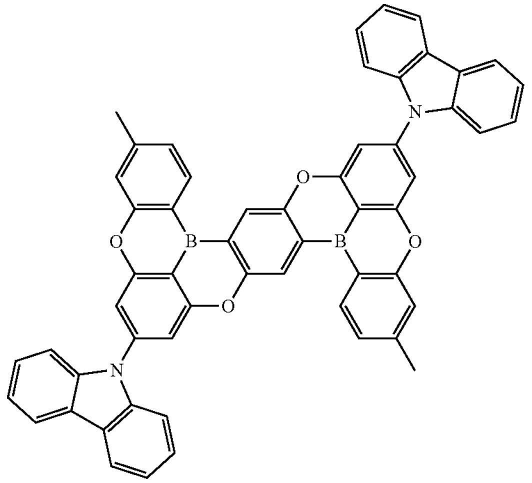
D-20
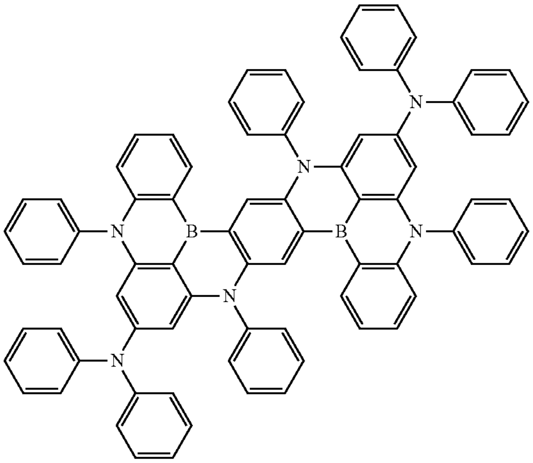
-continued
D-21
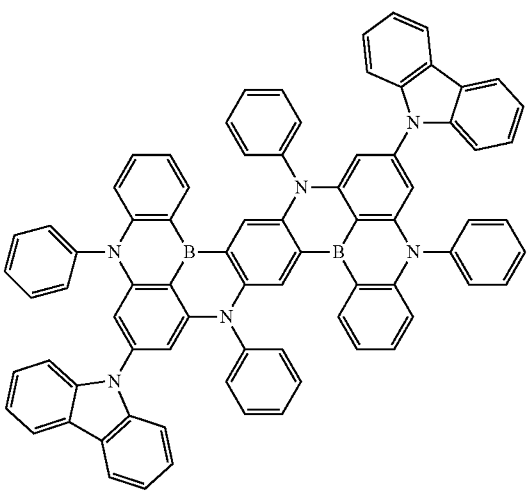
D-22
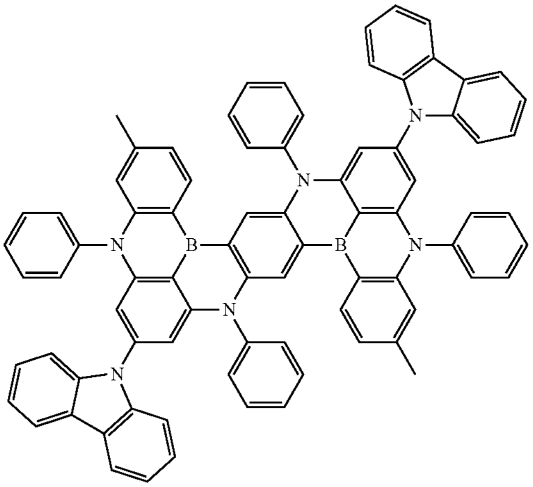
DA-01
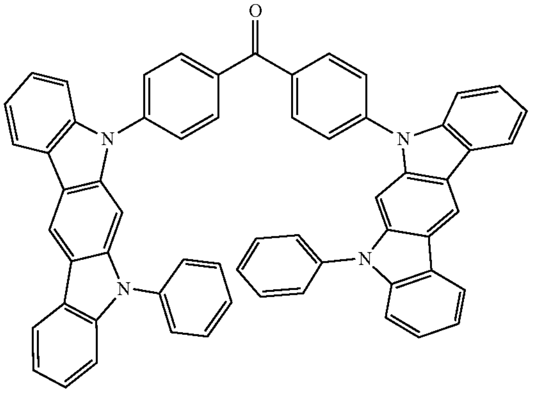

-continued
DA-02
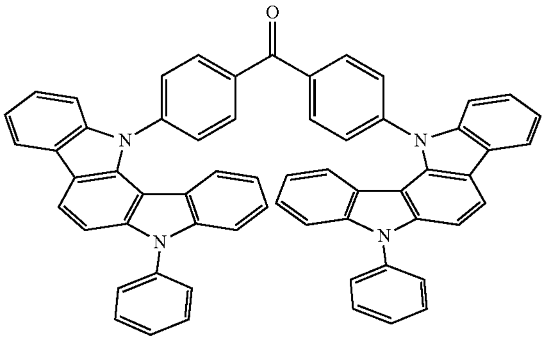
DA-03
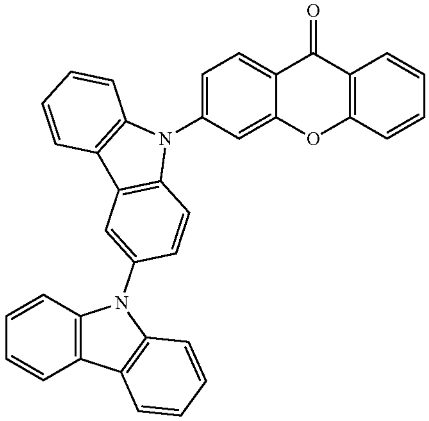
DA-04
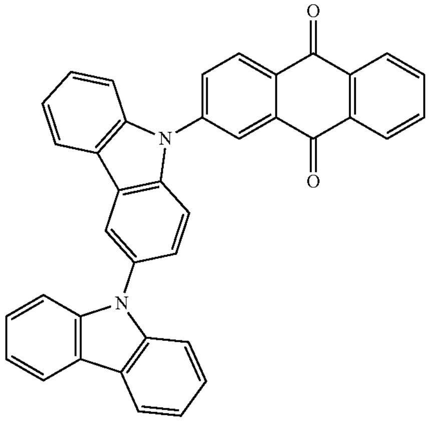
DA-05
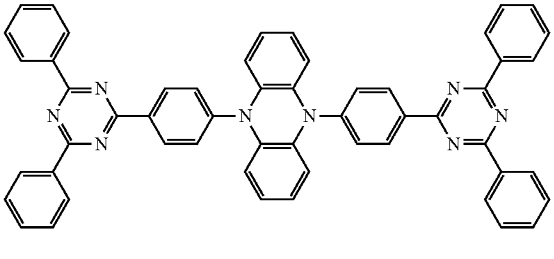
-continued
DA-06
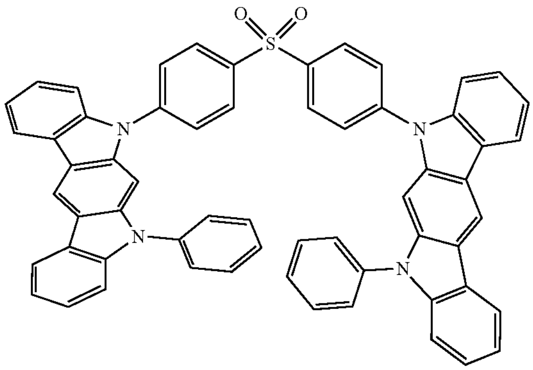
DA-07
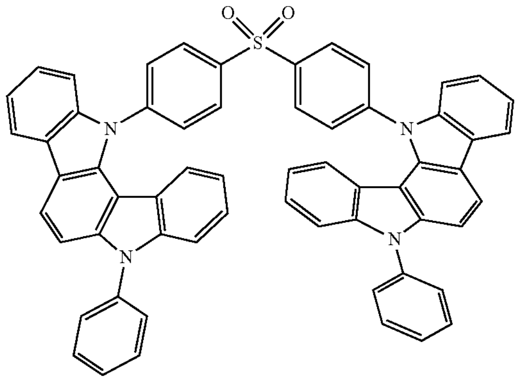
DA-08
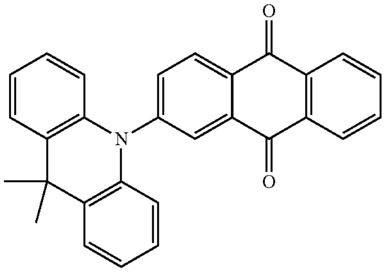
DA-09
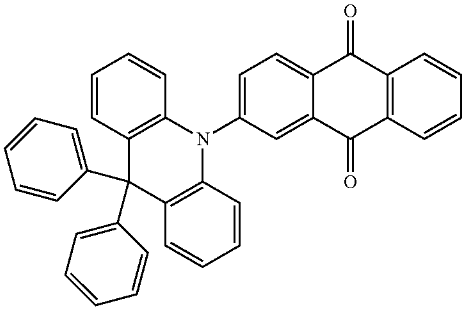
DA-10
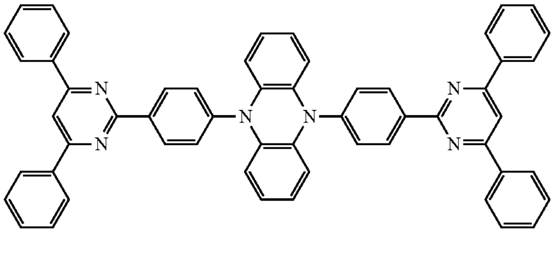

-continued
DA-11
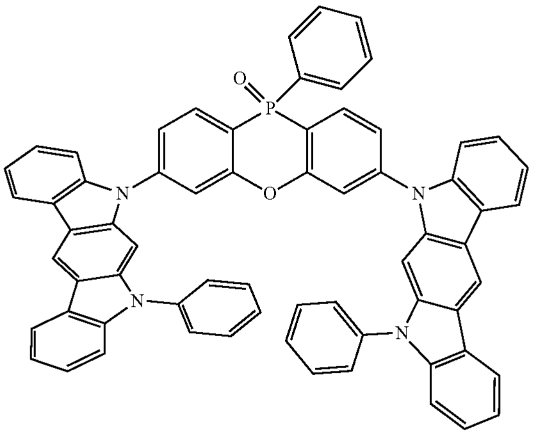
DA-12
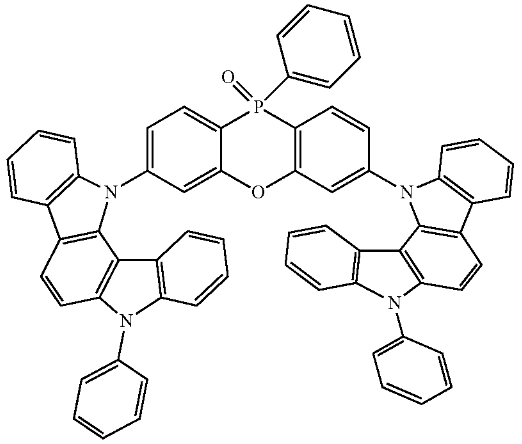
DA-13
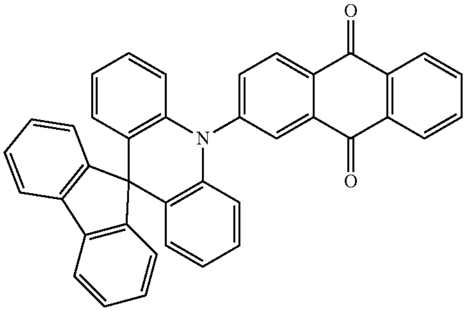
DA-14
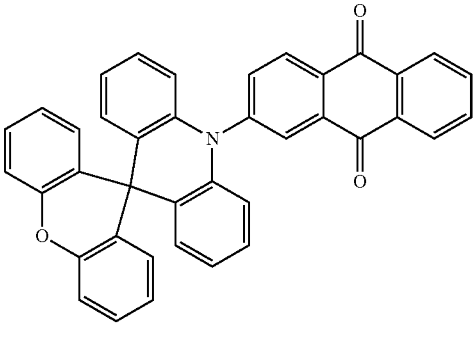
-continued
DA-15
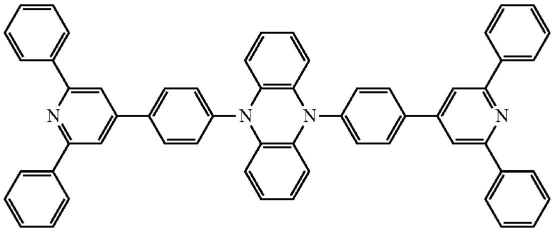
DA-16
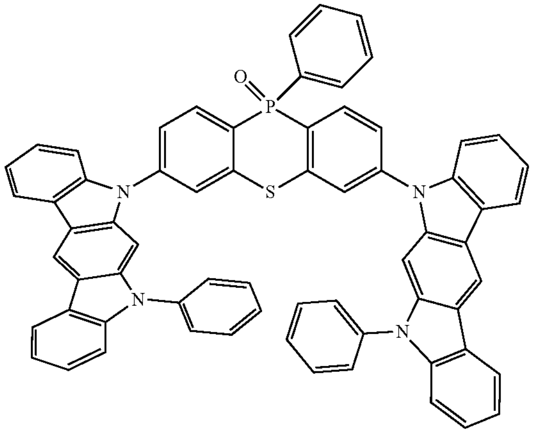
DA-17
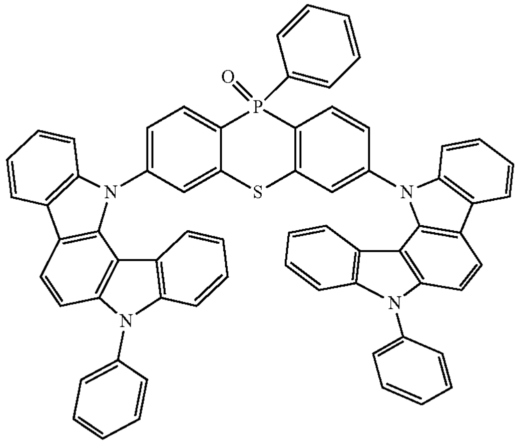
DA-18
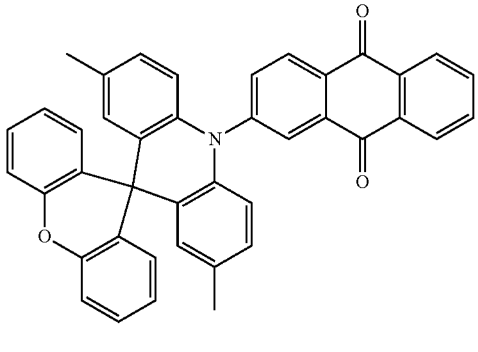

-continued
DA-19
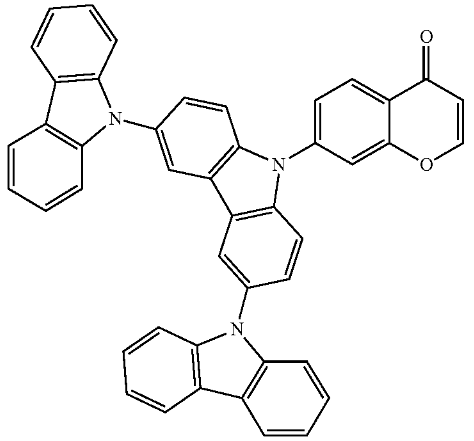
DA-20
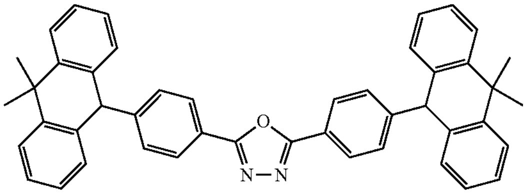
DA-21
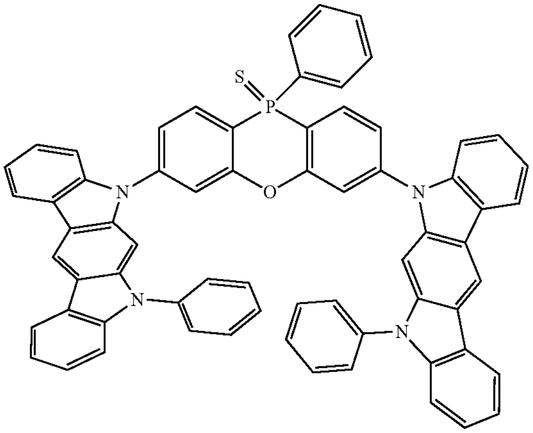
DA-22
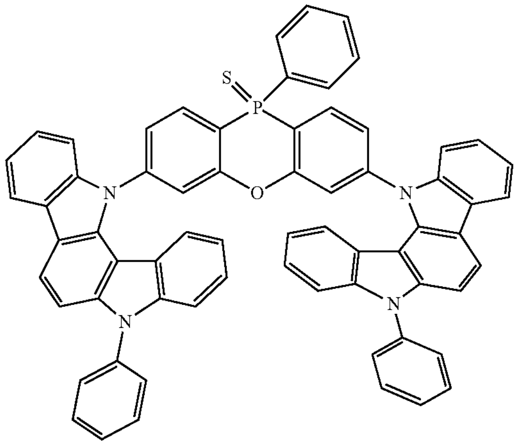
-continued
DA-23
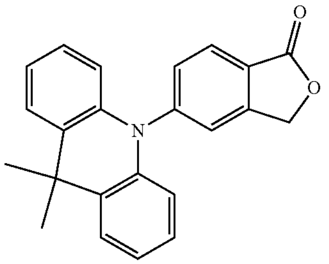
DA-24
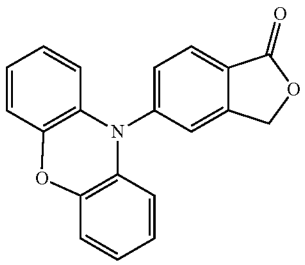
DA-25
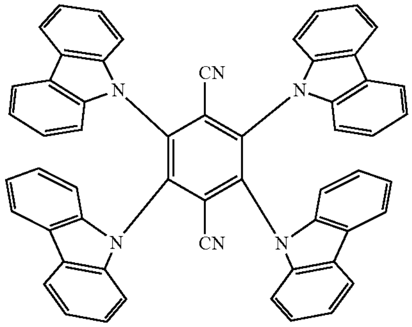
DA-26
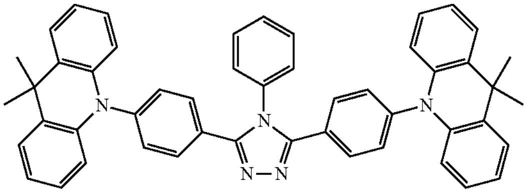

-continued
DA-27
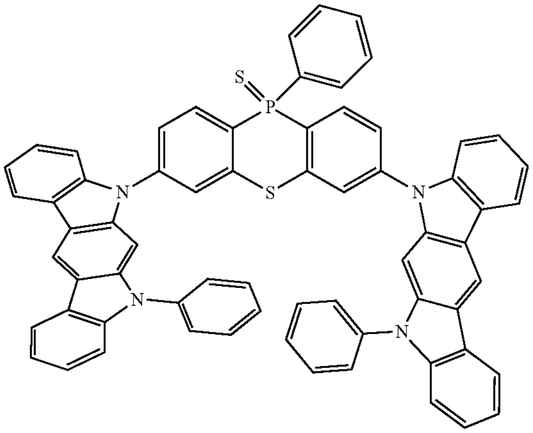
DA-28
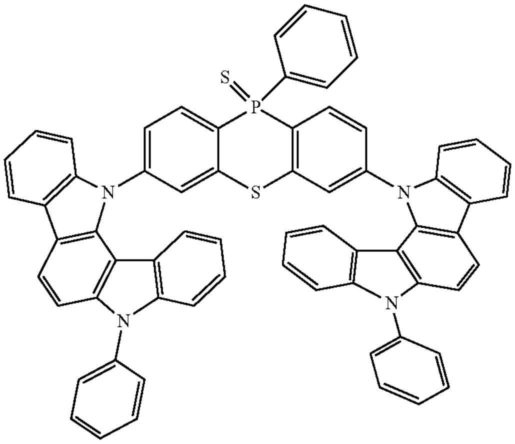
-continued
DA-29
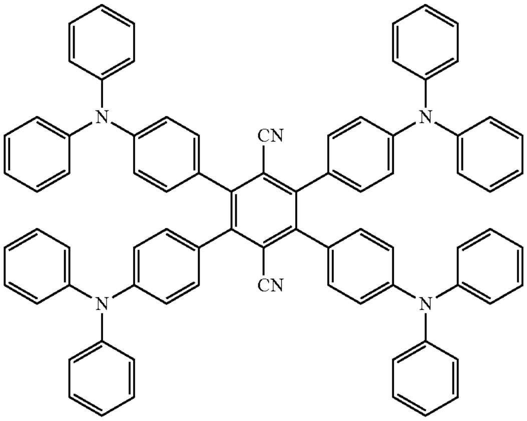
DA-30
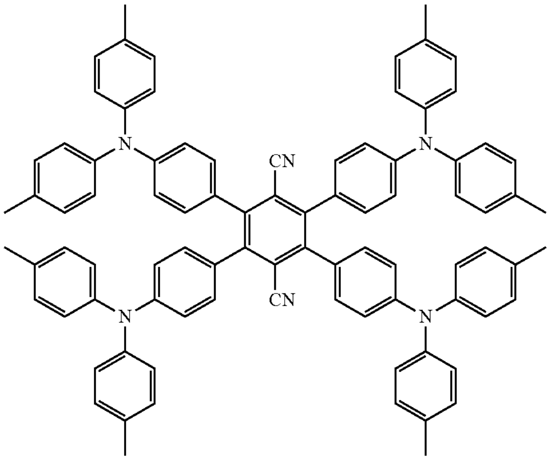
| Classification | Hole transporting host |
| --- | --- |
| Host combination 1 | 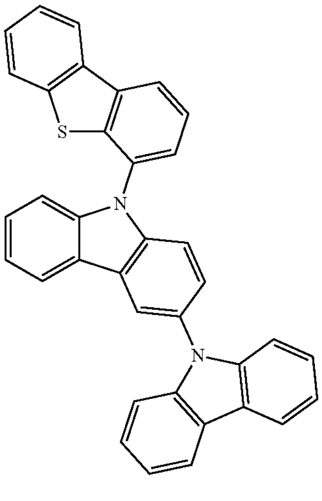 HT-10 |

-continued
Host combination 2
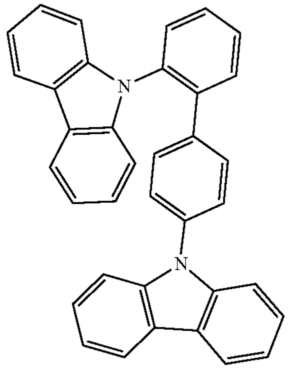 [SMILES: c1ccc(-n2c3ccccc3c3ccccc32)c(-c2ccc(-n3c4ccccc4c4ccccc43)cc2)c1]
HT-06
Host combination 3
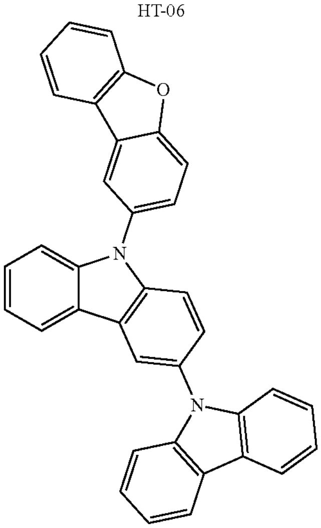
HT-12
Host combination 4
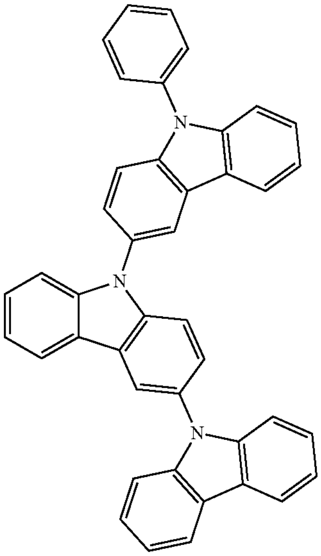 [SMILES: c1ccc(-n2c3ccccc3c3cc(-n4c5ccccc5c5cc(-n6c7ccccc7c7ccccc76)ccc54)ccc32)cc1]
HT-15

-continued
| | |
|---|---|
| Host combination 5 | 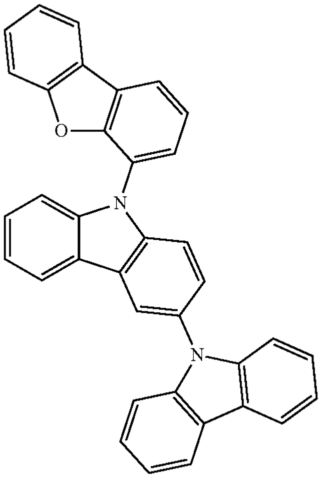 HT-11 |
| Host combination 6 | 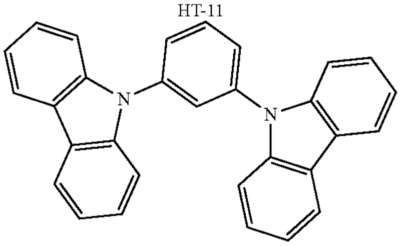 HT-02 |
| Classification | Electron transporting host |
|---|---|
| Host combination 1 | 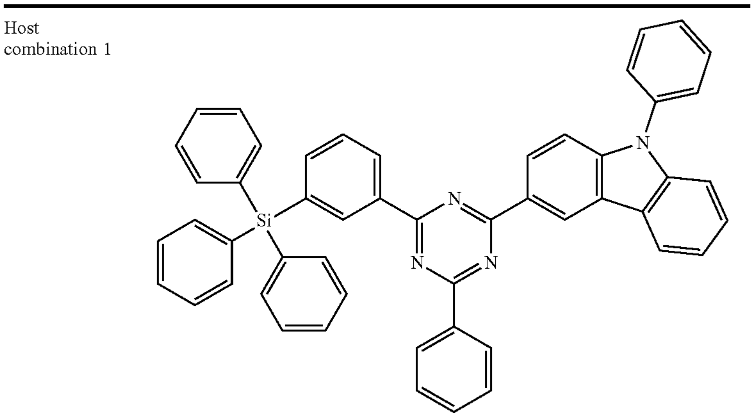 ET04 |
| Host combination 2 | 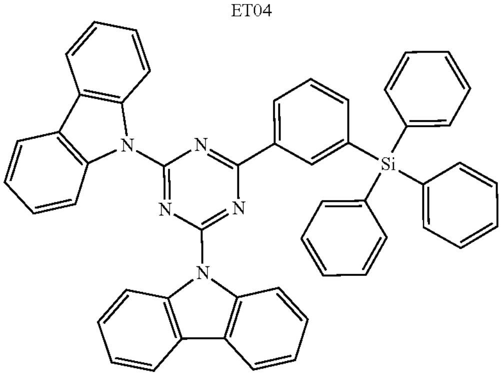 ET015 |

-continued
Host combination 3
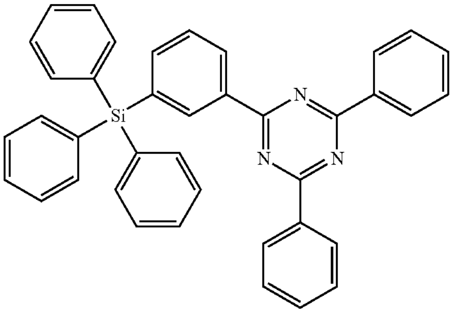 [SMILES: c1ccc(-c2nc(-c3ccccc3)nc(-c3cccc([Si](c4ccccc4)(c4ccccc4)c4ccccc4)c3)n2)cc1]
ET08
Host combination 4
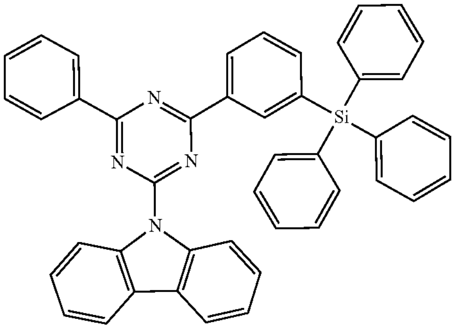 [SMILES: c1ccc(-c2nc(-c3cccc([Si](c4ccccc4)(c4ccccc4)c4ccccc4)c3)nc(-n3c4ccccc4c4ccccc43)n2)cc1]
ET06
Host combination 5
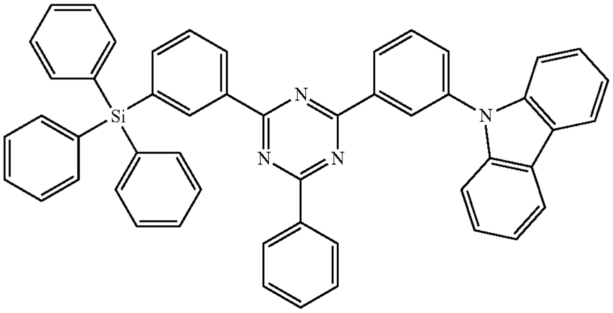 [SMILES: c1ccc(-c2nc(-c3cccc(-n4c5ccccc5c5ccccc54)c3)nc(-c3cccc([Si](c4ccccc4)(c4ccccc4)c4ccccc4)c3)n2)cc1]
ET05
Host combination 6
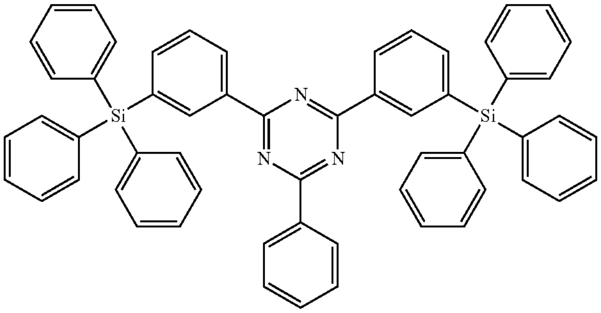 [SMILES: c1ccc(-c2nc(-c3cccc([Si](c4ccccc4)(c4ccccc4)c4ccccc4)c3)nc(-c3cccc([Si](c4ccccc4)(c4ccccc4)c4ccccc4)c3)n2)cc1]
ET02.

2. The display device of claim 1, wherein the at least one auxiliary light emitting layer does not comprise the phosphorescent dopant.

3. The display device of claim 1, wherein
the second phosphorescent dopant is different from the first phosphorescent dopant.

4. The display device of claim 1, wherein the first light emitting layer and the second light emitting layer do not comprise the thermally activated delayed fluorescence dopant.

5. The display device of claim 1, wherein
the at least one auxiliary light emitting layer further comprises a second auxiliary light emitting layer spaced apart from the first auxiliary light emitting layer, and
the second auxiliary light emitting layer is included in the first light emitting layer or in the second light emitting layer.

6. The display device of claim 5, wherein
the at least one auxiliary light emitting layer further comprises a third auxiliary light emitting layer spaced apart from the first auxiliary light emitting layer and the second auxiliary light emitting layer,
the second auxiliary light emitting layer is included in the first light emitting layer, and
the third auxiliary light emitting layer is included in the second light emitting layer.

7. The display device of claim 1, wherein
the light emitting area comprises a lower light emitting layer, a middle light emitting layer, and an upper light emitting layer,
each of the first light emitting layer and the second light emitting layer is one selected from among the lower light emitting layer, the middle light emitting layer, and the upper light emitting layer,
each of the lower light emitting layer, the middle light emitting layer, and the upper light emitting layer has a different concentration of the phosphorescent dopant, and
the lower light emitting layer, the middle light emitting layer, and the upper light emitting layer are sequentially stacked in a thickness direction.

8. The display device of claim 7, wherein the at least one auxiliary light emitting layer is included in at least one of the lower light emitting layer, the middle light emitting layer, or the upper light emitting layer.

9. The display device of claim 7, wherein
the at least one auxiliary light emitting layer is disposed between the lower light emitting layer and the middle light emitting layer, or
the at least one auxiliary light emitting layer is disposed between the middle light emitting layer and the upper light emitting layer.

10. The display device of claim 7, wherein
a concentration of the phosphorescent dopant increases sequentially from the lower light emitting layer to the upper light emitting layer, or
a concentration of the phosphorescent dopant decreases sequentially from the lower light emitting layer to the upper light emitting layer.

11. The display device of claim 1, wherein the hole transporting host and the electron transporting host form an exciplex.

12. The display device of claim 1, further comprising:
a hole transport region disposed between the first electrode and the light emitting area; and
an electron transport region disposed between the light emitting area and the second electrode.

13. The display device of claim 1, wherein the phosphorescent dopant comprises a compound selected from Compound Group 3:

[Compound Group 3]

PD-1

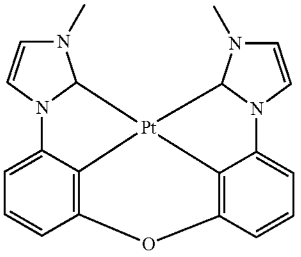

PD-2

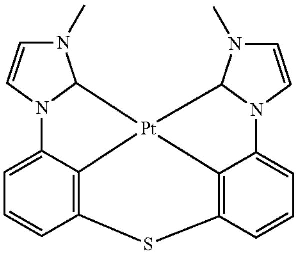

PD-3

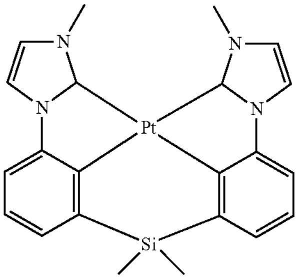

PD-4

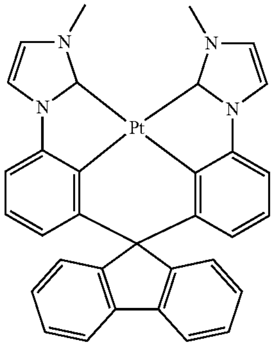

PD-5

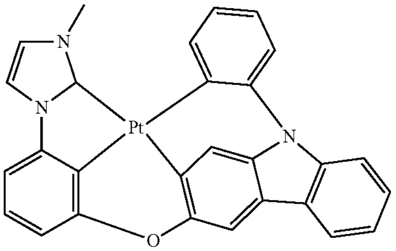

-continued
PD-6
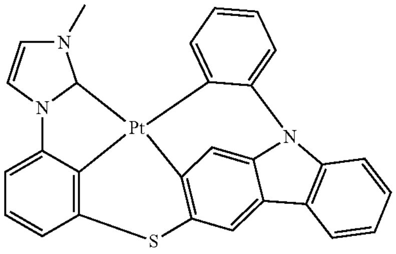
PD-7
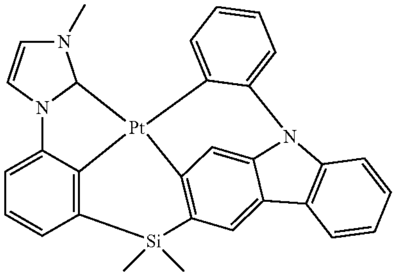
PD-8
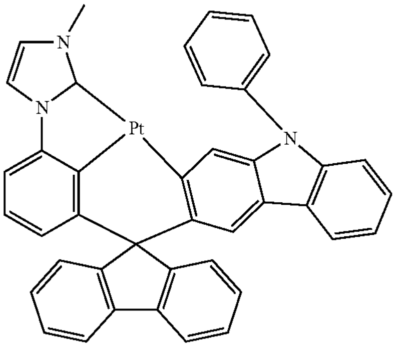
PD-9
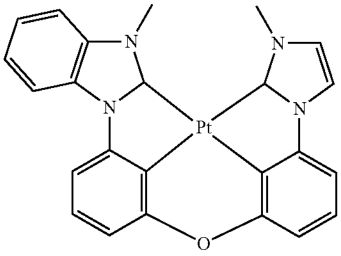
PD-10
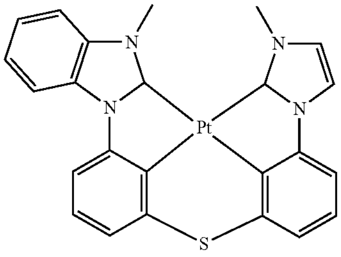
-continued
PD-11
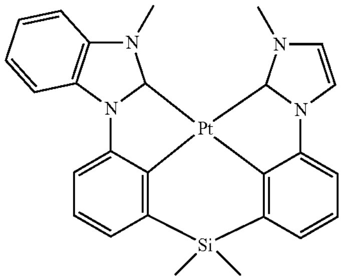
PD-12
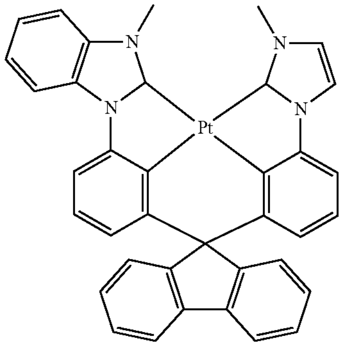
PD-13
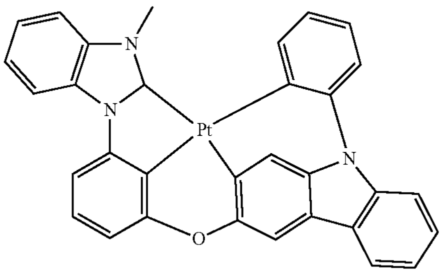
PD-14
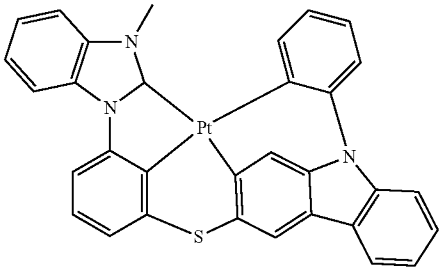
PD-15
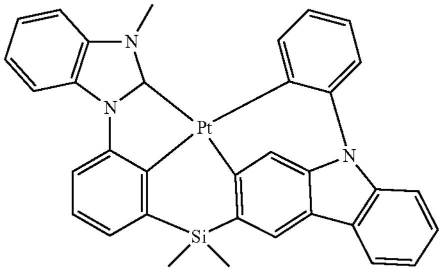

PD-16
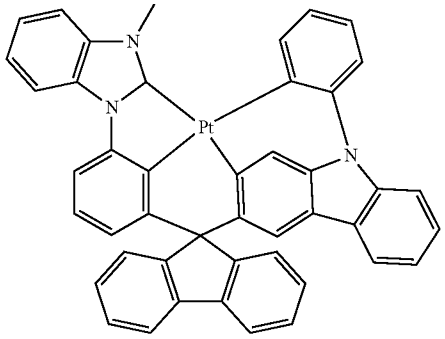
PD-17
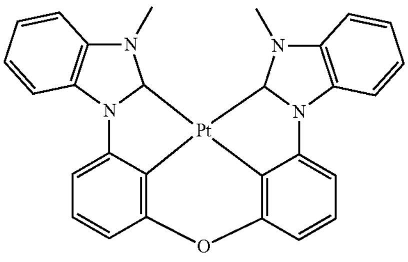
PD-18
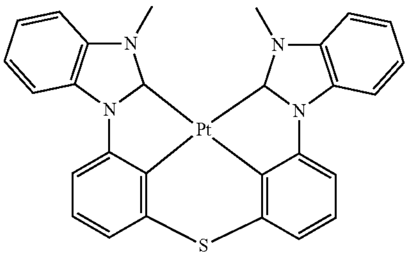
PD-19
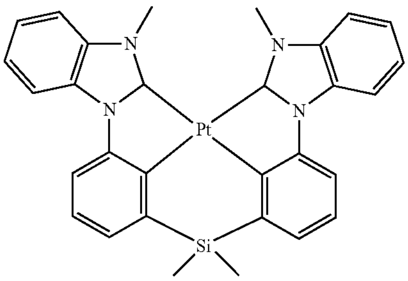
PD-20
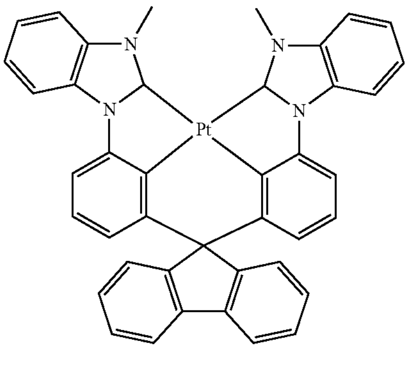
PD-21
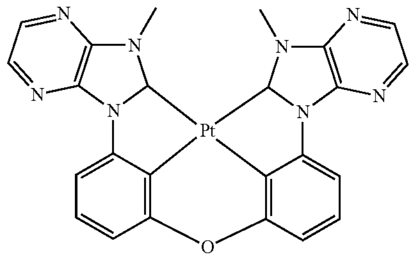
PD-22
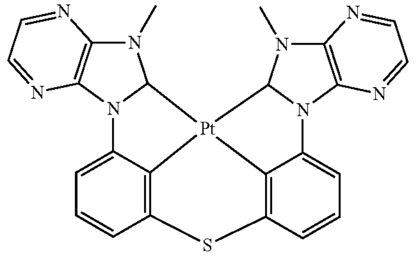
PD-23
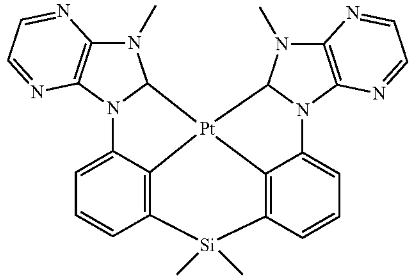
PD-24
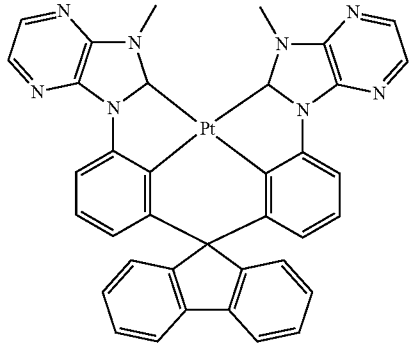
PD-25
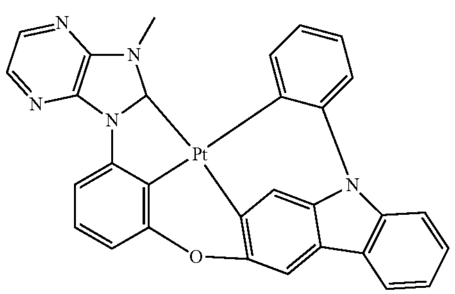

-continued
PD-26
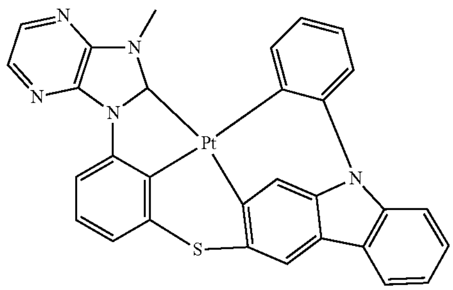
PD-27
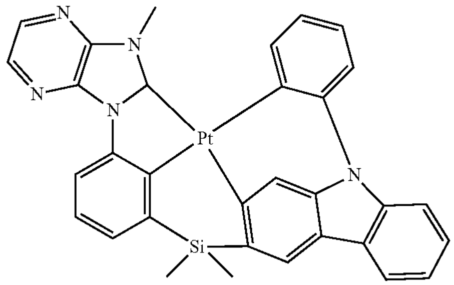
PD-28
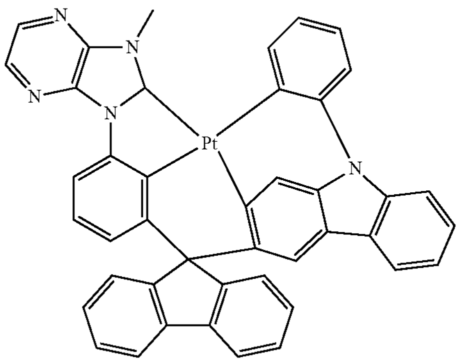
PD-29
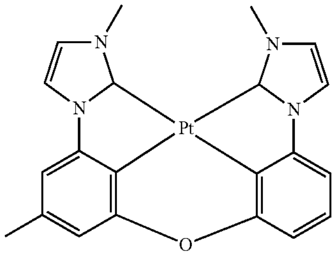
PD-30
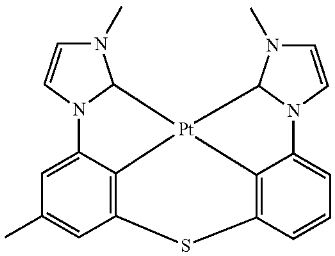
-continued
PD-31
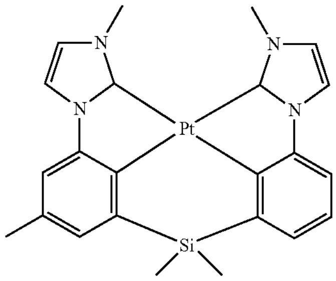
PD-32
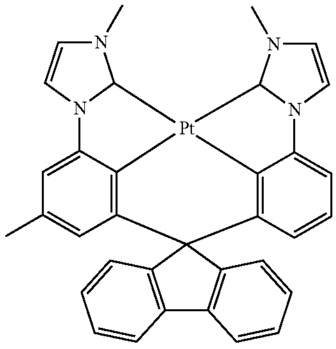
PD-33
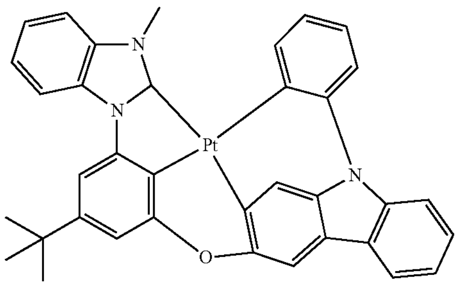
PD-34
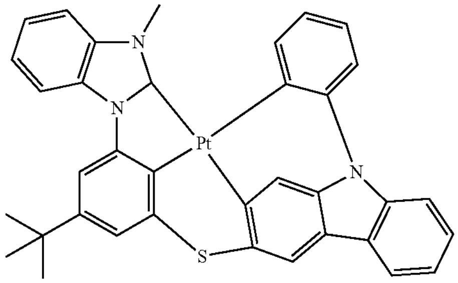
PD-35
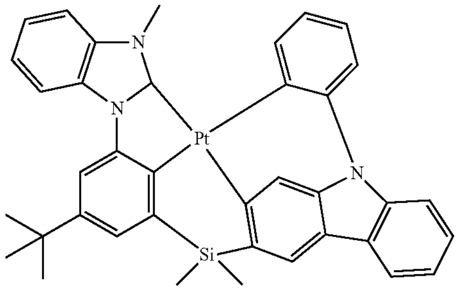

-continued
PD-36
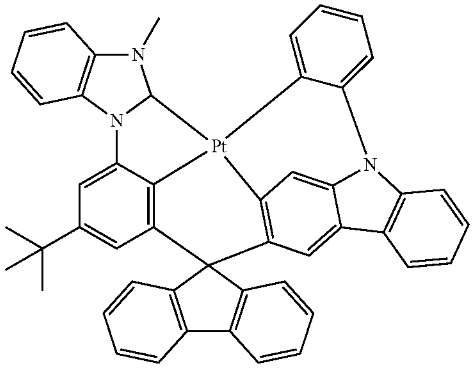
PD-37
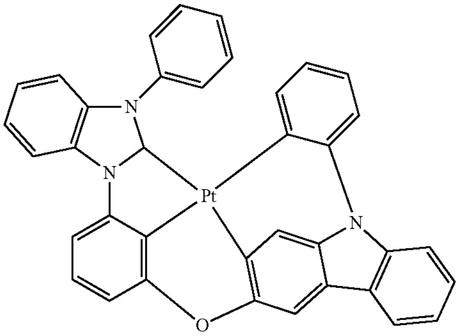
PD-38
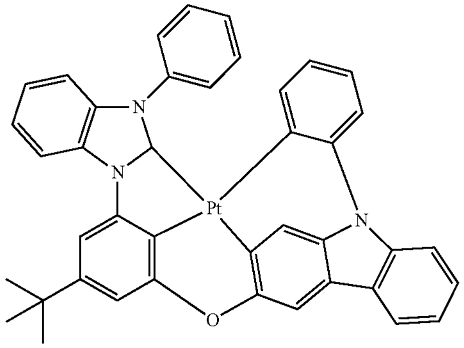
PR-1
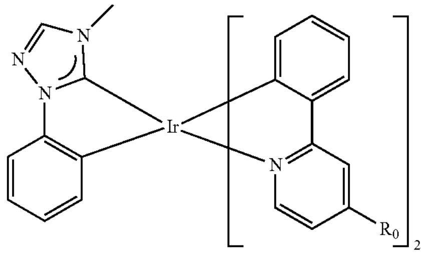
PR-2
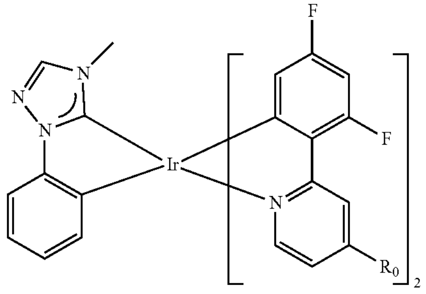
-continued
PR-3
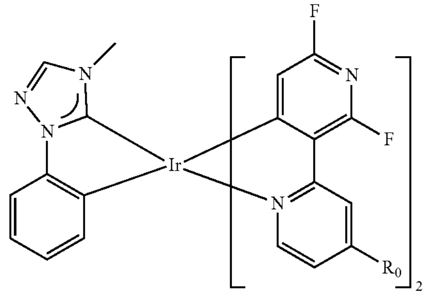
PR-4
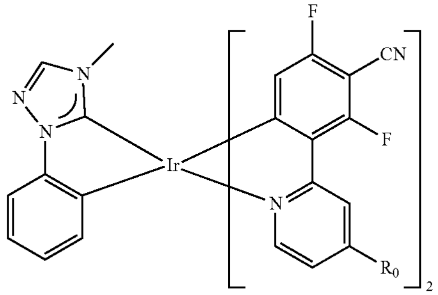
PR-5
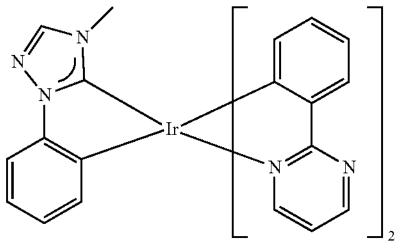
PR-6
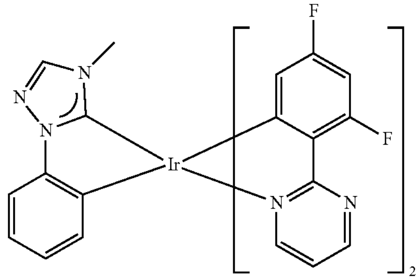
PR-7
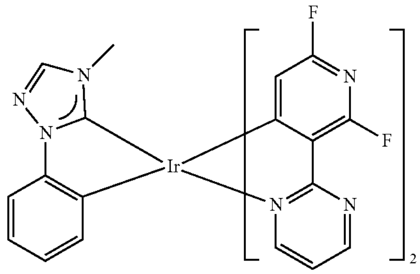

-continued
PR-8
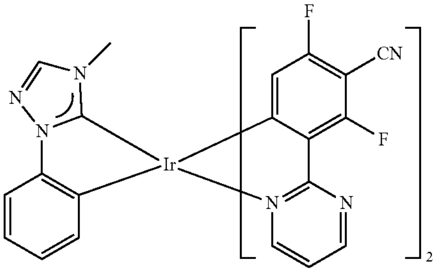
PR-9
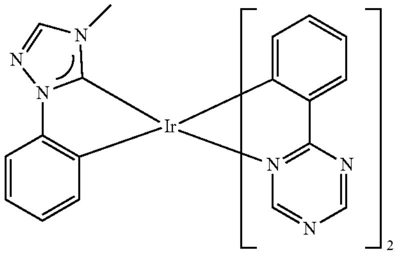
PR-10
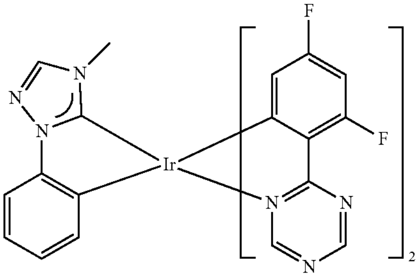
PR-11
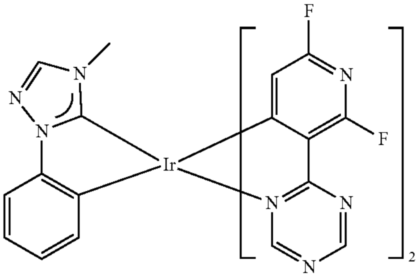
PR-12
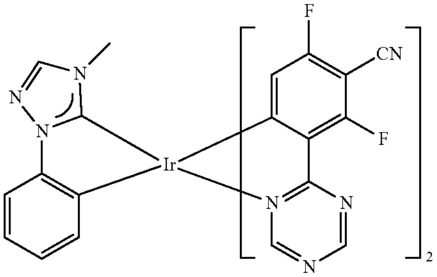
-continued
PR-13
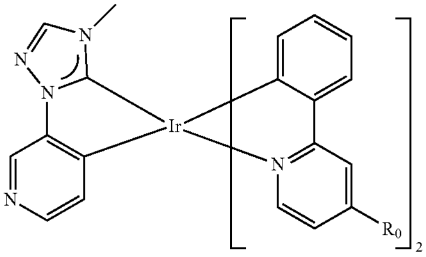
PR-14
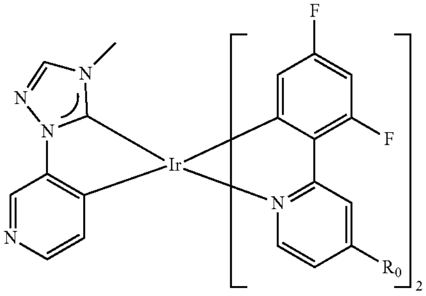
PR-15
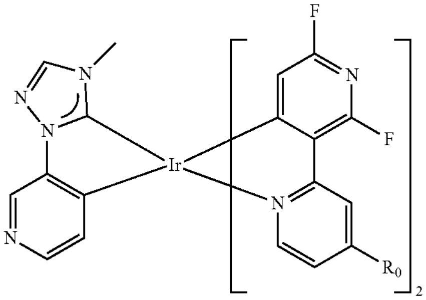
PR-16
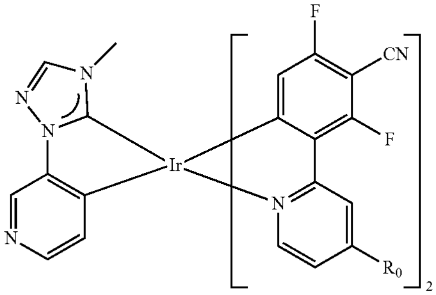
PR-17
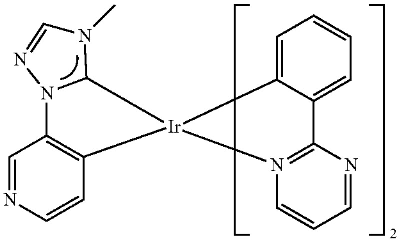

PR-18
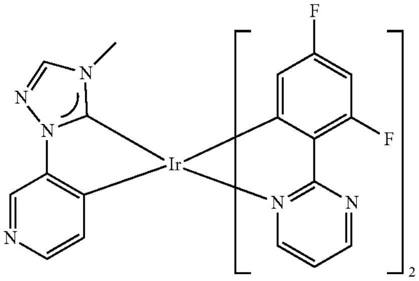
PR-19
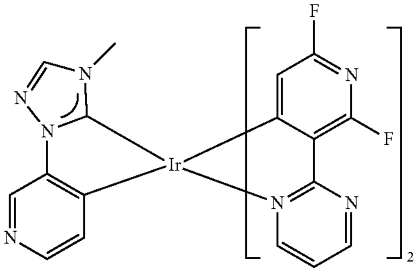
PR-20
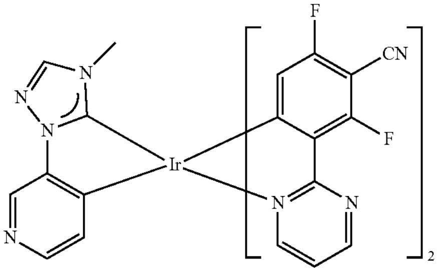
PR-21
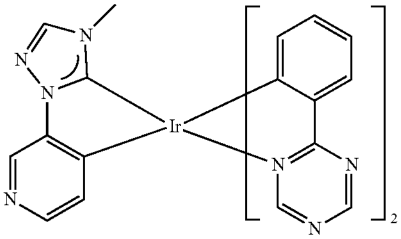
PR-22
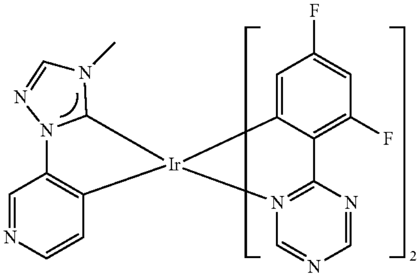
PR-23
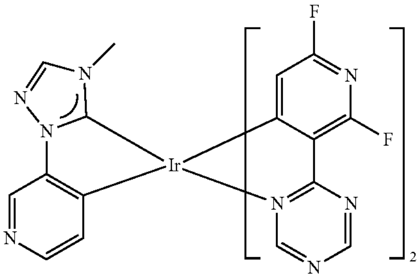
PR-24
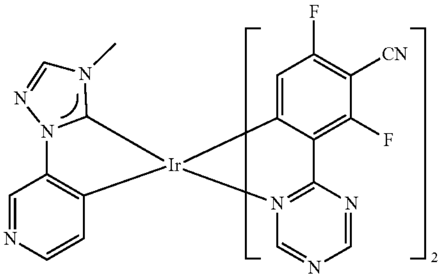
PR-25
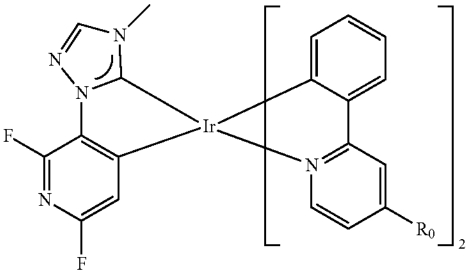
PR-26
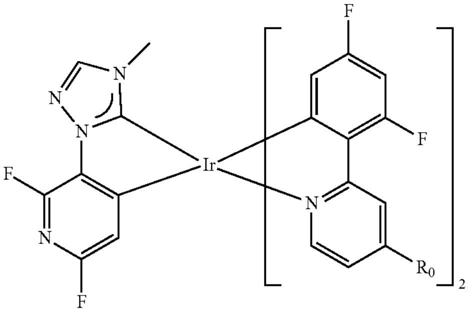
PR-27
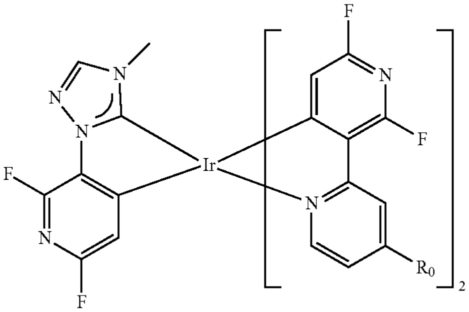

-continued

PR-28

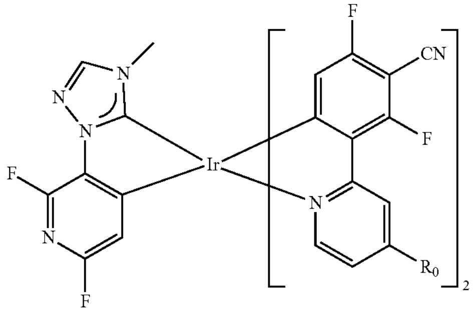

PR-29

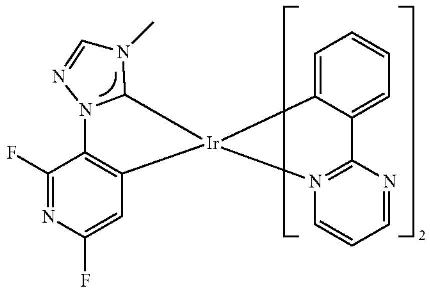

PR-30

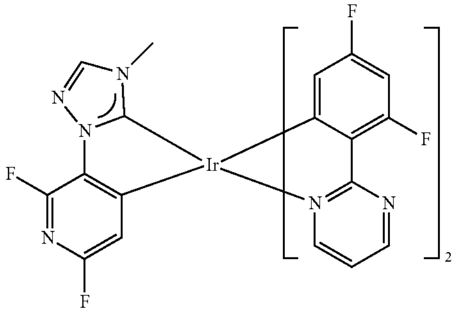

PR-31

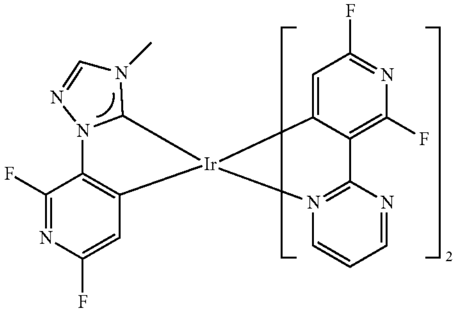

PR-32

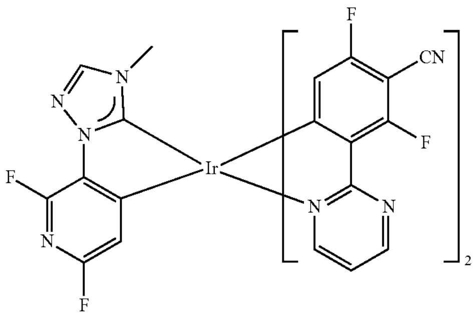

-continued

PR-33

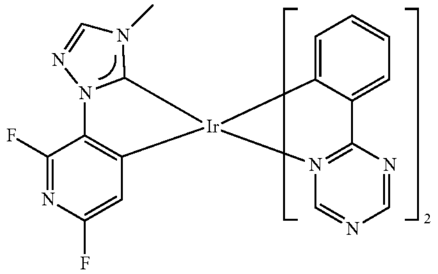

PR-34

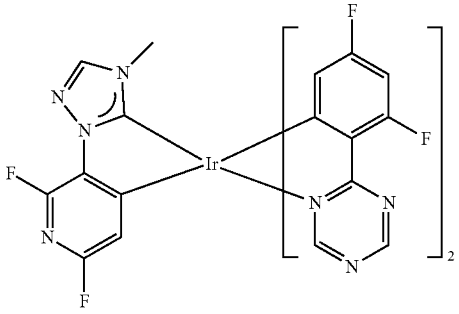

PR-35

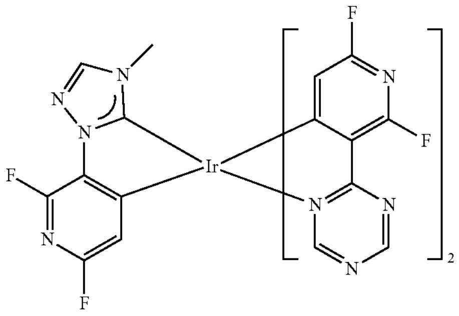

PR-36

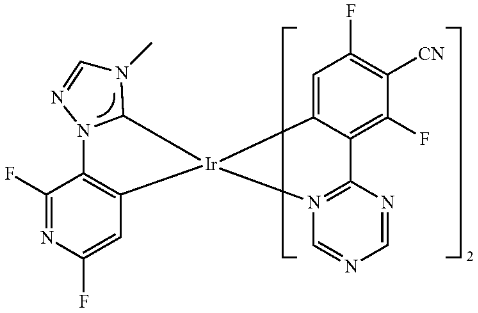

wherein in Compound Group 3, $R_0$ is a hydrogen atom, a methyl group, an isopropyl group, a t-butyl group, or a dimethylamine group.

14. A light emitting element comprising:

a first electrode;

a second electrode disposed on the first electrode; and a light emitting area disposed between the first electrode and the second electrode, wherein the light emitting area comprises:

a first light emitting layer disposed on the first electrode and including a first phosphorescent dopant, a hole transporting host, and an electron transporting host;

a second light emitting layer disposed on the first light emitting layer and including a second phosphorescent dopant, the hole transporting host, and the electron transporting host; and a first auxiliary light emitting layer disposed between the first light emitting layer and the second light emitting layer and including a thermally activated delayed fluorescence dopant, the hole transporting host, and the electron transporting host, the thermally activated delayed fluorescence dopant comprising a compound selected from Compound Group 4, wherein the hole transporting host and the electron transporting host are selected from any one among host combinations 1 to 6:

[Compound Group 4]

D-01

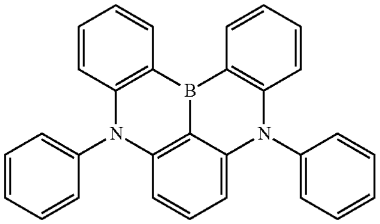

D-02

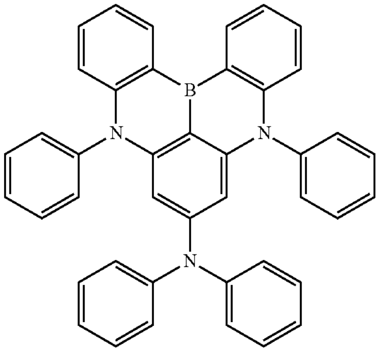

D-03

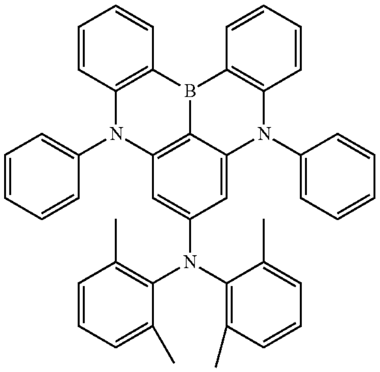

-continued

D-04

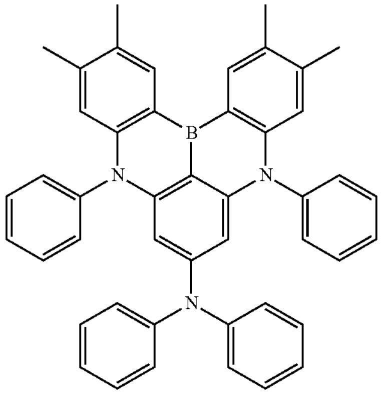

D-05

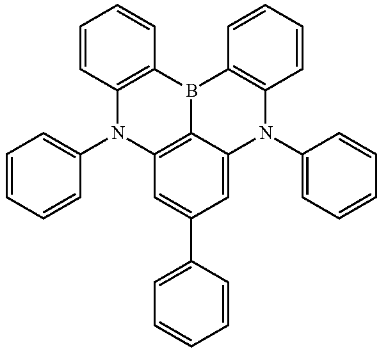

D-06

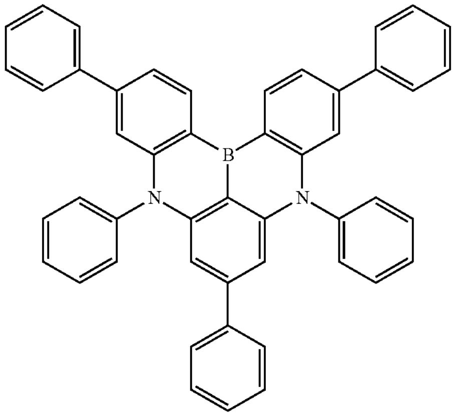

D-07

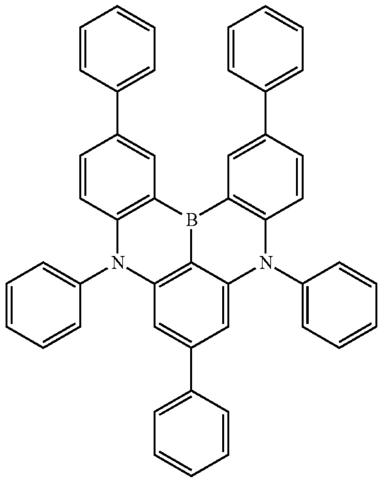

-continued
D-08
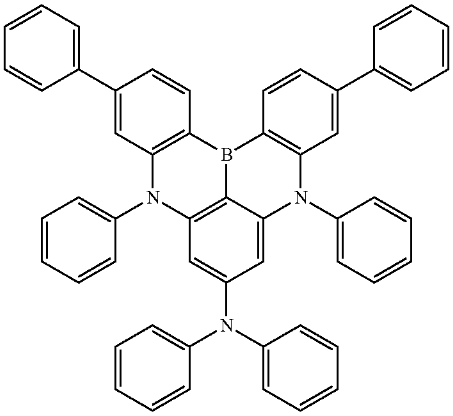
D-09
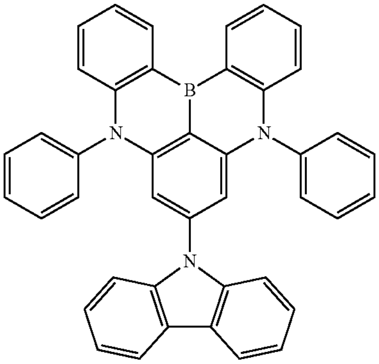
D-10
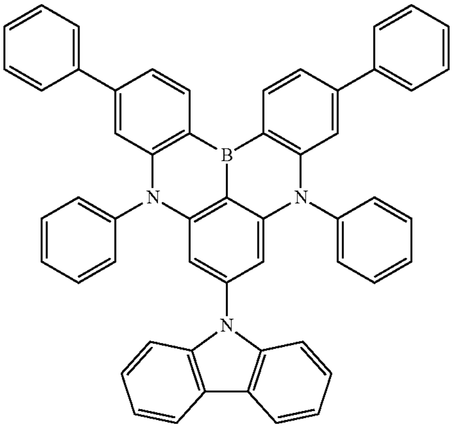
-continued
D-11
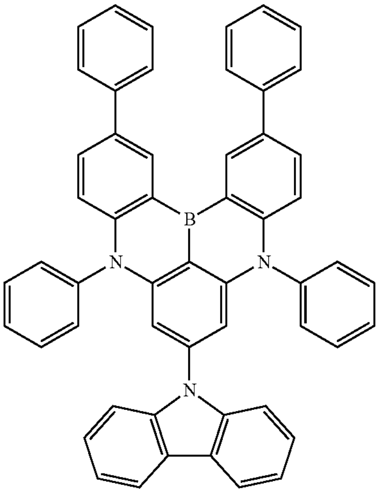
D-12
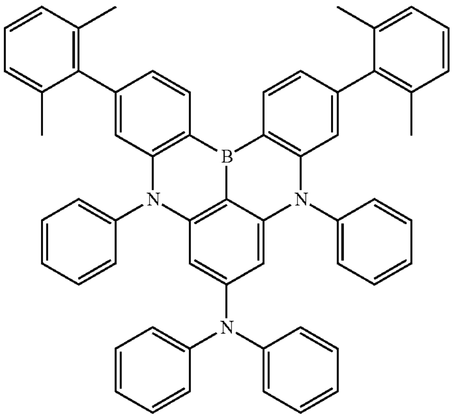
D-13
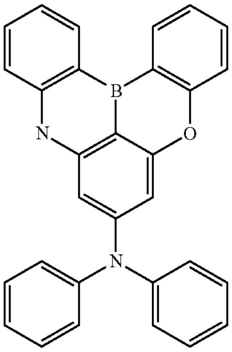
D-14
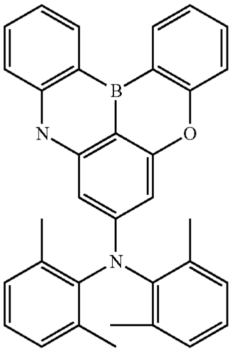

-continued
D-15
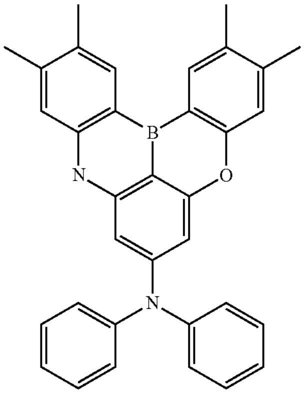
D-16
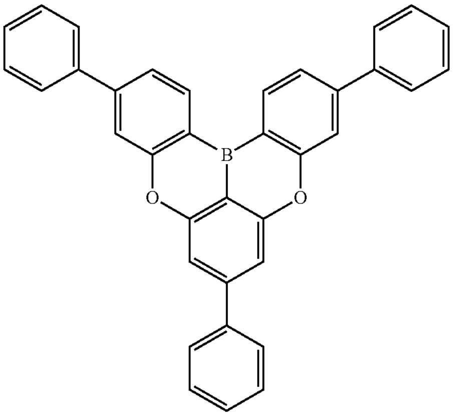
D-17
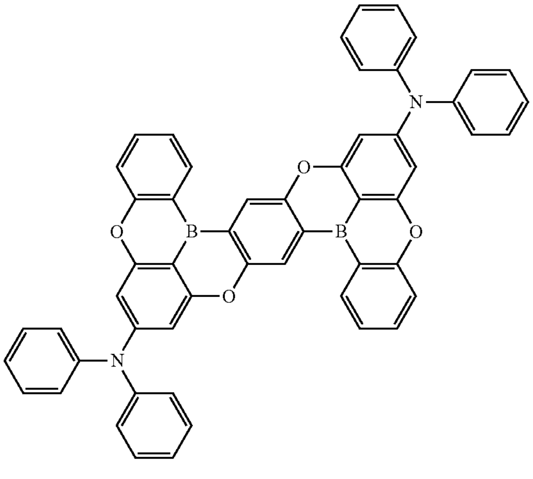
-continued
D-18
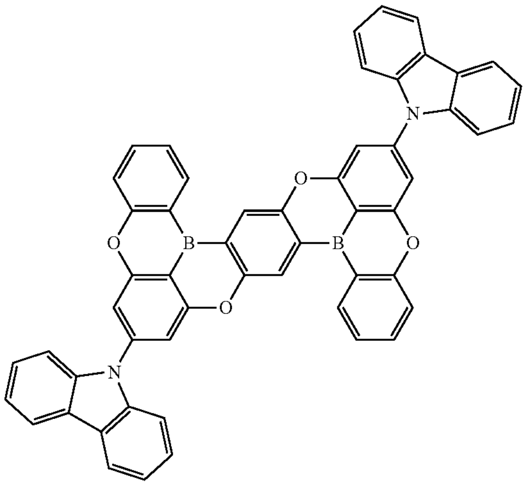
D-19
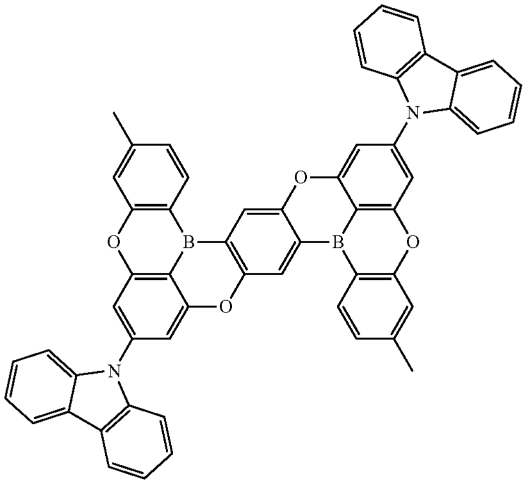
D-20
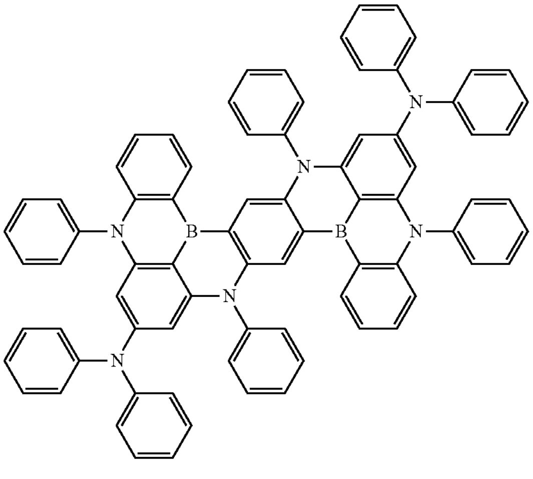

-continued
D-21
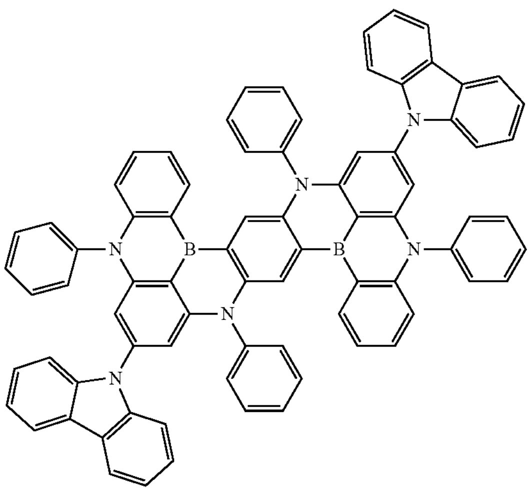
D-22
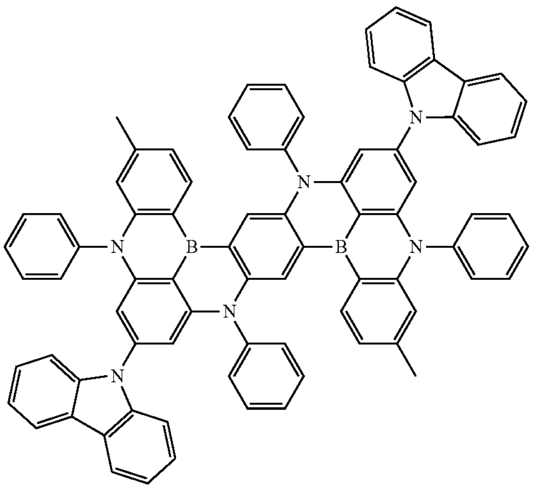
DA-01
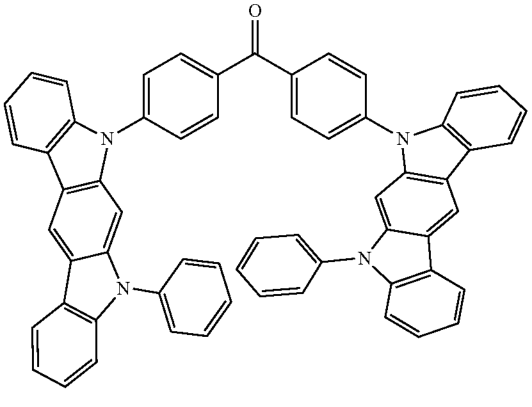
-continued
DA-02
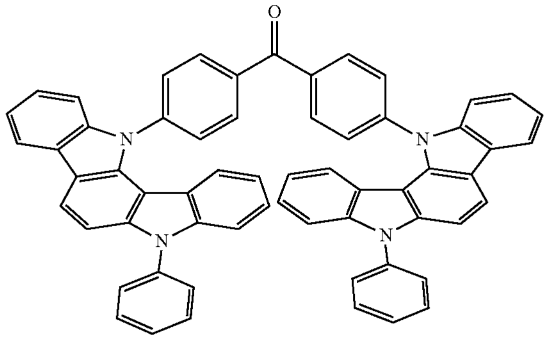
DA-03
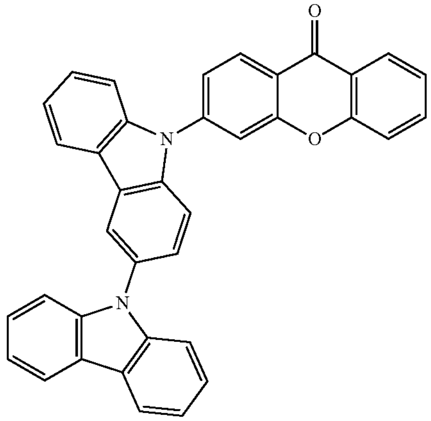
DA-04
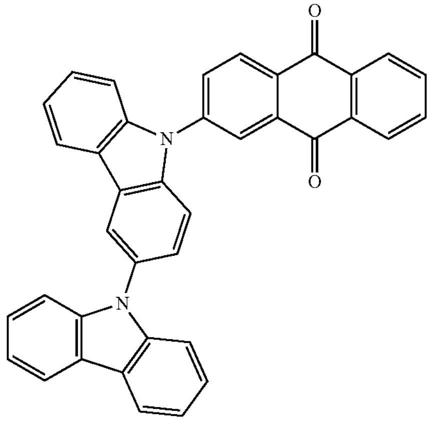
DA-05
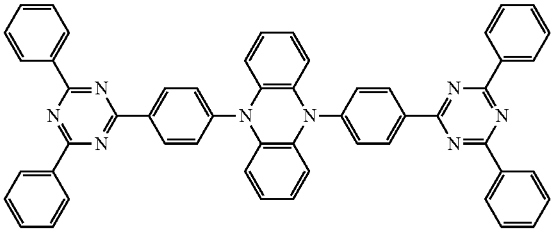

-continued
DA-06
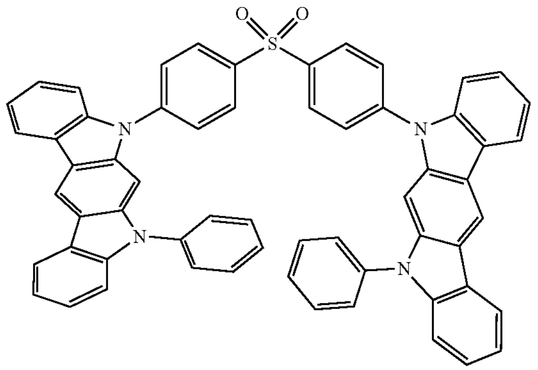
DA-07
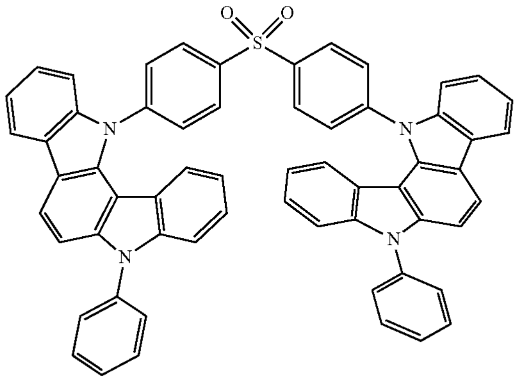
DA-08
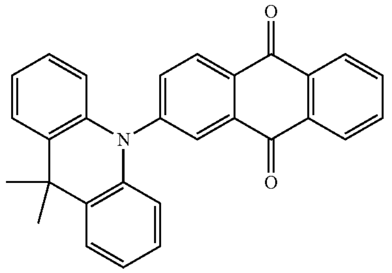
DA-09
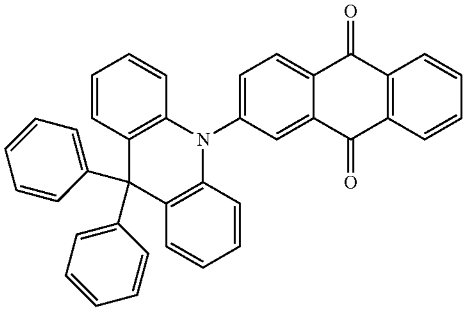
DA-10
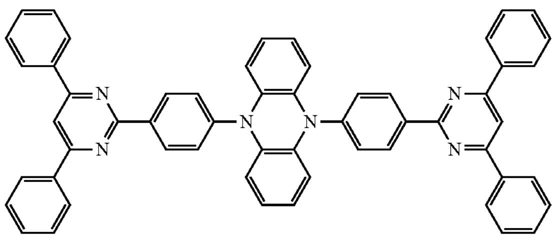
-continued
DA-11
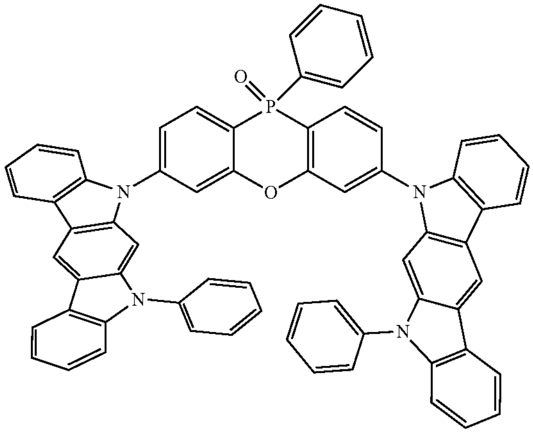
DA-12
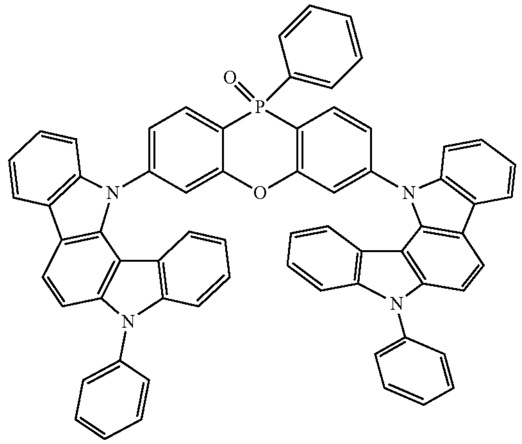
DA-13
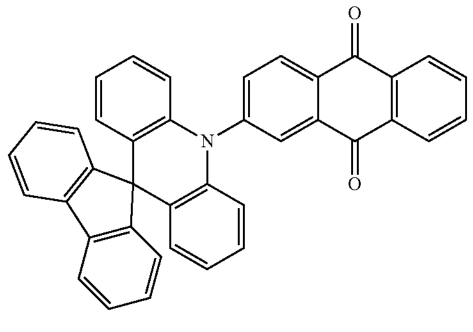
DA-14
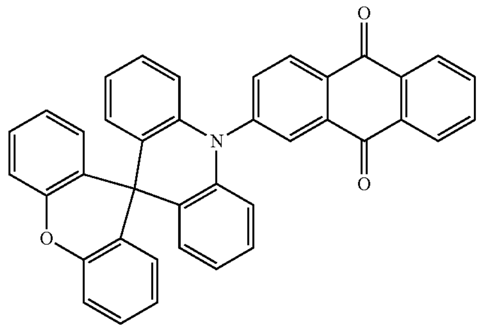

-continued
DA-15
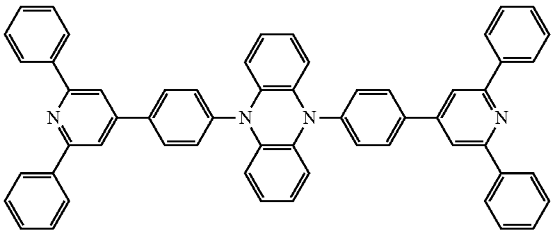
DA-16
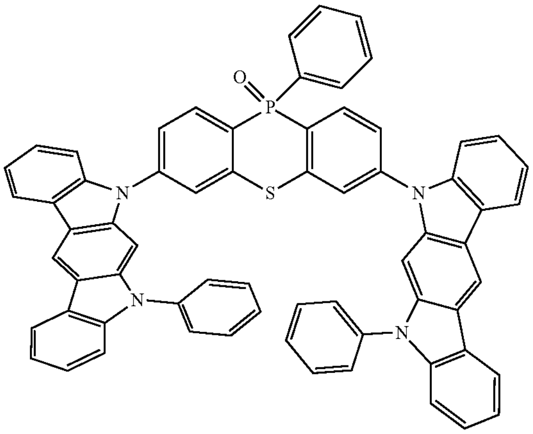
DA-17
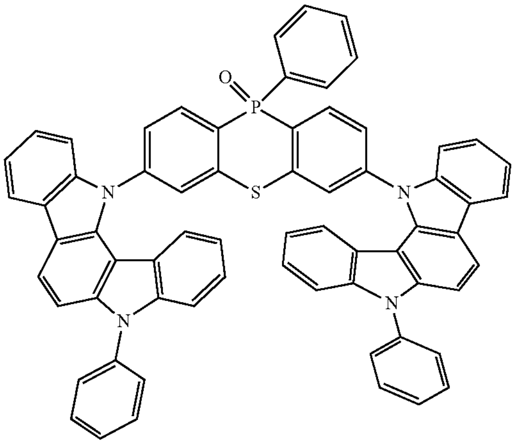
DA-18
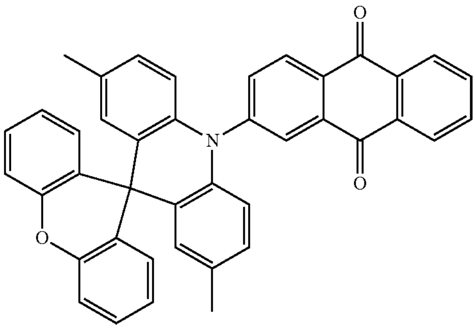
-continued
DA-19
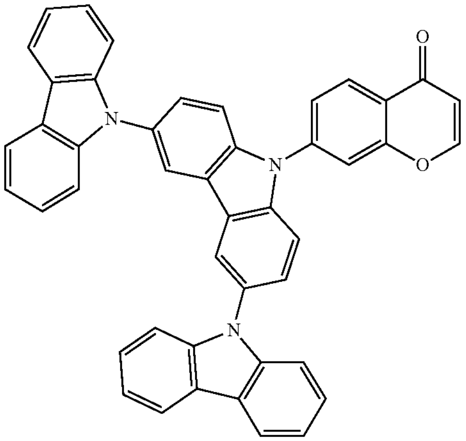
DA-20
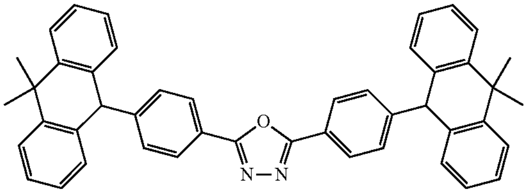
DA-21
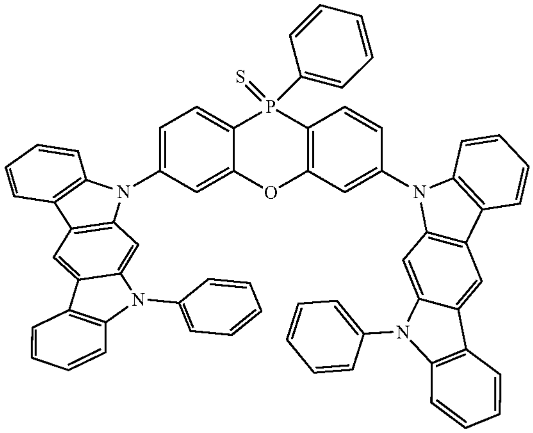
DA-22
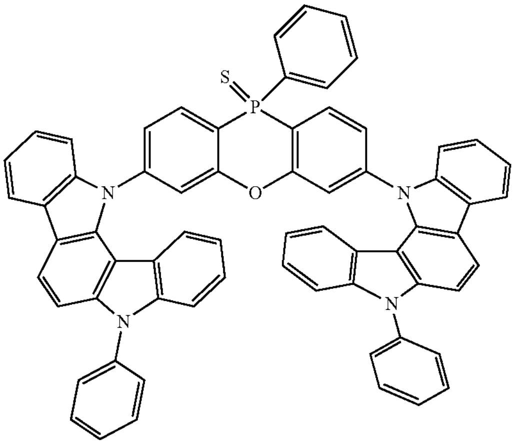

-continued
DA-23
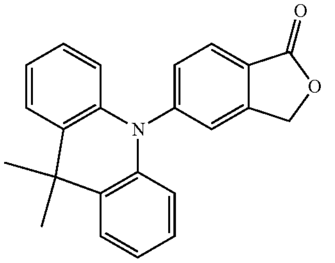
DA-24
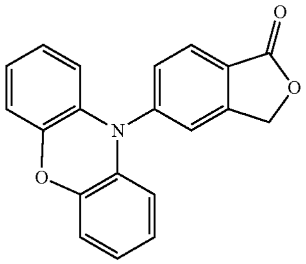
DA-25
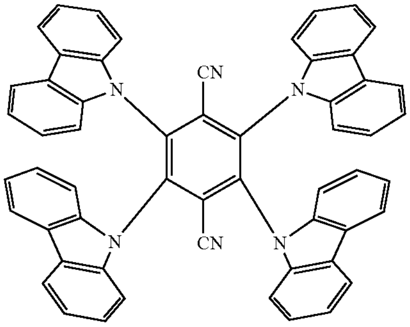
DA-26
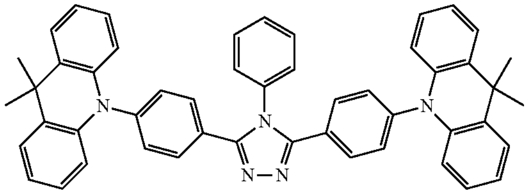
DA-27
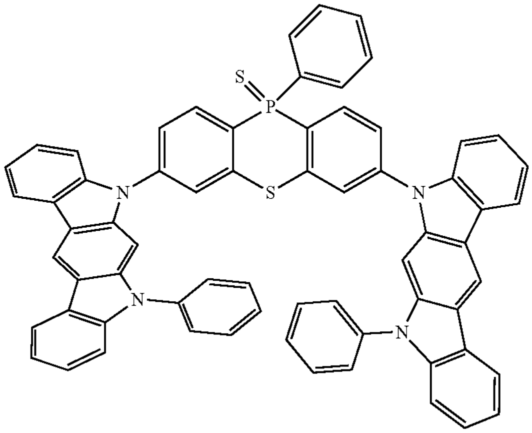
-continued
DA-28
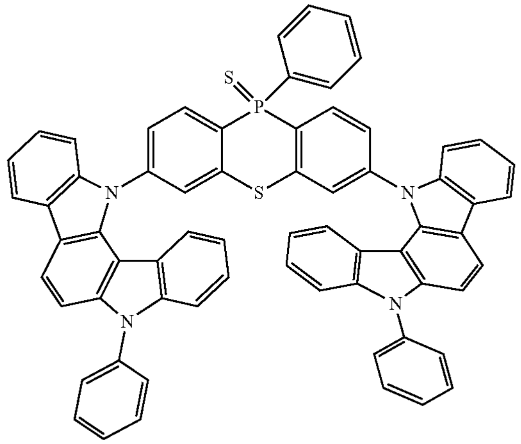
DA-29
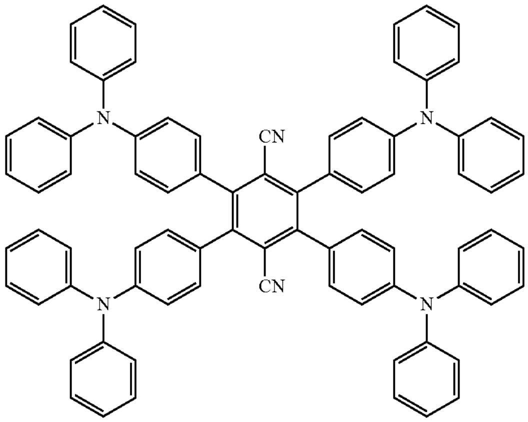
DA-30
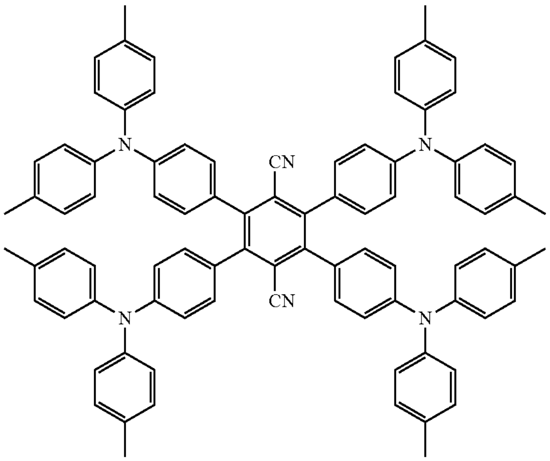

| Classification | Hole transporting host | Electron transporting host |
|---|---|---|
| Host combination 1 | 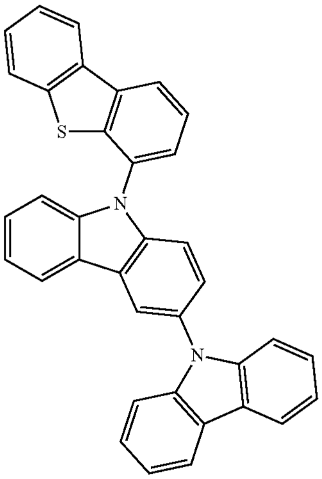 HT-10 | 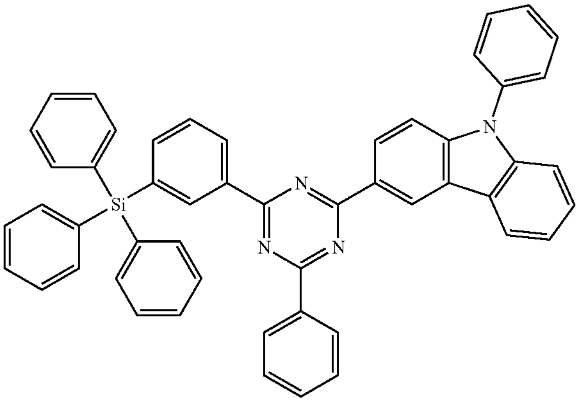 ET04 |
| Host combination 2 | 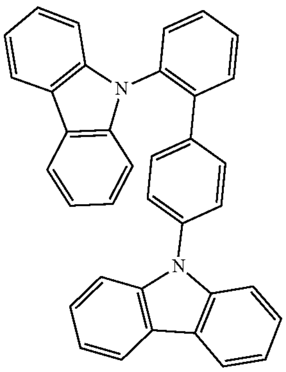 [SMILES: c1ccc(-n2c3ccccc3c3ccccc32)c(-c2ccc(-n3c4ccccc4c4ccccc43)cc2)c1] HT-06 | 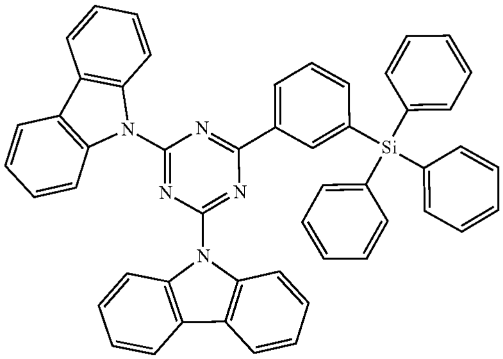 ET015 |
| Host combination 3 | 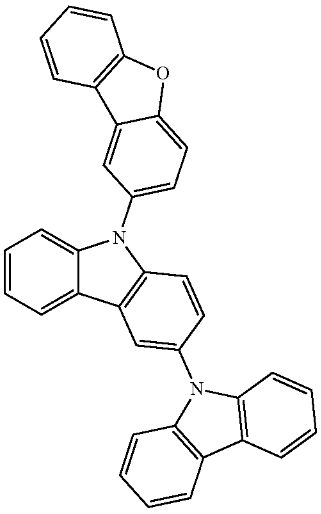 [SMILES: c1ccc2c(c1)oc1ccc(-n3c4ccccc4c4cc(-n5c6ccccc6c6ccccc65)ccc43)cc12] HT-12 | 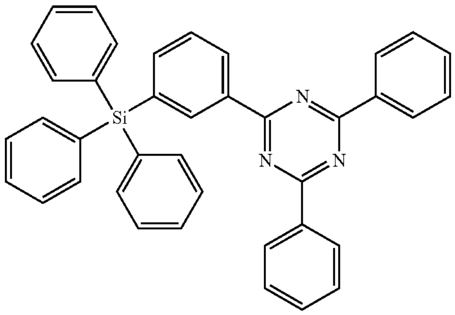 ET08 |

-continued

| Classification | Hole transporting host | Electron transporting host |
|---|---|---|
| Host combination 4 | 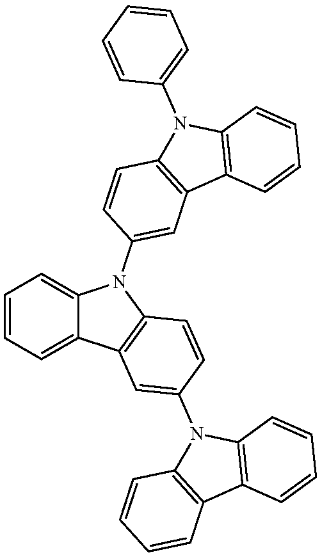 [SMILES: c1ccc(-n2c3ccccc3c3cc(-n4c5ccccc5c5cc(-n6c7ccccc7c7ccccc76)ccc54)ccc32)cc1] HT-15 | 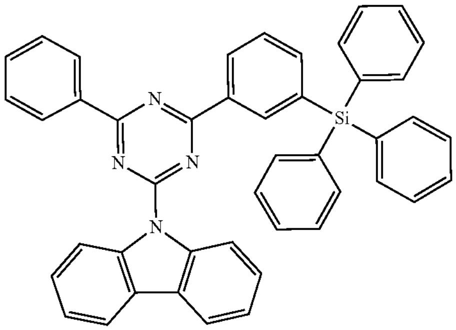 ET06 |
| Host combination 5 | 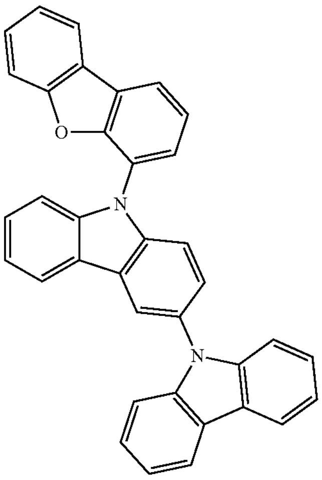 [SMILES: c1ccc2c(c1)oc1c(-n3c4ccccc4c4cc(-n5c6ccccc6c6ccccc65)ccc43)cccc12] HT-11 | 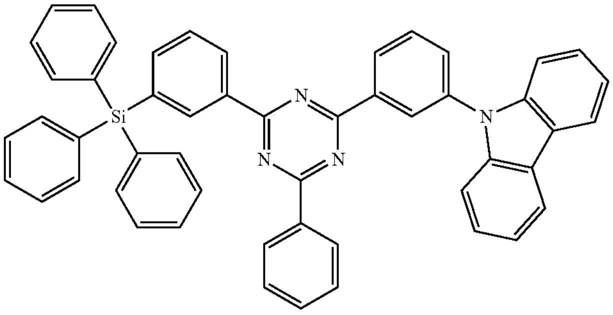 ET05 |
| Host combination 6 | 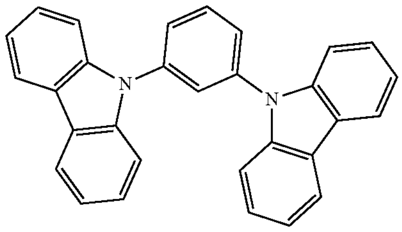 [SMILES: c1cc(-n2c3ccccc3c3ccccc32)cc(-n2c3ccccc3c3ccccc32)c1] HT-02 | 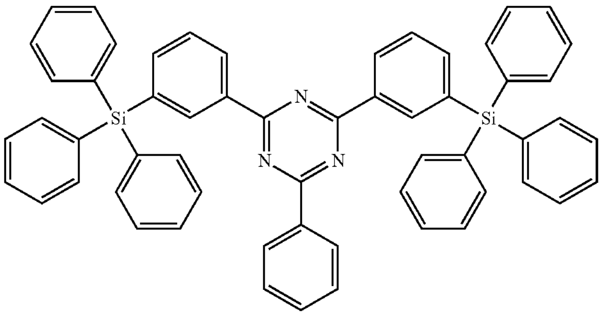 ET02 |

15. The light emitting element of claim 14, wherein the light emitting area further comprises a third light emitting layer disposed between the first light emitting layer and the second light emitting layer and including a third phosphorescent dopant, the hole transporting host, and the electron transporting host, and the first auxiliary light emitting layer is included in the third light emitting layer.

16. The light emitting element of claim 15, wherein the light emitting area further comprises a second auxiliary light emitting layer disposed between the first light emitting layer and the third light emitting layer and including the thermally activated delayed fluorescence dopant.

17. The light emitting element of claim 15, wherein the light emitting area further comprises a third auxiliary light emitting layer disposed between the third light emitting layer and the second light emitting layer and including the thermally activated delayed fluorescence dopant.

18. The display device of claim 1, wherein the display device is a mobile phone, a tablet, a car navigation system, a game console, or a wearable device.

* * * * *